(12) United States Patent
Harmon et al.

(10) Patent No.: US 12,720,694 B2
(45) Date of Patent: Aug. 25, 2026

(54) MODULAR VEHICLE HMI

(71) Applicant: Ford Global Technologies, LLC, Dearborn, MI (US)

(72) Inventors: Michael John Harmon, Northville, MI (US); Rowell Dizon, Irvine, CA (US); Justin Yang, Boise, ID (US); Bradford Zercoe, San Jose, CA (US); Eryu Shi, Mission Viejo, CA (US); Daniel Smith, Rolling Hills Estates, CA (US); Shane Patton, San Francisco, CA (US)

(73) Assignee: Ford Global Technologies, LLC, Dearborn, MI (US)

( * ) Notice: Subject to any disclaimer, the term of this patent is extended or adjusted under 35 U.S.C. 154(b) by 188 days.

(21) Appl. No.: 18/471,840

(22) Filed: Sep. 21, 2023

(65) Prior Publication Data

US 2025/0107026 A1 Mar. 27, 2025

(51) Int. Cl.
*H05K 5/02* (2006.01)
*B60K 35/50* (2024.01)

(52) U.S. Cl.
CPC ........... *H05K 5/0286* (2013.01); *B60K 35/50* (2024.01); *B60K 2360/60* (2024.01); *B60K 2360/691* (2024.01)

(58) Field of Classification Search
CPC .......... B60K 2360/691; B60K 2360/60; B60K 35/50; H05K 5/0286
See application file for complete search history.

(56) References Cited

U.S. PATENT DOCUMENTS

| | | | |
|---|---|---|---|
| 1,620,715 A | 3/1927 | Bergeim | |
| 4,329,673 A | 5/1982 | Uchikune et al. | |
| 7,758,424 B2 | 7/2010 | Riggs et al. | |
| 8,241,126 B2 | 8/2012 | Ambinder et al. | |
| 8,711,095 B2 | 4/2014 | Tan et al. | |
| 8,964,379 B2 | 2/2015 | Rihn et al. | |
| 8,972,617 B2 | 3/2015 | Hirschman | |
| 9,214,773 B2 | 12/2015 | Misener | |
| 9,429,994 B1 | 8/2016 | Vier | |
| 9,529,447 B2 | 12/2016 | Hodges et al. | |
| 9,658,751 B2 | 5/2017 | Han | |
| 10,092,828 B1 * | 10/2018 | Lotzer | A63F 13/27 |
| 10,114,425 B2 | 10/2018 | Lam et al. | |

(Continued)

OTHER PUBLICATIONS

Ohwamo et al., "Mobile Button for My Car", https://community.hubitat.com/t/mobil-button-for-my-car/52735, Oct. 2020, 6 pages.

*Primary Examiner* — Allen L Parker
*Assistant Examiner* — Peter Krim
(74) *Attorney, Agent, or Firm* — Joseph Zane; Brooks Kushman P.C.

(57) ABSTRACT

A dock for receiving modular programmable widgets includes a body defining a securing channel for receiving the modular programmable widgets, the securing channel being sized to conform with a profile of an attachment body of the rear of the modular programmable widgets; a plurality of dock connectors configured to receive contact pads of the modular programmable widgets; and locators defined by the securing channel into the securing channel to aid in placement of the modular programmable widgets in positions where the contact pads of the modular programmable widgets are aligned with one of the dock connectors.

20 Claims, 54 Drawing Sheets

(56) References Cited

U.S. PATENT DOCUMENTS 10,120,420 B2 11/2018 Bathiche et al.
10,610,776 B2 4/2020 Iwao et al.
10,705,629 B1 7/2020 Arnold et al.
10,836,348 B1 11/2020 Papworth et al.
10,945,476 B2 3/2021 Huang
10,970,998 B1 4/2021 Lange et al.
11,084,379 B2 8/2021 Sung et al.
11,646,559 B2 5/2023 Misener et al.
2008/0238879 A1 10/2008 Jaeger et al.
2008/0290667 A1* 11/2008 Hsu .................... G06F 1/1679 292/70
2009/0161303 A1 6/2009 Hirota
2011/0316655 A1 12/2011 Mehraban et al.
2012/0271967 A1* 10/2012 Hirschman ............ A63F 13/24 29/825
2014/0266635 A1 9/2014 Roth et al.
2015/0054646 A1 2/2015 Yuki
2015/0279535 A1 10/2015 Arrington et al.
2015/0293509 A1 10/2015 Bankowski et al.
2017/0183033 A1* 6/2017 Jaramillo-Moscoso .................... B62D 15/027
2018/0181359 A1* 6/2018 Monroe ................ B60K 35/60
2018/0270063 A1 9/2018 Bard et al.
2018/0341340 A1* 11/2018 Larkin ................... G06F 1/169
2018/0373350 A1* 12/2018 Rao ........................ G06F 3/016
2019/0014200 A1 1/2019 Cho et al.
2019/0248298 A1* 8/2019 Barnes ............ B64D 11/00152
2020/0014161 A1 1/2020 Liao
2020/0189392 A1 6/2020 Sung et al.
2020/0247328 A1 8/2020 Almahmoud et al.
2021/0019278 A1 1/2021 Hulbert et al.
2021/0053512 A1 2/2021 Perona et al.
2021/0055806 A1 2/2021 Shepelev
2021/0245601 A1 8/2021 Giraud et al.
2022/0134884 A1* 5/2022 Chung ................. G06F 3/0362 345/184
2022/0239124 A1* 7/2022 Aurongzeb ............ H02J 50/10
2023/0390634 A1* 12/2023 Lu .......................... A63F 13/98
2024/0199288 A1* 6/2024 Taylor ................. B65D 47/063

* cited by examiner 426
424
310
422
418
420
428
430
406
410
408
306
402
436
436
302
434
412
416
404
434
414
434
432
304

506
504
514
520
A
420
116
522
408
306
502
414
512
508
408
510
402
406

506
504
514
520
116
522
420
408
502
414
306
512
508
402
510
B
406

506
504
514
520
116
522
420
408
502
414
512
508
402
510
406

202A
116A
114
116B
202B
900
202C 454
1308
1306
1314
445
444
1322
418
302
1312
1310
1318
1316
438
1302
440
1304
1320
306
1320
442
406
402
412
304
420
414
404

520
514
514
1306
454
306
514
414
514
116
302
514
202

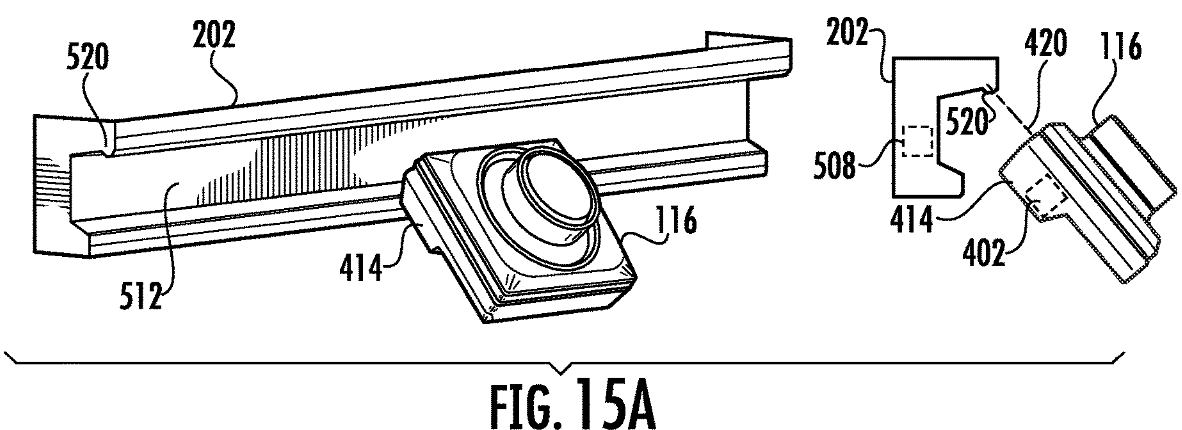
FIG. 15A
520
202
512
414
116
202
414
520
420
116
508
402
FIG. 15B
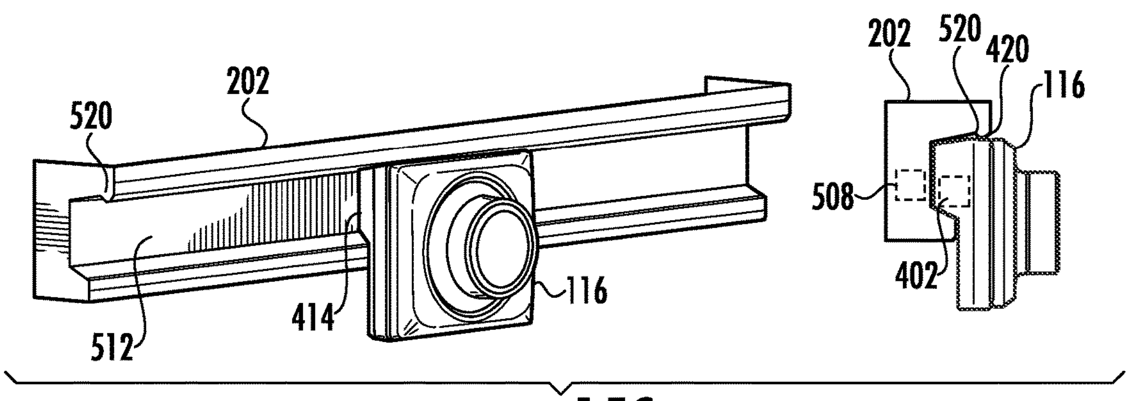
FIG. 15C

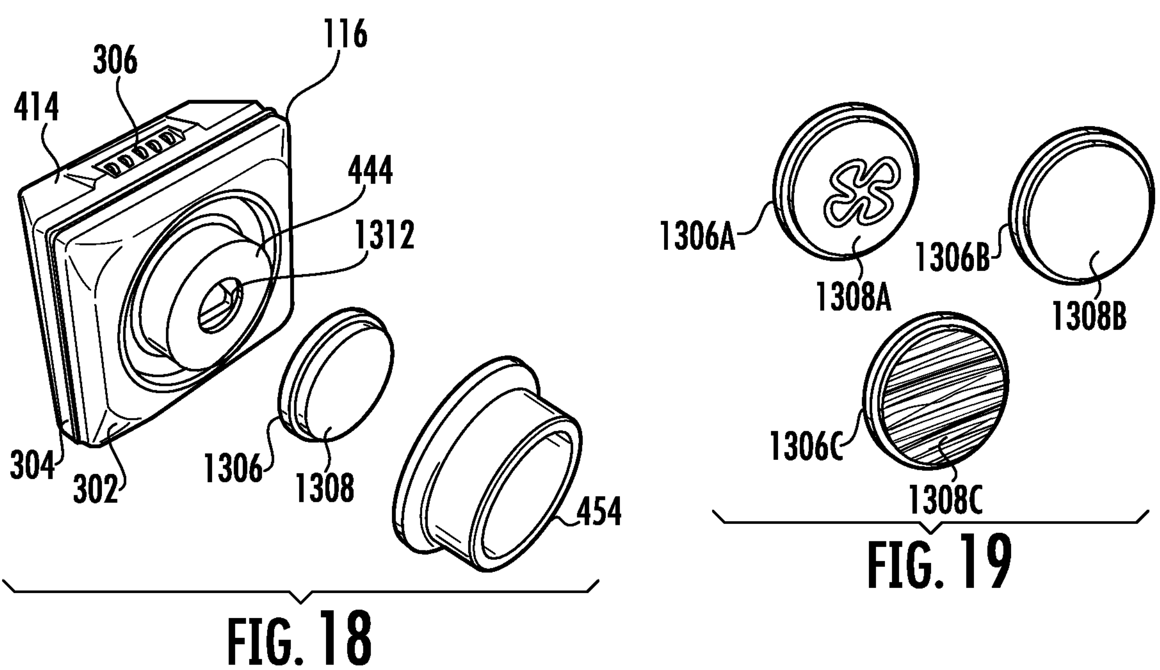
FIG. 18
FIG. 19
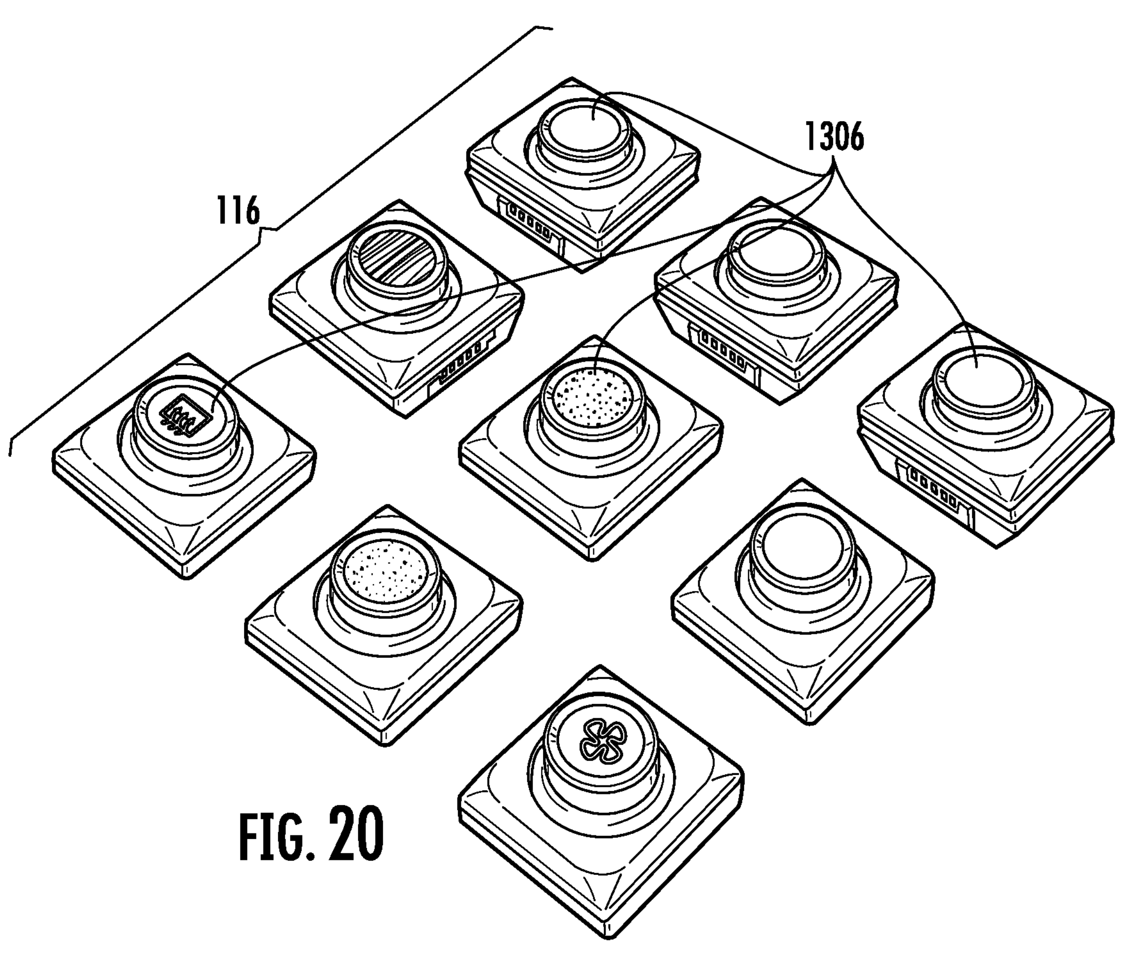
FIG. 20

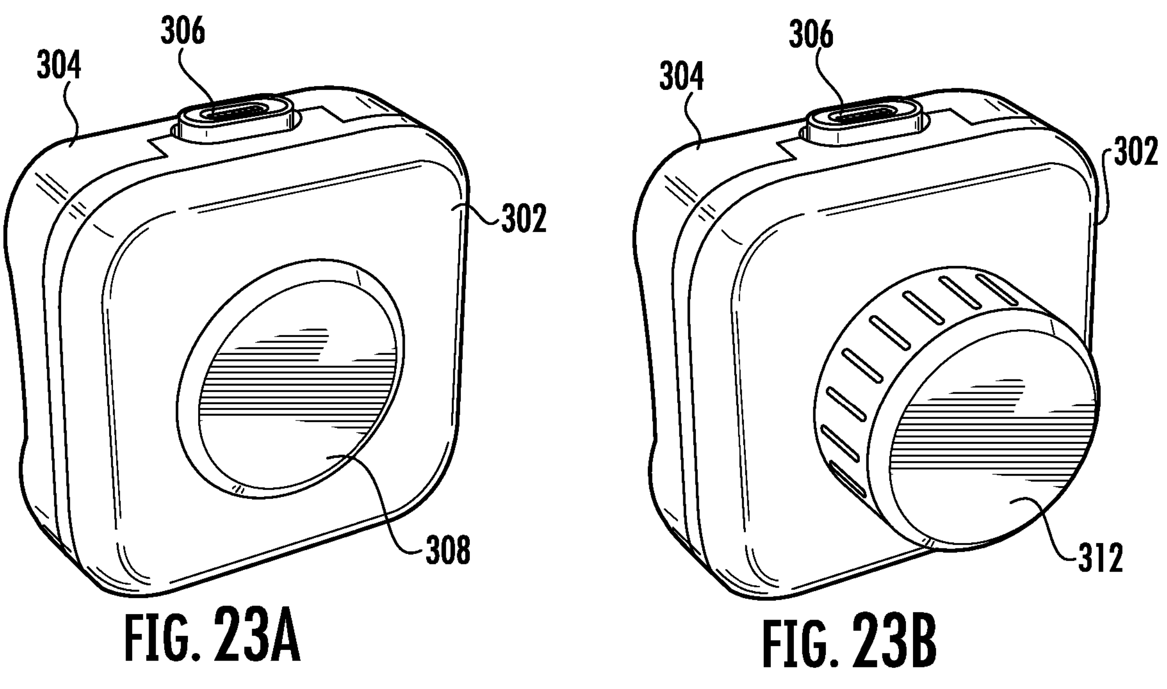
FIG. 23A
FIG. 23B
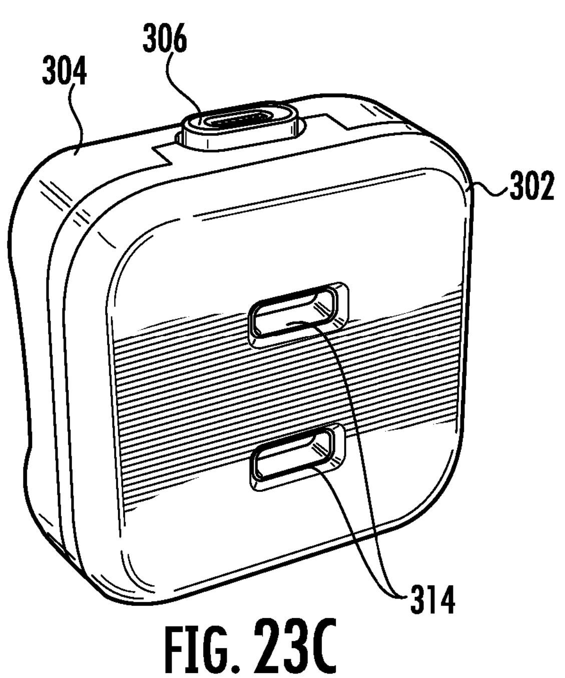
FIG. 23C
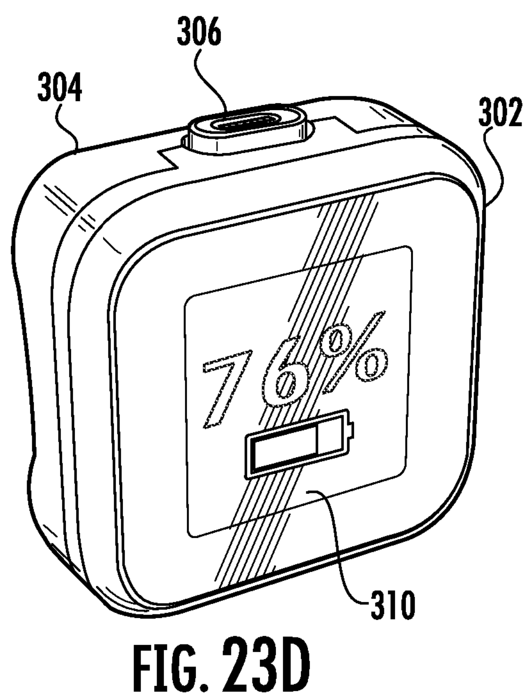
FIG. 23D

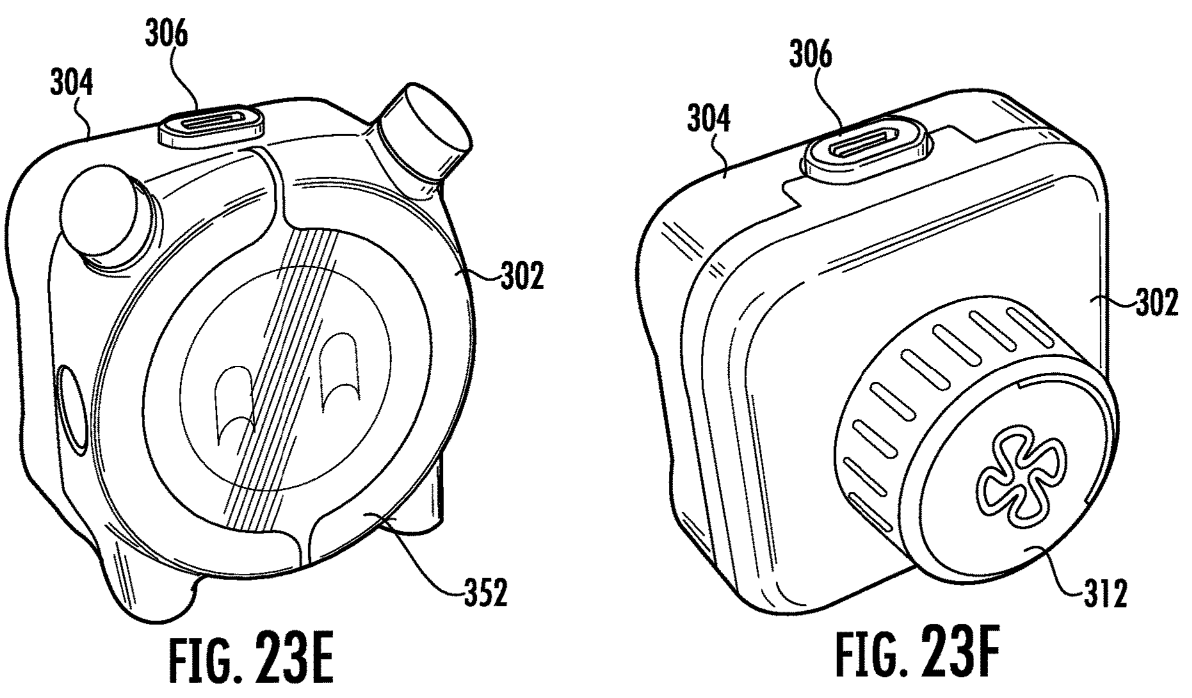
FIG. 23E
FIG. 23F
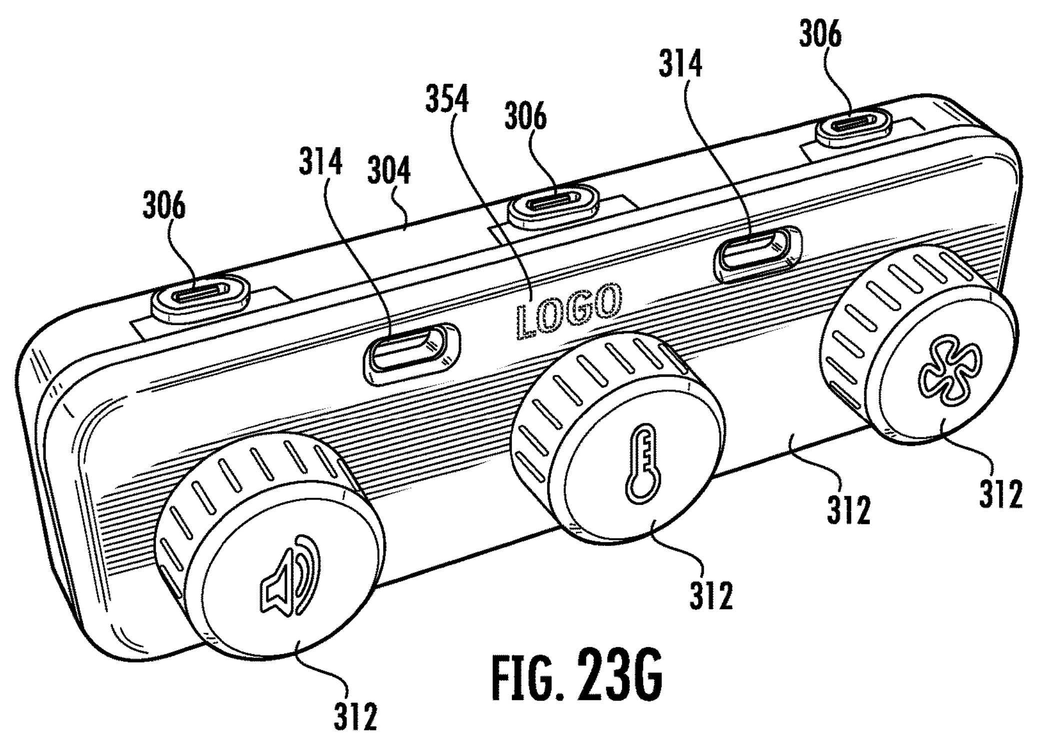
FIG. 23G 454
418
302
3106
3104
436
436
436
436
1320
3102
306
406
402
434
412
304
404
2402

114
202
3504
116
3502

114
3512
3506
3510
3506
3502
3508
202
116

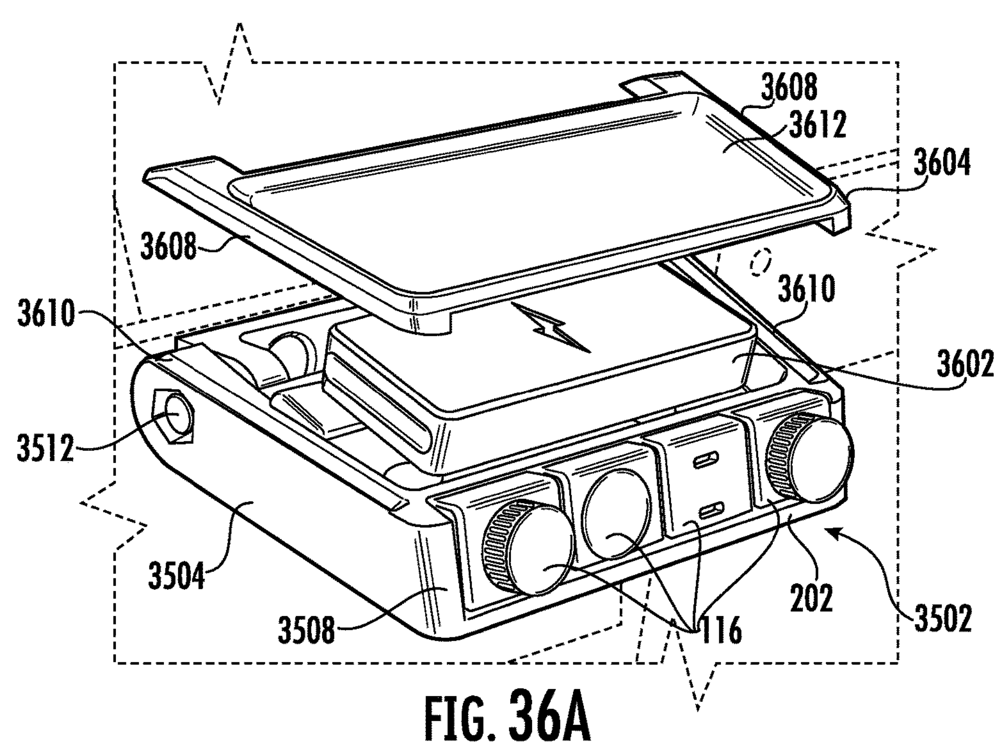
FIG. 36A
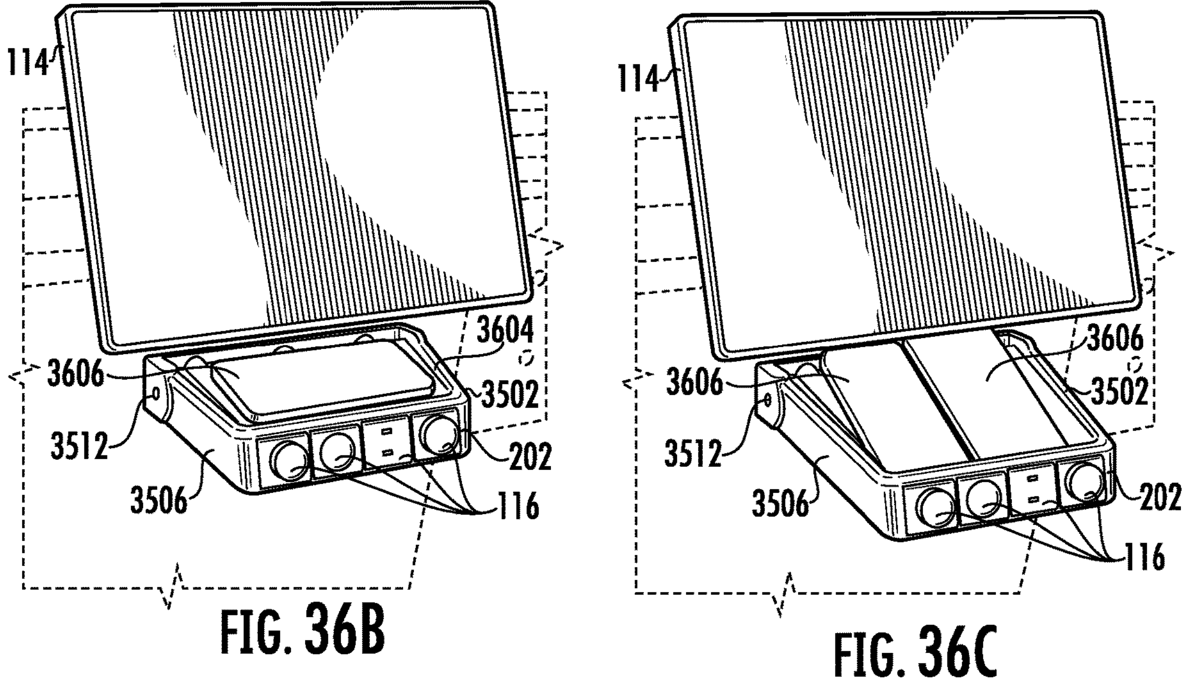
FIG. 36B
FIG. 36C

MODULAR VEHICLE HMI

TECHNICAL FIELD

Aspects of the disclosure generally relate to modular human-machine interfaces (HMIs) for vehicles.

BACKGROUND

Many modern vehicles are equipped with electronic displays. Sometimes referred to as a digital dash, an electronic gauge cluster includes a set of vehicle instrumentation that may be displayed with a configurable digital readout or display panel, rather than with traditional analog gauges. Due to the configurable nature of the digital displays, electronic gauge cluster may be controlled by the user to display different elements of vehicle information.

SUMMARY

In one or more illustrative exmaples, a dock for receiving modular programmable widgets includes a body defining a securing channel for receiving the modular programmable widgets, the securing channel being sized to conform with a profile of an attachment body of the rear of the modular programmable widgets; a plurality of dock connectors configured to receive contact pads of the modular programmable widgets; and locators defined by the securing channel into the securing channel to aid in placement of the modular programmable widgets in positions where the contact pads of the modular programmable widgets are aligned with one of the dock connectors.

In one or more illustrative examples, a modular programmable widget system includes a dock comprising a plurality of dock connectors each of identical shape; and a plurality of modular programmable widgets, each modular programmable widget having a front housing and a back housing defining an enclosure, one or more physical controls provided on a front face of the enclosure, a contact pad exposed by the enclosure for electrical connection to any one of the dock connectors, and one or more features for mechanical connection and securing of the modular programmable widget to the dock.

BRIEF DESCRIPTION OF THE DRAWINGS

FIG. 15A illustrates perspective and side views of a first operation in the attachment of an example alternate design modular programmable widget to the dock;

FIG. 15B illustrates perspective and side views of a second operation in the attachment of an example alternate design modular programmable widget to the dock;

FIG. 15C illustrates perspective and side views of a completed attachment of an example alternate design modular programmable widget to the dock;

FIG. 18 illustrates the removal of the rotary dial from an assembled modular programmable widget to allow for changing out of the signifier cap;

FIG. 19 illustrates a selection of different signifier caps, each having a different customizable front face;

FIG. 20 illustrates an example selection of different signifier caps installed to various modular programmable widgets;

FIG. 23A illustrates an example perspective view of a modular programmable widget having a configurable button;

FIG. 23B illustrates an example perspective view of a modular programmable widget having a configurable dial;

FIG. 23C illustrates an example perspective view of a modular programmable widget having additive power/data ports;

FIG. 23D illustrates an example perspective view of a modular programmable widget having a configurable display;

FIG. 23E illustrates an example perspective view of a modular programmable widget having a companion;

FIG. 23F illustrates an example perspective view of a modular programmable widget having a configurable dial with display;

FIG. 23G illustrates an example perspective view of a modular programmable widget that is multiple times the length of a standard modular programmable widget as shown in FIGS. 23A-23F;

FIG. 36A illustrates use of a phone charger and dock plate for use with the storage compartment;

FIG. 36B illustrates a single phone dock with a landscape orientation;

FIG. 36C illustrates a dual phone dock with a portrait orientation;

DETAILED DESCRIPTION

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Some vehicle HMIs provide a primarily touch based interface, with few physical controls. Such an interior may offer simplicity and minimalism. Yet, some users may desire tactile controls. Each user may have different preferences, and the ability to tailor the user interface may be a user expectation.

An enhanced vehicle HMI may support modular programmable widgets. These widgets may include a variety of modular and programmable tactile buttons, knobs, switches, or other physical controls. The modular programmable widgets may be installed to the vehicle and assigned to various functions. Once attached and configured, the physical controls of the modular programmable widgets may offer quick, customized access to the configured functions. Further aspects of the modular programmable widgets are described in detail herein.

Figure 1:
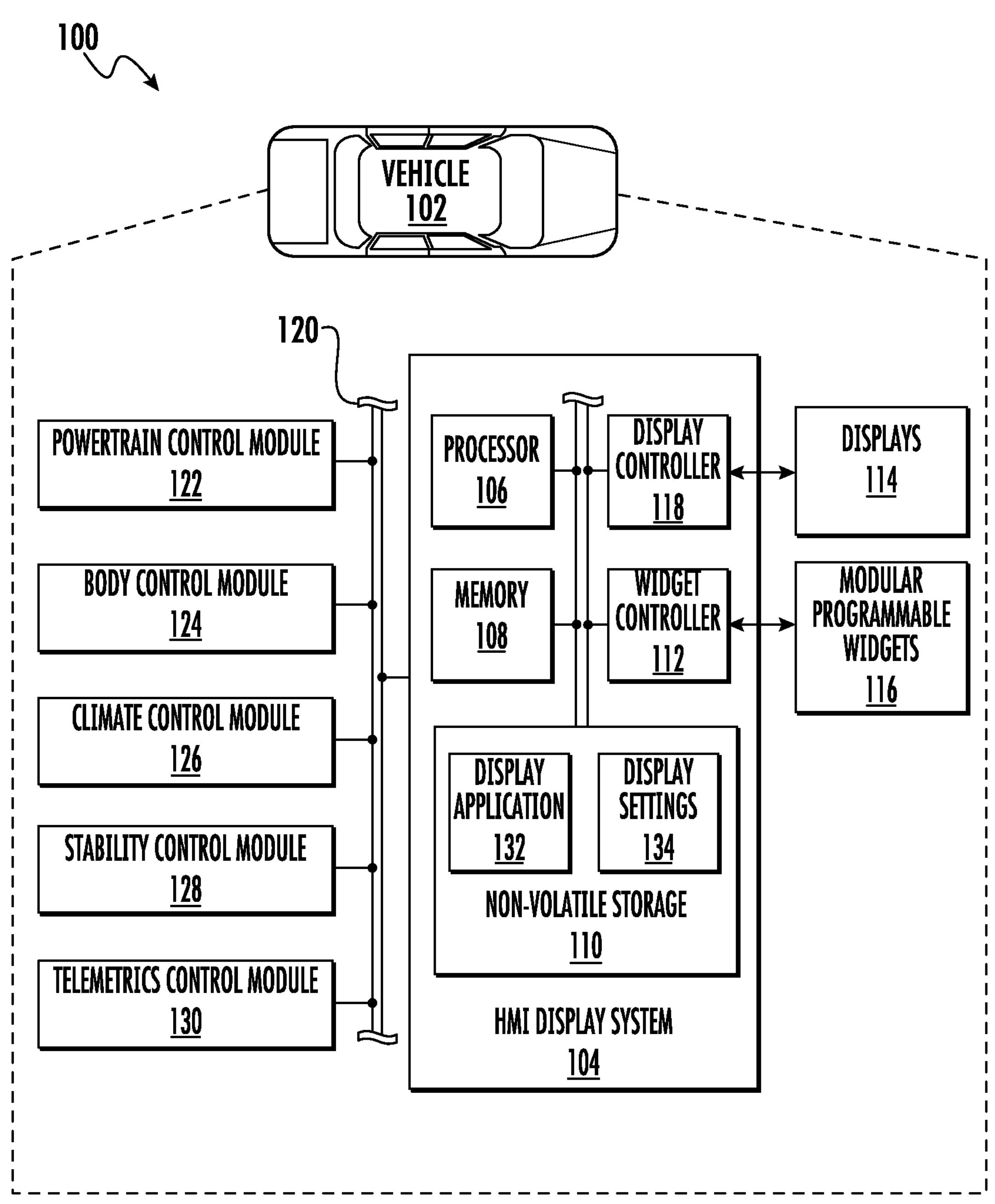
FIG. 1 illustrates an example block diagram of a vehicle supporting modular programmable widgets.

FIG. 1 illustrates an example block diagram 100 of a vehicle 102 supporting modular programmable widgets 116. The vehicle 102 may include various types of passenger vehicle, such as crossover utility vehicle (CUV), sport utility vehicle (SUV), truck, recreational vehicle (RV), boat, plane or other mobile machine for transporting people or goods. It should be noted that the illustrated vehicle 102 is merely an example, and more, fewer, and/or differently located elements may be used.

An HMI display system 104 of the vehicle 102 may include one or more processors 106 configured to perform instructions, commands and other routines in support of the processes described herein. For instance, the HMI display system 104 may be configured to execute instructions of a display application 132 loaded to a memory 108 to provide information display features. Such instructions and other data may be maintained in a non-volatile manner using a variety of types of computer-readable medium 110. The computer-readable medium 110 (also referred to as a processor-readable medium or storage) includes any non-transitory medium (e.g., a tangible medium) that participates in providing instructions or other data that may be read by the processor 106 of the HMI display system 104. Computer-executable instructions may be compiled or interpreted from computer programs created using a variety of programming languages and/or technologies, including, without limitation, and either alone or in combination, Java, C, C++, C #, Objective C, Fortran, Pascal, Java Script, Python, Perl, hypertext markup language (HTML), etc.

The HMI display system 104 may be provided with various functionality to allow the occupants to interact with the vehicle 102. For example, the HMI display system 104 may drive or otherwise communicate with one or more configurable displays 114 configured to provide visual output to vehicle 102 occupants and receive touch input from the occupants by way of a display controller 118. In another example, the HMI display system 104 may include a widget controller 112 configured to receive user input indicative of occupant-vehicle interaction from one or more modular programmable widgets 116 of the vehicle 102. These modular programmable widgets 116 may include various controls, such as buttons or knobs.

Figure 2:
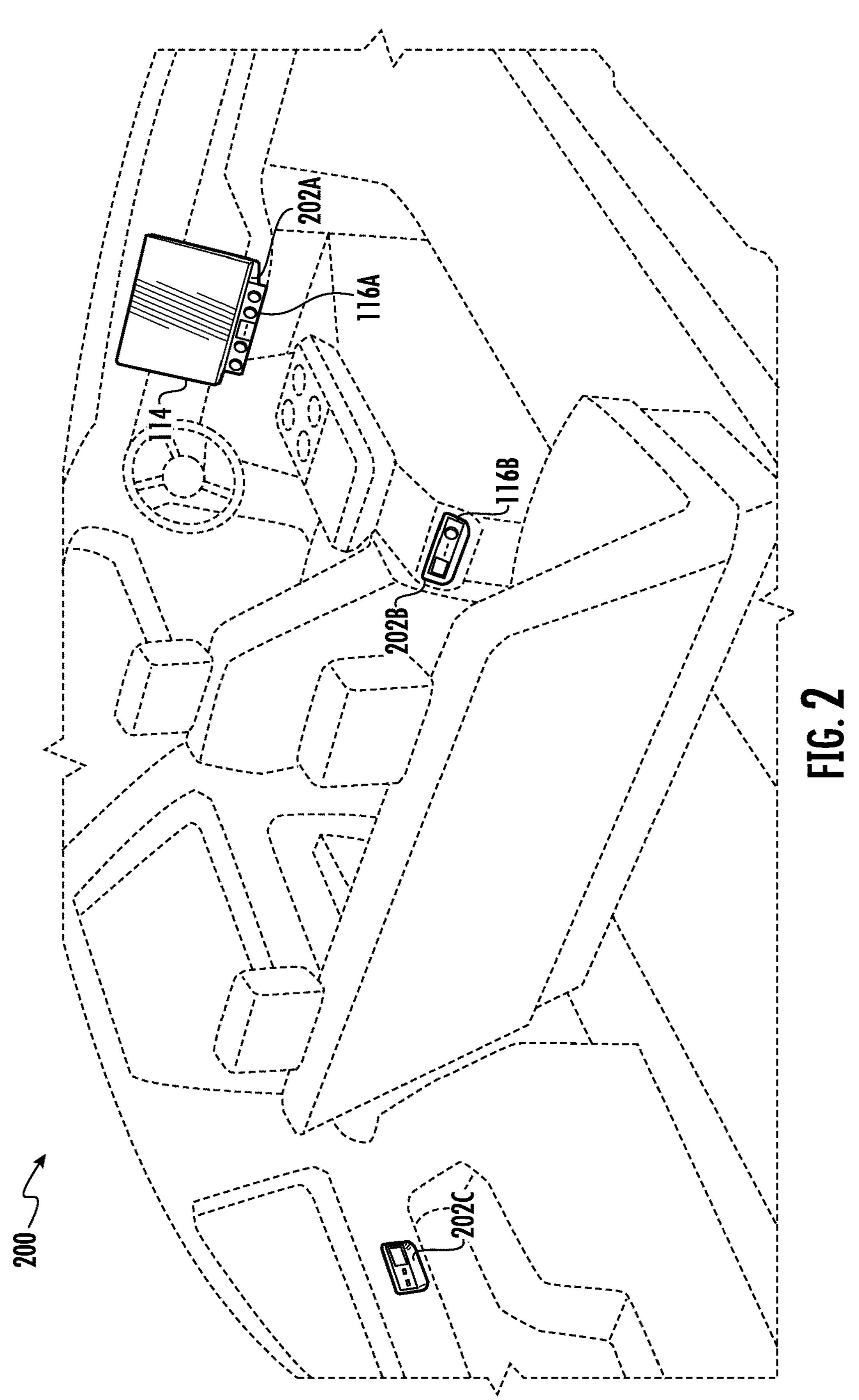
FIG. 2 illustrates an example cutaway view of a vehicle interior supporting the modular programmable widgets.

FIG. 2 illustrates an example cutaway view of a vehicle interior 200 supporting the modular programmable widgets 116. As shown in FIG. 2, the HMI display system 104 for the vehicle 102 may provide a touch-based user interface via one or more configurable displays 114. To satisfy the requirements to users who wish to use hardware controls, the HMI display system 104 may provide an ability to add, remove, and configure the modular programmable widgets 116 using the configurable display 114. The modular programmable widgets 116 may offer customizable tactile HMI for various vehicle 102 functions. The controls may be assigned to various functions such as bringing up a bookmarked display screen, or allowing for the direct configuration of settings such as utility controls (e.g., towing functions), climate controls, gig work function (e.g., rideshare), media control functions, smart home settings, vehicle settings, etc.

As shown, one or more first modular programmable widgets 116 may be attached to a dock 202A of the center stack configurable display 114. This location under the center stack configurable display 114 may be easily accessible for driver and passenger. Also shown, one or more second modular programmable widgets 116 may be attached to a console bin dock 202B. Here, the second modular programmable widget 116 is attached to the console bin dock 202B for access by rear passengers, which may be useful for both retail and vehicle-as-a-service (VaaS) use cases. As further shown, one or more third modular programmable widgets 116 may be attached to a cargo dock 202C in the rear cargo area. It should also be noted that the illustrated vehicle interior 200 is an example, and interiors having more, fewer, or differently located components may be used.

Referring back to FIG. 1, the HMI display system 104 may be further configured to communicate with other components of the vehicle 102 via one or more in-vehicle buses 120. The in-vehicle buses 120 may include one or more of a vehicle controller area network (CAN), an Ethernet network, and a media oriented system transfer (MOST), as some non-limiting possibilities. The in-vehicle buses 120 may allow the HMI display system 104 to send or receive information relevant to the HMI to and from other vehicle 102 systems. The exemplary vehicle systems discussed herein may communicate with the HMI display system 104 over a main in-vehicle bus 120. In other examples, the HMI display system 104 may be connected to more or fewer in-vehicle buses 120, and one or more modular programmable widgets 116 or other components may be connected to the HMI display system 104 via in-vehicle buses 120 or directly without connection to an in-vehicle bus 120.

As some non-limiting examples, a powertrain control module 122 may be a component in communication with the HMI display system 104 and may be configured to provide information to the HMI display system 104 regarding control of engine operating components (e.g., idle control, fuel delivery, emissions control, engine diagnostic codes, etc.). A body control module 124 may be configured to manage various power control functions such as exterior lighting, interior lighting, keyless entry, remote start, and provide information to the HMI display system 104 such as point of access status information (e.g., closure status of the hood, doors and/or trunk of the vehicle 102). A climate control module 126 may be configured to provide control and monitoring of heating and cooling system components, as well as to provide information to the HMI display system 104 regarding the components (e.g., compressor clutch and blower fan control, temperature sensor information, etc.). A stability control module 128 may be configured to perform functions such as active suspension control, traction control, and trailer control, and provide sensed vehicle 102 dynamics information to the HMI display system 104, such as roll angle, pitch angle, yaw rate, roll rate, pitch rate, lateral and longitudinal velocity, lateral and longitudinal change over time, tire slip, tire slip rate, and an infotainment system module. A telematics control module 130 may include an in-vehicle modem configured to access communications services of a communications network (not shown), and may provide packet-switched network services (e.g., Internet access, voice over Internet protocol (VoIP) communication services) to the HMI display system 104 and to other devices connected over the in-vehicle bus 120.

A display application 132 may be installed to the HMI display system 104 and utilized to allow the vehicle 102 to provide output to the display controller 118 such that the configurable display 114 conveys the information relating to the operation of the vehicle 102 to the driver. In an example, the display application 132 may be configured to provide a menu structure via the configurable display 114 having set of categories into which information screens are placed, such as media selections, trip/fuel information, navigation, towing information, etc.

The menu structure may further include information screens that may be selected from the categories. For instance, the trip/fuel category may include a trip counter screen for a first trip counter, a trip counter screen for a second trip counter, a fuel economy screen, a fuel history screen, and a navigation/compass screen. When a screen is selected from the menu structure (e.g., via touch input to the configurable displays 114, via user manipulation of the modular programmable widgets 116, via voice commands, etc.), the selected screen or function may be provided on the configurable display 114.

As shown in greater detail below, the display application 132 may be further configured to allow a user to configure the modular programmable widgets 116 to operate as shortcuts to various functionality of the HMI display system 104. Accordingly, when driving the user may be able to quickly access the bookmarked functions or screens using the modular programmable widget 116, to provide for quick selection by the HMI display system 104 on the configurable display 114.

The display application 132 may maintain display settings 134 indicative of the mapping of modular programmable widgets 116 to the functionality of the HMI display system 104. For instance, responsive to the connection of a modular programmable widget 116 to the HMI display system 104, the display application 132 may transition the configurable display 114 to a screen for the configuration of the modular programmable widget 116. The configurable display 114 may allow the user to select which functions are to be controlled by which controls of the modular programmable widget 116. The display setting 134 may then be stored to the memory 108 and used to interpret input received to the modular programmable widget 116 by the HMI display system 104.

Various types of modular programmable widget 116 may be utilized. In a first option, the modular programmable widgets 116 may utilize a toe-in mechanism. Details of the first option are discussed with respect to FIGS. 2-8C. In another option the modular programmable widgets 116 may utilize an alternate form factor for the toe-in mechanism. Details of the second option are discussed with respect to FIGS. 9-21D. In yet another option, the modular programmable widgets 116 may utilize a magnetic attachment port design. Details of the third option are discussed with respect to FIGS. 22-28F. In still another option the modular programmable widgets 116 may utilize a pin connector. Details of the fourth option are discussed with respect to FIGS. 29A-32. Optional locking aspects of the modular programmable widgets 116 are discussed with respect to FIGS. 33A-C and 34A-C.

FIGS. 3A-3D illustrate example modular programmable widgets 116. Referring collectively to FIGS. 3A-3D, an enclosure having a generally rectangular prism shape may be defined by a front housing 302 and a back housing 304. The front housing 302 may define a generally flat front surface of the modular programmable widget 116 a top surface of the modular programmable widget 116, and a front portion of the side walls. The back housing 304 may define the remainder of the enclosure, including the rear wall, and a rear portion of the side, bottom, and top walls. The front housing 302 and back housing 304 may collectively house the internal circuitry and other components of the modular programmable widget 116. Controls may be provided on front face of the front housing 302, while connectivity to the vehicle 102 may be provided via contact pads 306 exposed through the top of the back housing 304. The contact pads 306 may allow for transmission of data and power between the modular programmable widgets 116 and the dock 202. In an example, the contact pads 306 may be leaf spring contacts.

Figure 3A:
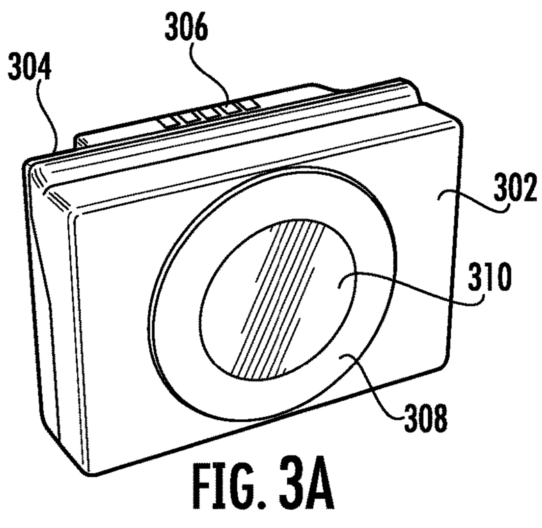
FIG. 3A illustrates an example perspective view of a modular programmable widget having a configurable button with a display.

The front housing 302 may expose various controls that may provide interaction with the user. In the example of FIG. 3A, this may include a configurable button 308. In some examples, the configurable button 308 may further include a display 310 integrated into the front face of the configurable button 308. The display 310 may be programmed to display various content to the user. As a possibility, the display 310 may be used to show an icon or other representation of the functionality assigned to the configurable button 308.

Figure 3B:
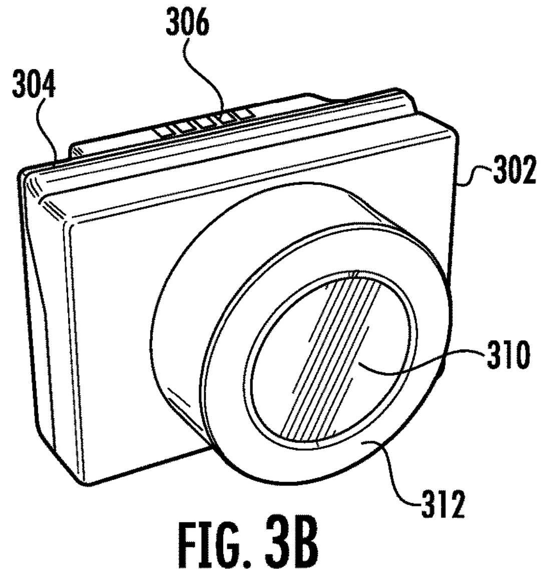
FIG. 3B illustrates an example perspective view modular programmable widget having a configurable dial with a display.

FIG. 3B illustrates an example modular programmable widget 116 having a configurable dial 312 with a display 310. The configurable dial 312 may be include a rotary encoder configured to receive rotational input from a user, e.g., for selection of a continuous parameter such as volume or temperature, for selection from a menu of choices, etc. The configurable dial 312 may optionally include button functionality, similar to the operation of the configurable button 308, such that the configurable dial 312 may be pressed for binary parameter control (e.g., mute), preset recall, to move to a next item in a list (e.g., of media inputs, radio stations, etc.). Similar to the configurable button 308, the configurable dial 312 may further include a display 310, such the front face of the configurable dial 312 may show an icon or other representation of the functionality assigned to the configurable dial 312.

Figure 3C:
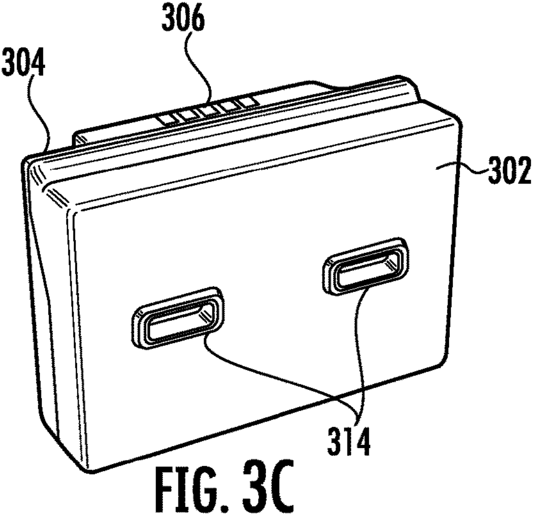
FIG. 3C illustrates an example perspective view modular programmable widget having additive power and data ports.

FIG. 3C illustrates an example modular programmable widget 116 having additive power/data ports 314. As shown, the modular programmable widgets 116 in FIG. 3C provides two USB power/data ports 314, but this is merely an example, and different quantities and types of connectors may be exposed by the modular programmable widgets 116.

Figure 3D:
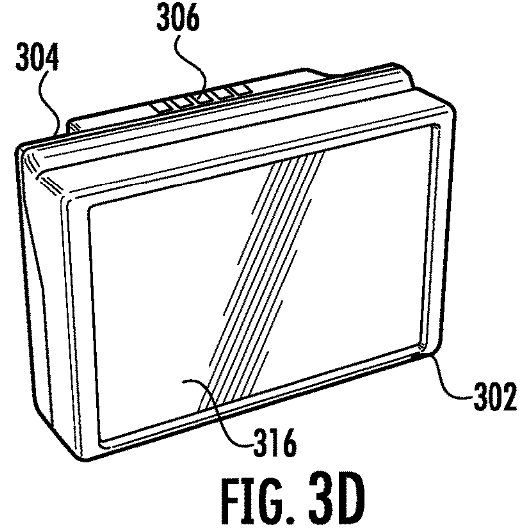
FIG. 3D illustrates an example perspective view modular programmable widget having a configurable touch screen.

FIG. 3D illustrates an example modular programmable widget 116 having a configurable touch screen 316. As shown in this example, the modular programmable widget 116 provides a flat rectangular touch screen 316 across the front surface of the modular programmable widget 116.

It should be noted that the modular programmable widgets 116 shown in FIGS. 3A-3D are merely examples, and modular programmable widgets 116 having more, fewer, or different features may be used. Further examples of possible modular programmable widgets 116 are shown in FIGS. 3E-3W.

Figure 3E:
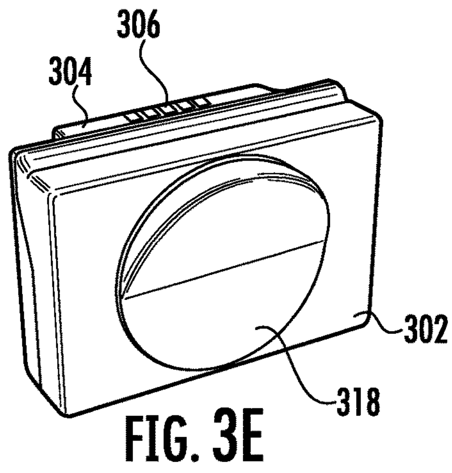
FIG. 3E illustrates an example perspective view modular programmable widget having a toggle button.
Figure 3F:
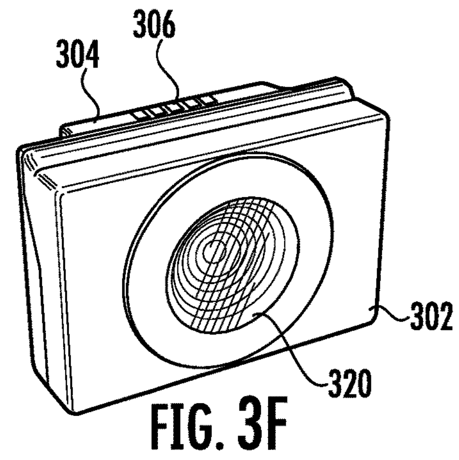
FIG. 3F illustrates an example perspective view modular programmable widget having a camera.
Figure 3G:
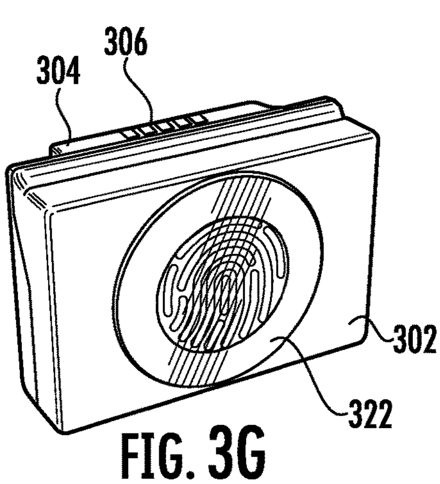
FIG. 3G illustrates an example perspective view modular programmable widget having a biometric sensor.
Figure 3H:
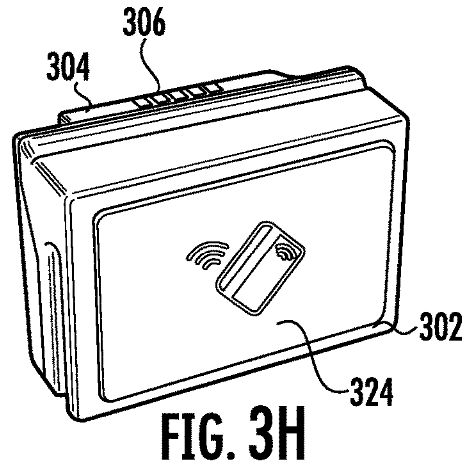
FIG. 3H illustrates an example perspective view modular programmable widget having a credit card reader.
Figure 3I:
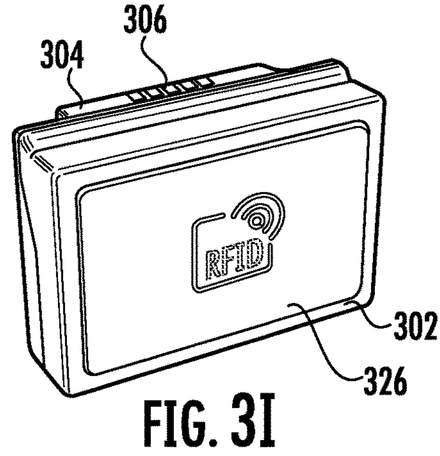
FIG. 3I illustrates an example perspective view modular programmable widget having a radio frequency identification (RFID) sensor.
Figure 3J:
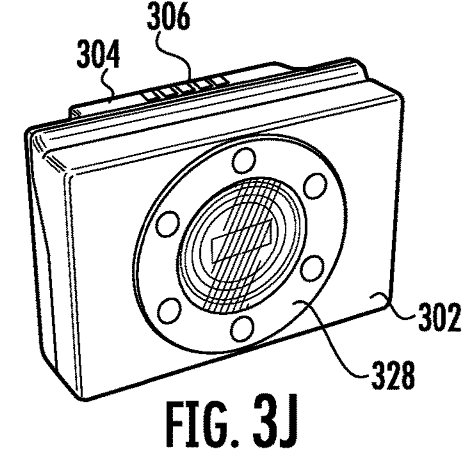
FIG. 3J illustrates an example perspective view modular programmable widget having an inventory tracker.

FIG. 3E illustrates an example modular programmable widget 116 having a toggle button 318. The toggle button 318 may be used, for example, to turn a feature or other function on or off. FIG. 3F illustrates an example modular programmable widget 116 having a camera 320. FIG. 3G illustrates an example modular programmable widget 116 having a biometric sensor 322. FIG. 3H illustrates an example modular programmable widget 116 having a credit card reader 324. FIG. 3I illustrates an example modular programmable widget 116 having an RFID sensor 326. FIG. 3J illustrates an example modular programmable widget 116 having an inventory tracker 328.

Figure 3K:
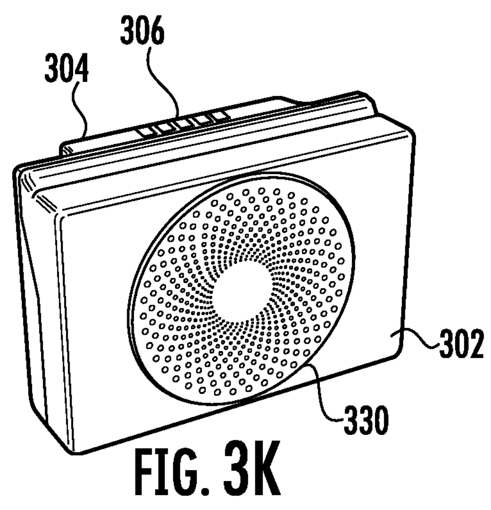
FIG. 3K illustrates an example perspective view modular programmable widget having an air quality sensor.
Figure 3L:
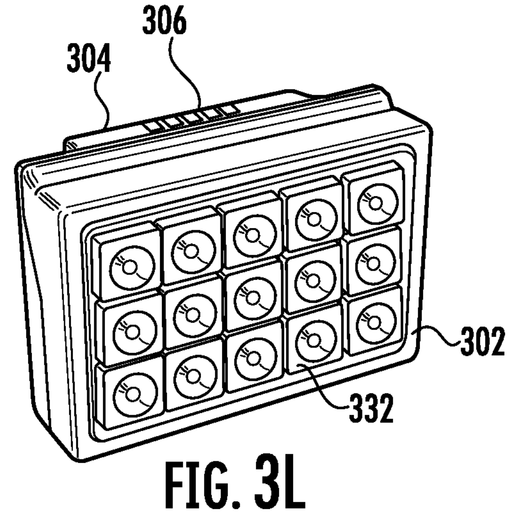
FIG. 3L illustrates an example perspective view modular programmable widget having a configurable light emitting diode (LED) light array.
Figure 3M:
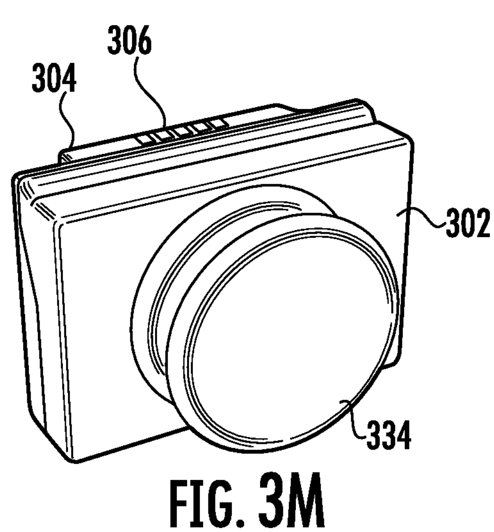
FIG. 3M illustrates an example perspective view modular programmable widget having a configurable joystick.
Figure 3N:
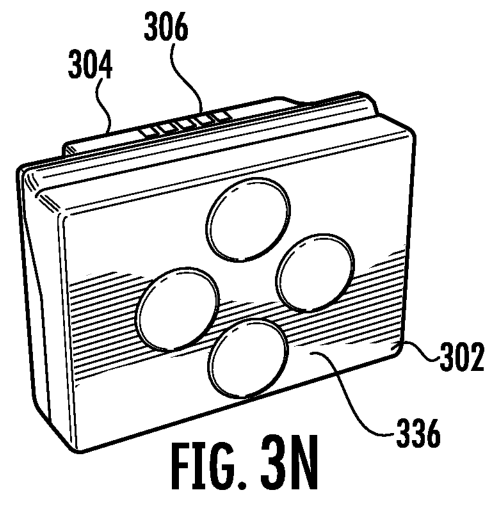
FIG. 3N illustrates an example perspective view modular programmable widget having a configurable four-way button pad.
Figure 3O:
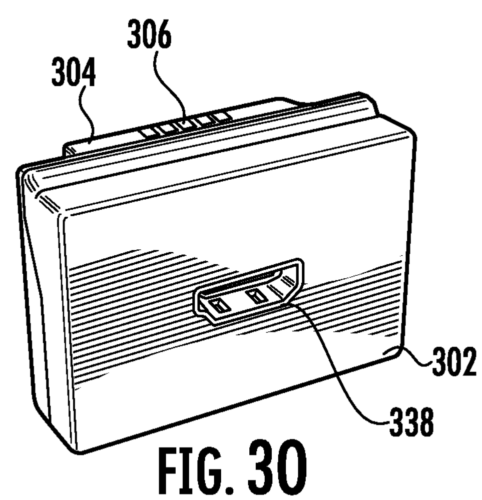
FIG. 3O illustrates an example perspective view modular programmable widget having a high-definition multimedia interface (HDMI) port.
Figure 3P:
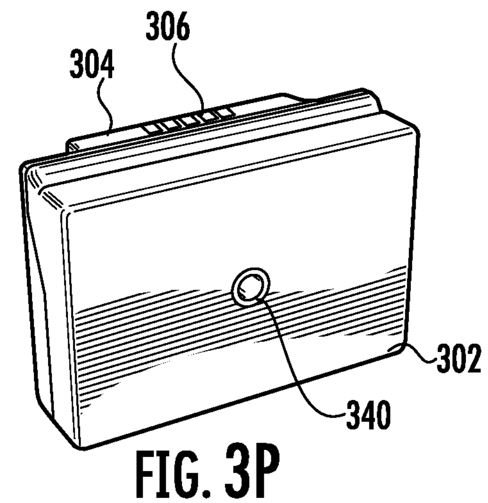
FIG. 3P illustrates an example perspective view modular programmable widget having an audio jack.

FIG. 3K illustrates an example modular programmable widget 116 having an air quality sensor 330. FIG. 3L illustrates an example modular programmable widget 116 having a configurable LED light array 332. FIG. 3M illustrates an example modular programmable widget 116 having a configurable joystick 334. FIG. 3N illustrates an example modular programmable widget 116 having a configurable four-way button pad 336. The buttons of the configurable four-way button pad 336 (as well as any other buttons on the various modular programmable widgets 116) may be individually assignable to functions, and or for adjusting a continuous parameter upwards or downwards, such as volume or temperature. FIG. 3O illustrates an example modular programmable widget 116 having an HDMI port 338. FIG. 3P illustrates an example modular programmable widget 116 having an audio jack 340.

Figure 3Q:
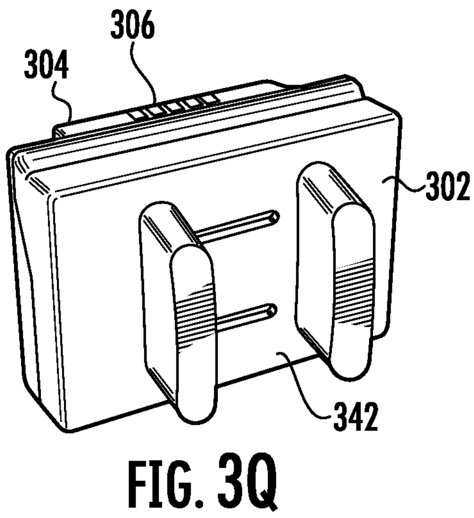
FIG. 3Q illustrates an example perspective view modular programmable widget having trailer control.
Figure 3R:
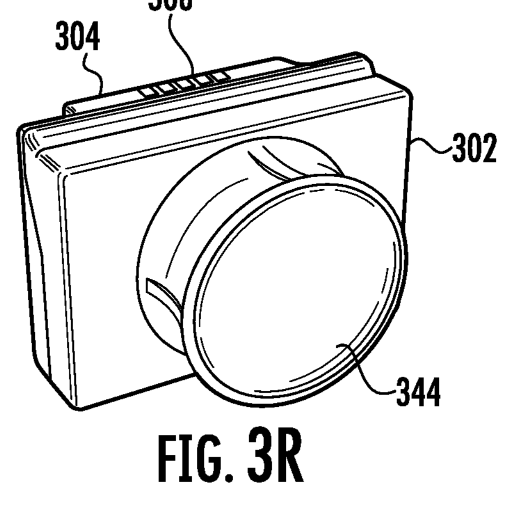
FIG. 3R illustrates an example perspective view modular programmable widget having a configurable multi-directional control.
Figure 3S:
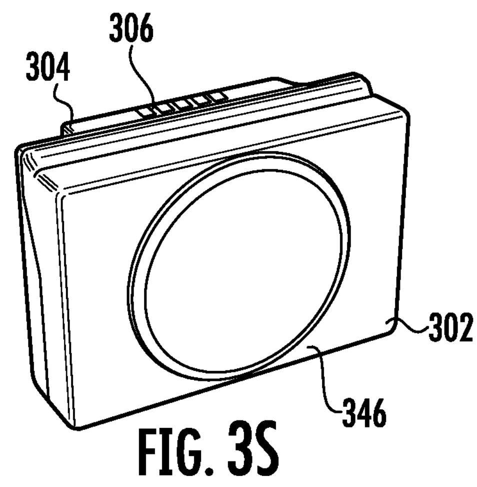
FIG. 3S illustrates an example perspective view modular programmable widget having an additive magnetic wireless charger.
Figure 3T:
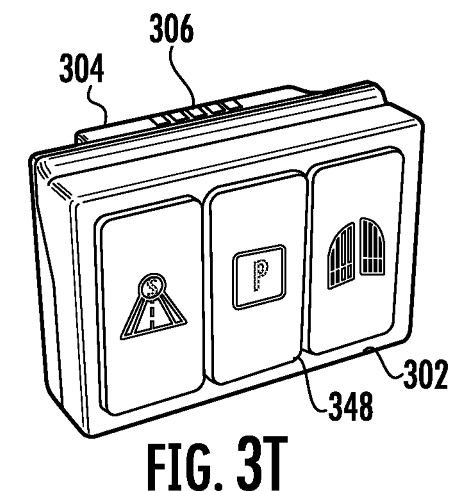
FIG. 3T illustrates an example perspective view modular programmable widget having a configurable access pass button pad.
Figure 3U:
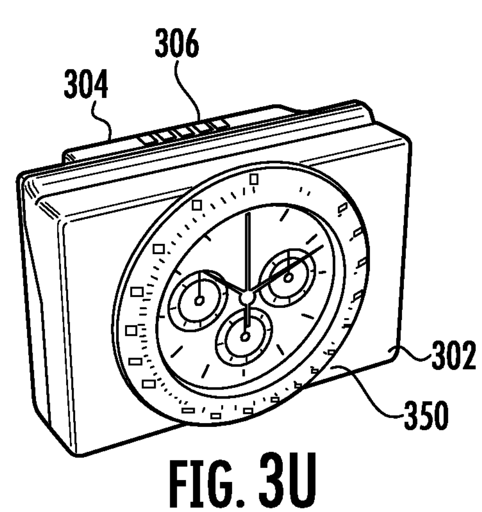
FIG. 3U illustrates an example perspective view modular programmable widget having an additive analog clock.
Figure 3V:
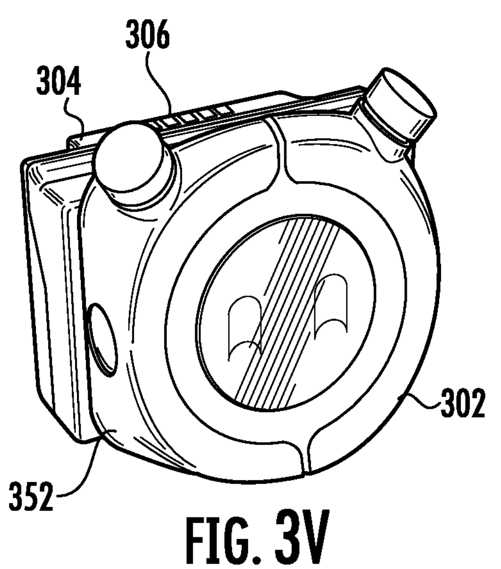
FIG. 3V illustrates an example perspective view modular programmable widget having a companion device.
Figure 3W:
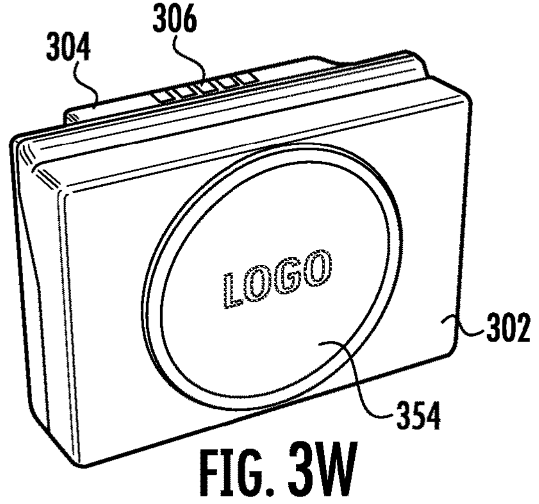
FIG. 3W illustrates an example perspective view modular programmable widget branded with a logo.

FIG. 3Q illustrates an example modular programmable widget 116 having trailer control 342. FIG. 3R illustrates an example modular programmable widget 116 having a configurable multi-directional control 344. FIG. 3S illustrates an example modular programmable widget 116 having an additive magnetic wireless charger 346. FIG. 3T illustrates an example modular programmable widget 116 having a configurable access pass button pad 348. FIG. 3U illustrates an example modular programmable widget 116 having an additive analog clock 350. FIG. 3V illustrates an example modular programmable widget 116 having a companion 352. FIG. 3W illustrates an example perspective view modular programmable widget branded with a logo 354. This may allow, for example, the modular programmable widget 116 to be offered with hard-coded co-branded functions that relate to a third party.

It should be noted that the modular programmable widgets 116 shown in FIGS. 3A-3W are each of the same exterior dimensions. This standard size allows for easy addition and removal of the modular programmable widgets 116 from the docks 202. In other cases, however, the modular programmable widgets 116 may include modular programmable widgets 116 of a larger physical size. Such modular programmable widgets 116 may be able to include more controls as compared to the default size of the modular programmable widgets 116.

Figure 3X:
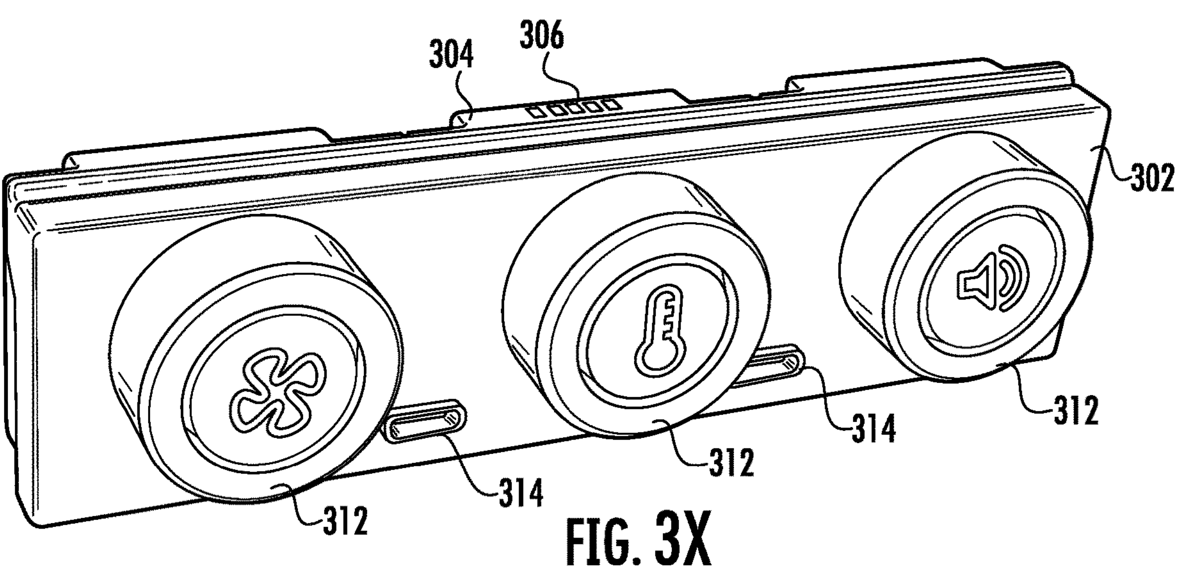
FIG. 3X illustrates an example perspective view modular programmable widget of a multiple of the length of a standard modular programmable widget shown in FIGS. 3A-3W.

FIG. 3X illustrates an example modular programmable widget 116 that is multiple times the length of a standard modular programmable widget 116 as shown in FIGS. 3A-3W. In this example, the modular programmable widget 116 is three times the length of the standard modular programmable widgets 116. Due to the increased length, the modular programmable widget 116 in FIG. 3X is able to provide additional controls. Here, multiple configurable dials 312 (as shown, three) are spaced apart along the front housing 302, with two additive power/data ports 314 arranged in the spaces between the configurable dials 312. In an example, the configurable dials 312 of this modular programmable widget 116 may provide a set of predefined second row controls, such as volume, temperature, and fan speed controls.

It should also be noted that, in some examples, the modular programmable widgets 116 may be branded with a logo 354 or other mark of a brand. This may allow, for example, the modular programmable widget 116 to be offered with hard-coded co-branded functions that relate to a third party. For instance, when pressed, the modular programmable widget 116 may provide co-branded access to a third-party product, invoke a function of the third-party product, activate a game function of the third-party product, and/or show content from the third-party product, as some non-limiting examples.

Figure 4A:
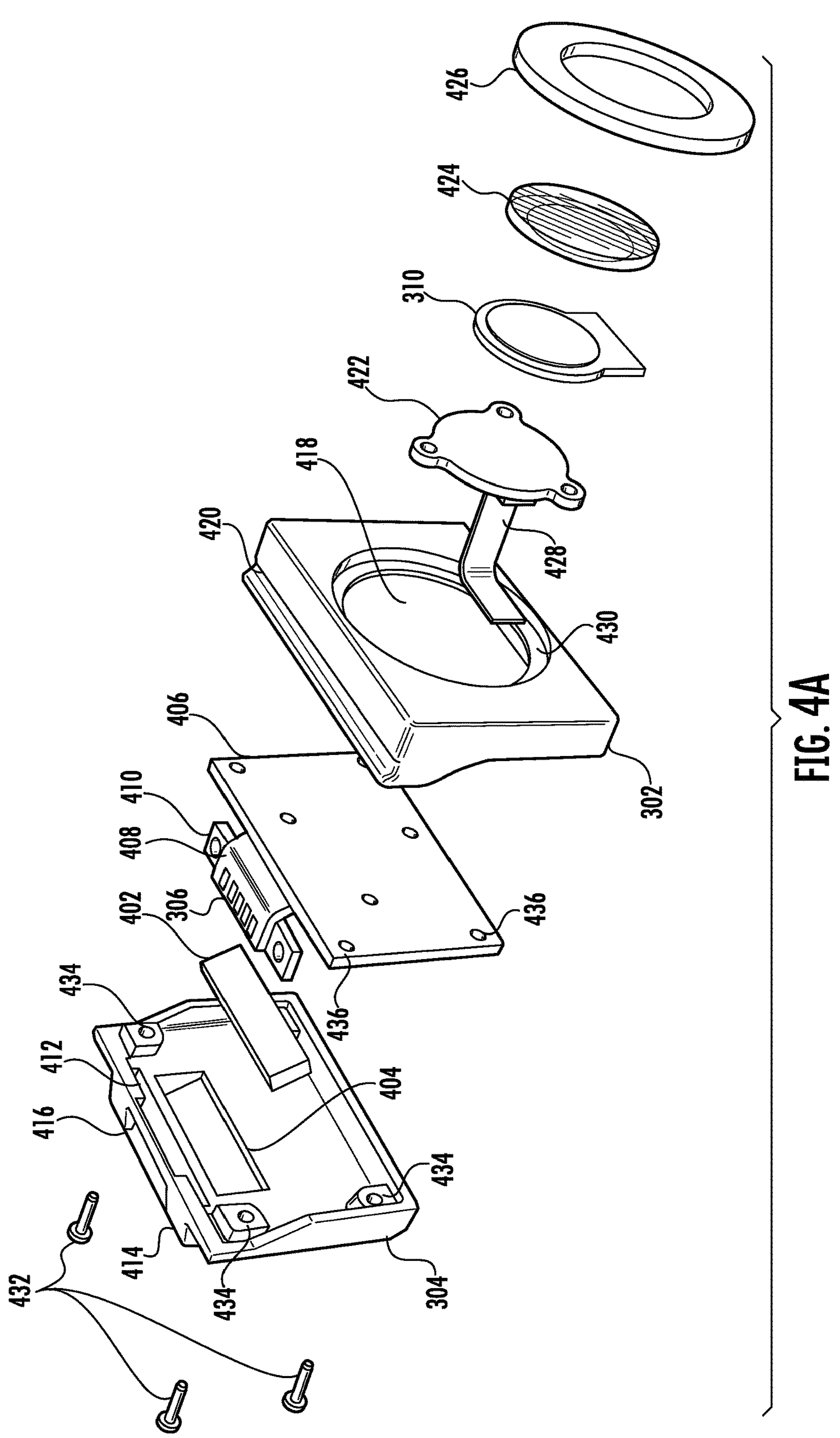
FIG. 4A illustrates an example exploded view of the modular programmable widget shown in FIG. 3A having a configurable button with a display.

FIG. 4A illustrates an example exploded view of the modular programmable widget 116 shown in FIG. 3A having a configurable button 308 with a display 310. As mentioned above, the modular programmable widget 116 includes the front housing 302 and back housing 304. Here, the back housing 304 defines the rear wall and a portion of the side walls of a right rectangular prism shape, while the front housing 302 defines the remaining front face and side wall portions of the rectangular prism.

The modular programmable widget 116 further includes an internal magnet 402 configured to retain the modular programmable widget 116 in position. In an example, the inside rear wall of the back housing 304 defines a magnet recess 404 lengthwise across the rear wall sized to receive the internal magnet 402 and hold the internal magnet 402 in position. As shown, the internal magnet 402 and magnet recess 404 are each of a generally rectangular shape, but variations in shape are possible.

The modular programmable widget 116 further includes a main circuit board 406 configured to physically hold the electronic components of the modular programmable widget 116. For example, the main circuit board 406 may hold the components responsible for data communication with the vehicle 102 and/or receiving power from the vehicle 102. The main circuit board 406 may also hold components supporting the specific functionality of the modular programmable widget 116. The main circuit board 406 may also define circuit traces and/or wires to electrically connect the electrical components to one another.

In one aspect, the main circuit board 406 may be physically and electrically connected to components to allow for the electrical connection of the modular programmable widget 116 to the dock 202. For example, a flexible ribbon 408 may be used to connect the main circuit board 406 to the contact pad 306 that are exposed by the modular programmable widget 116. A first end of the flexible ribbon 408 may terminate in the contact pads 306 allowing for electrical connection of the modular programmable widget 116 to the docks 202. The modular programmable widget 116 may further include a contact mount 410 connected to the second end of the flexible ribbon 408. The contact mount 410 may provide mechanical rigidity to the contact pad 306 and may also slide into and be retained into a contact slot 412 formed into the inside rear wall of the back housing 304.

The back housing 304 of the modular programmable widget 116 may define a generally flat vertical surface of the rear of the modular programmable widget 116. An attachment body 414 may form a frustrum or other shape extending rearwards from the back housing 304. In an example, the attachment body 414 may extend rearwards from the top of the vertical rear wall of the back housing 304, then tapering towards the lower portion of the rear face of the back housing 304.

Due to the greater depth provided at the upper side of the modular programmable widget 116, a contact window 416 may be defined by the top of the attachment body 414, above the contact slot 412, and may be configured to expose the contact pads 306 through the top of the back housing 304 for electrical connection to the dock 202. The attachment body 414 may further serve to lock the modular programmable widget 116 into place in the dock 202, as shown in further detail with respect to FIGS. 8A-8C.

The front housing 302 may define a front window 418 defining a location for mounting of the controls of the modular programmable widget 116. In the example shown in FIG. 4A, the modular programmable widget 116 is a configurable button 308, and the front window 418 is a sized to receive the components of the configurable button 308.

The top face of the front housing 302 may further define a locating groove 420 providing a concave surface along the length of the top face of the front housing 302. The locating groove 420 may aid in aligning, locating, and/or locking the modular programmable widget 116 into the dock 202.

The configurable button 308 may be formed of a stack of components including a display board 422, the display 310 itself, a display lens 424, and a button bezel 426. The display board 422 may be configured to hold the display 310, as well as to provide for mounting of a flexible ribbon 428 to the display 310. The display board 422 may further include the switch components configured to sense whether the configurable button 308 mechanism is being pressed by a user. The flexible ribbon 428 may be connected to the main circuit board 406 and used to communicate information such as the button pressed state and information indicative of what to display to the display 310.

The display lens 424 may be configured to protect the display 310 and may be formed of a flat disk of a material allowing the passage of light, such as a clear plastic or glass.

The button bezel 426 may be formed as a disk of material sized to surround the display lens 424. The front window 418 of the front housing 302 may define a flange 430, spaced away from the front face of the front housing 302, of the same thickness as the button bezel 426. Thus, when assembled, the front of the display lens 424 and the button bezel 426 may be flush with the front surface of the front housing 302.

To facilitate assembly of the modular programmable widget 116, one or more fasteners 432, such as screws or pins, may be used to hold the back housing 304 and front housing 302 together. In an example, through holes 434 may be formed through the back of the back housing 304 which may be aligned with through holes 436 through the main circuit board 406, and finally fixed into apertures (e.g., threaded holes, not shown) into the rear face of the front housing 302. It should be noted that other approaches to assembling the modular programmable widgets 116 may be used in other examples, such as snap fit connectors and/or glue.

Figure 4B:
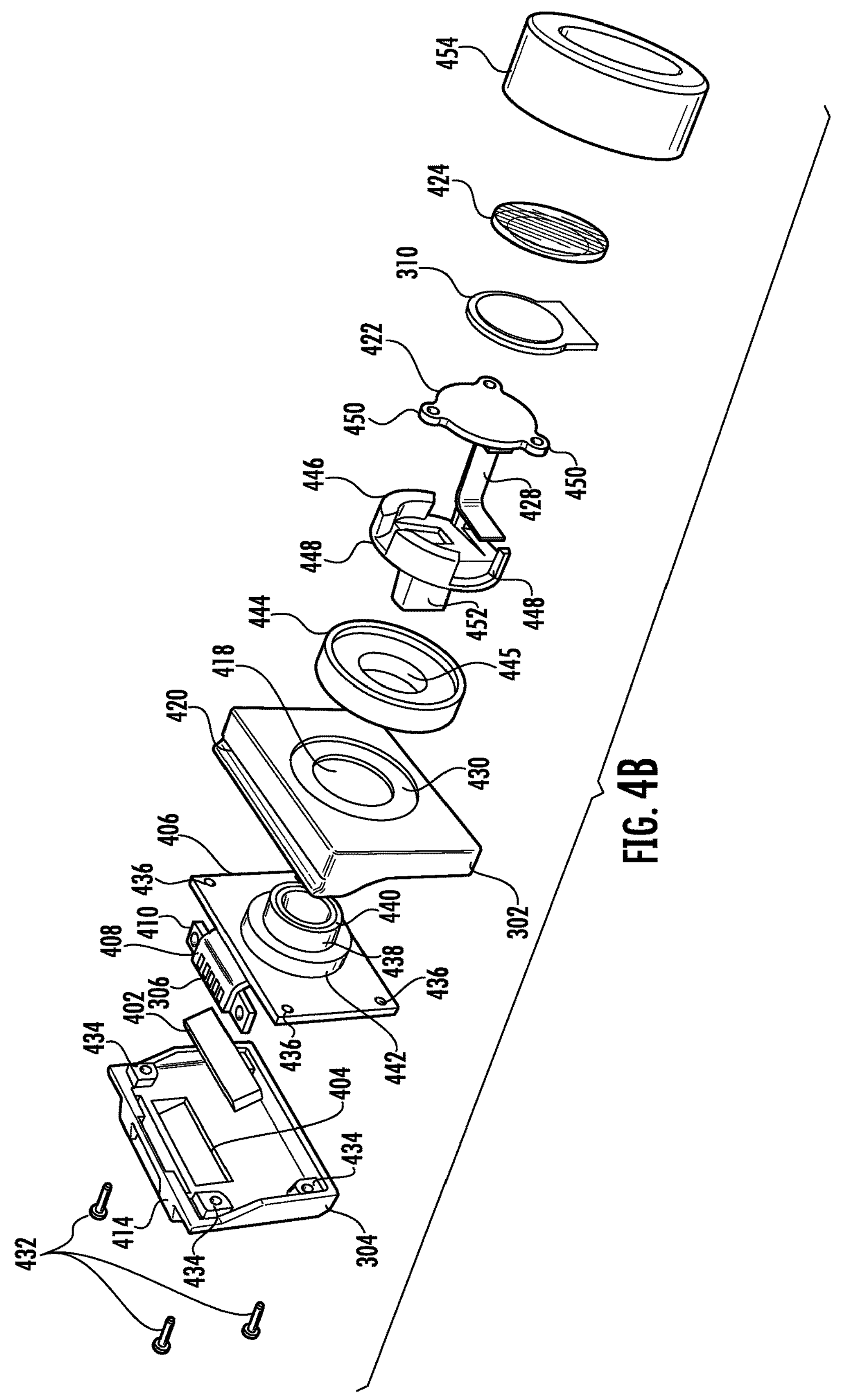
FIG. 4B illustrates an example exploded view of the modular programmable widget shown in FIG. 3B having a configurable dial with a display.

FIG. 4B illustrates an example exploded view of the modular programmable widget 116 shown in FIG. 3B having a configurable dial 312 with a display 310. Similar to as shown in FIG. 4A, the configurable dial 312 including components such as the front housing 302, back housing 304, internal magnet 402, main circuit board 406, flexible ribbon 428, contact mount 410, display 310, display board 422, display lens 424, and flexible ribbon 428.

To support the functionality of the dial, the modular programmable widget 116 may also include a rotary encoder 438 mounted to the main circuit board 406. The rotary encoder 438 may be configured to convert rotational movement and/or speed of its encoder shaft 440 into an electrical signal, using various mechanical, optical, and/or magnetic techniques. An encoder stop 442 may surround the rotary encoder 438, and may serve to provide spacing between the main circuit board 406 and the front housing 302. The front window 418 may be sized to the diameter of the encoder shaft 440 of the rotary encoder 438. When assembled, the encoder shaft 440 may be configured to be inserted outwards through the front window 418 of the front housing 302 until the rear face of the front housing 302 abuts the front face of the encoder stop 442.

An encoder bearing 444 may be pressed onto the encoder shaft 440 protruding from the front window 418. The encoder bearing 444 may be of a hollow cylindrical shape, such as a washer, defining a bearing aperture 445 through its hollow center of a diameter sufficient to engage the outer cylindrical face of the encoder shaft 440. The encoder bearing 444 may connect to and spin along with the encoder shaft 440. To prevent the encoder bearing 444 from slipping with respect to the encoder shaft 440, in some examples the encoder shaft 440 may provide one or more detents or protrusions configured to be received into corresponding features of the interior of the encoder bearing 444.

A display housing 446 may be configured to hold the stationary components of the modular programmable widget 116 that do not rotate with the rotary encoder 438. For example, the display housing 446 may define a generally cylindrical outer housing 448 configured to hold the display board 422, display 310, and display lens 424. The outer housing 448 may define one or more openings into its circumference to receive corresponding attachment points 450 extending radially outwards from the body of the display board 422. This may allow the display board 422 to be mounted in a fixed position within the outer housing 448.

The display housing 446 may further define a wire holder 452, extending from the outer housing 448 into the interior of the hollow encoder shaft 440. The wire holder 452 may define an opening through its center to retain and guide the flexible ribbon 428 between the display 310 and the main circuit board 406, through the interior of the rotary encoder 438.

A rotary dial 454 may be sized to receive the encoder bearing 444 and to provide a surface for manipulation of the rotary encoder 438 by a user. Once the display board 422, display 310, and display lens 424 components are mounted within the display housing 446, the rotary dial 454 may be snapped onto the exterior of the encoder bearing 444. The rotary dial 454 may be rotatable by the user to allow for rotation of the rotary encoder 438 and may also serve as a bezel surrounding and protecting the display 310 components.

Figure 4C:
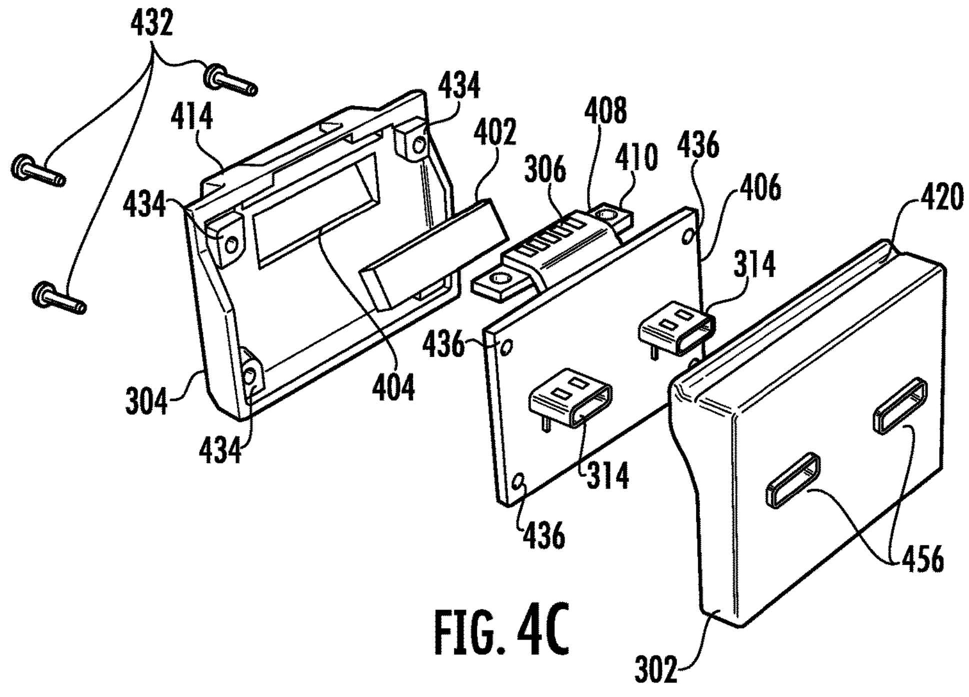
FIG. 4C illustrates an example exploded view of the modular programmable widget shown in FIG. 3C having additive power and data ports.

FIG. 4C illustrates an example exploded view of the modular programmable widget 116 shown in FIG. 3C having additive power/data ports 314. Similar to as shown in FIGS. 4A-4B, the modular programmable widget 116 as shown includes components such as the front housing 302, back housing 304, internal magnet 402, main circuit board 406, flexible ribbon 428, and contact mount 410.

Additionally, this modular programmable widget 116 may include one or more power/data ports 314 mounted to the main circuit board 406. The front housing 302 may also define port apertures 456 corresponding to the locations of the power/data ports 314. This accordingly allows for the power/data ports 314 to be accessible for use in the assembled modular programmable widget 116.

Figure 4D:
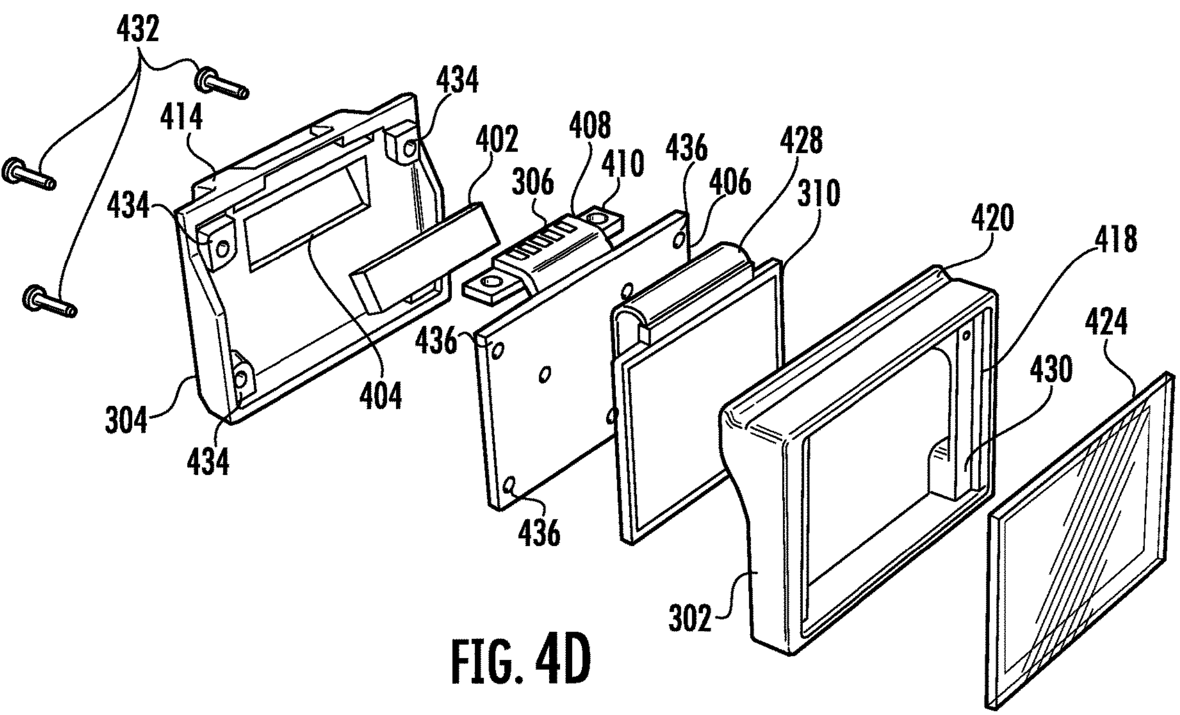
FIG. 4D illustrates an example exploded view of the modular programmable widget shown in FIG. 3D having a configurable touch screen.

FIG. 4D illustrates an example exploded view of the modular programmable widget 116 shown in FIG. 3D having a configurable touch screen 316. Again, similar to as shown in FIGS. 4A-4C, the modular programmable widget 116 having the configurable touch screen 316 includes components such as the front housing 302, back housing 304, internal magnet 402, main circuit board 406, flexible ribbon 428, and contact mount 410.

Additionally, this modular programmable widget 116 includes a display 310 and display lens 424, although in this example of a longer rectangular shape. The front window 418 of the front housing 302 may be sized to a rectangular shape covering the bulk of the front of the modular programmable widget 116. The front window 418 may also define a flange 430 for receiving the display lens 424, similar to as discussed above. The flexible ribbon 428 may, in this example, connect the display 310 to the main circuit board 406, without requiring an intermediate display board 422.

Figure 5:
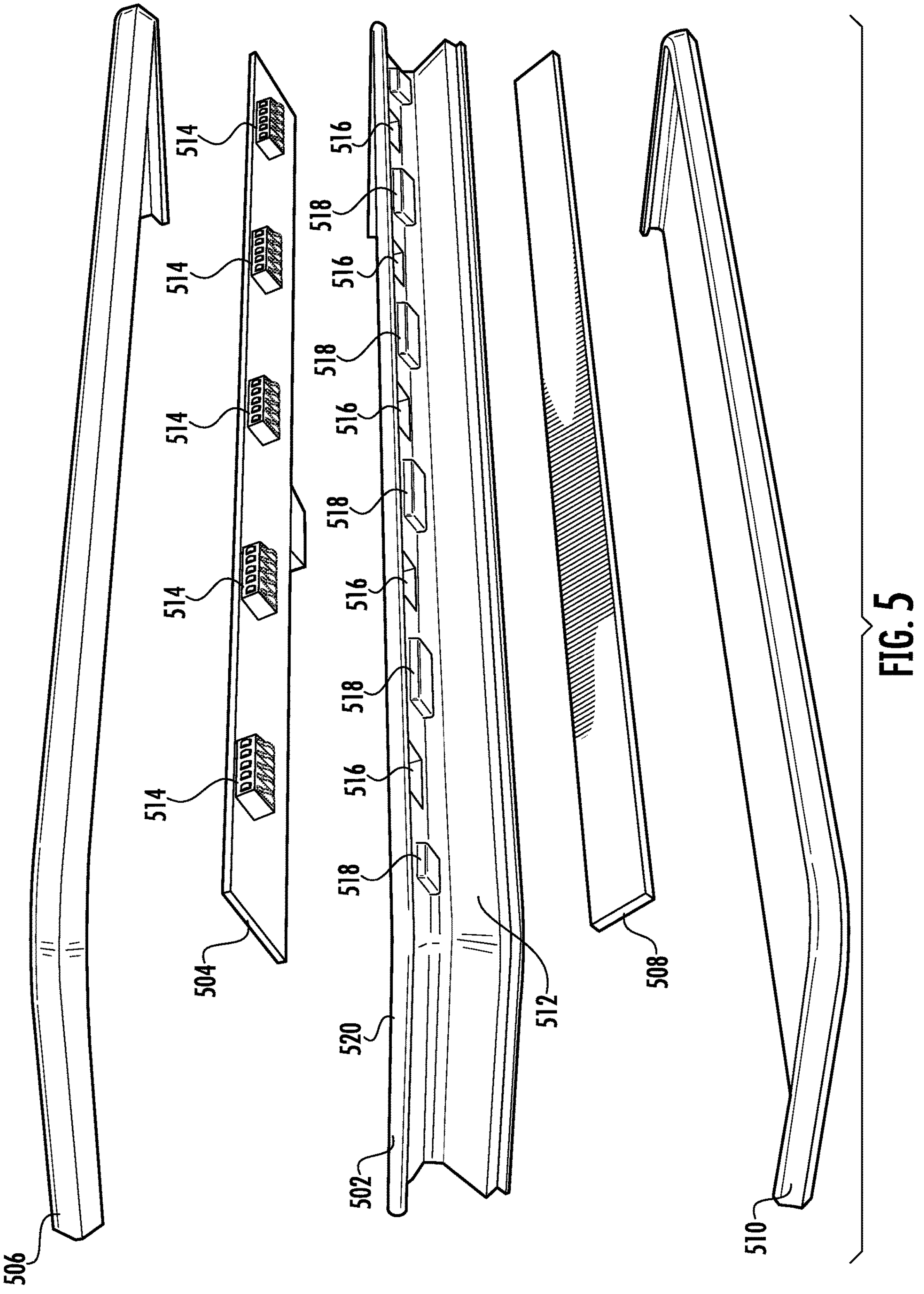
FIG. 5 illustrates an example exploded view of a dock for receiving the modular programmable widgets.

FIG. 5 illustrates an example exploded view of a dock 202 for receiving the modular programmable widgets 116. The illustrated dock 202 may be the dock 202A of the center stack configurable display 114, in an example. As shown, the dock 202 includes a main substrate 502, a main dock board 504, an upper housing 506, a ferrous metal strip 508, and a lower housing 510.

The main substrate 502 may define a securing channel 512 for receiving the modular programmable widgets 116. The securing channel 512 may be sized to conform with the profile of the attachment body 414 of the rear of the modular programmable widgets 116. The main dock board 504 may expose dock connectors 514 extending downward from its lower surface. The dock connectors 514 may be configured for receiving the contact pads 306 of the modular programmable widgets 116. These dock connectors 514 may be sized to fit within contact apertures 516 in the upper face of the securing channel 512.

The securing channel 512 may further define locators 518 extending downwards into the securing channel 512, on either side of each of the dock connectors 514. These locators 518 may serve to aid in the placement of the modular programmable widgets 116 in positions where the contact pad 306 of the modular programmable widget 116 is aligned with the dock connector 514.

The upper end of the securing channel 512 may define a protrusion 520 matching the profile of the concave locating groove 420 in the top of the front housing 302 of the modular programmable widget 116. Here the protrusion 520 is a rounded shape, with generally the same diameter as the concavity of the locating groove 420. This protrusion 520 may serve as a boss to guide rotation of the modular programmable widget 116 into position to be snapped into place, as shown in further detail in FIGS. 8A-8C. When installed into place, the contact pads 306 may be electrically connected to the dock connectors 514, which in turn connect to a cable 522 for connection to the widget controller 112. The upper housing 506 may be configured to fit over the main substrate 502 and the main dock board 504, to provide a smooth, finished appearance to the front of the dock 202.

Below the main substrate 502, the ferrous metal strip 508 may define an elongated, generically rectangular magnetic surface. The ferrous metal strip 508 may be mounted below the securing channel 512 and may be attracted to by the internal magnets 402 of the modular programmable widget 116 to secure the modular programmable widget 116 into place. The lower housing 510 may be configured to fit below the main substrate 502 and the ferrous metal strip 508, to provide a smooth, finished appearance to the bottom of the dock 202.

Figure 6:
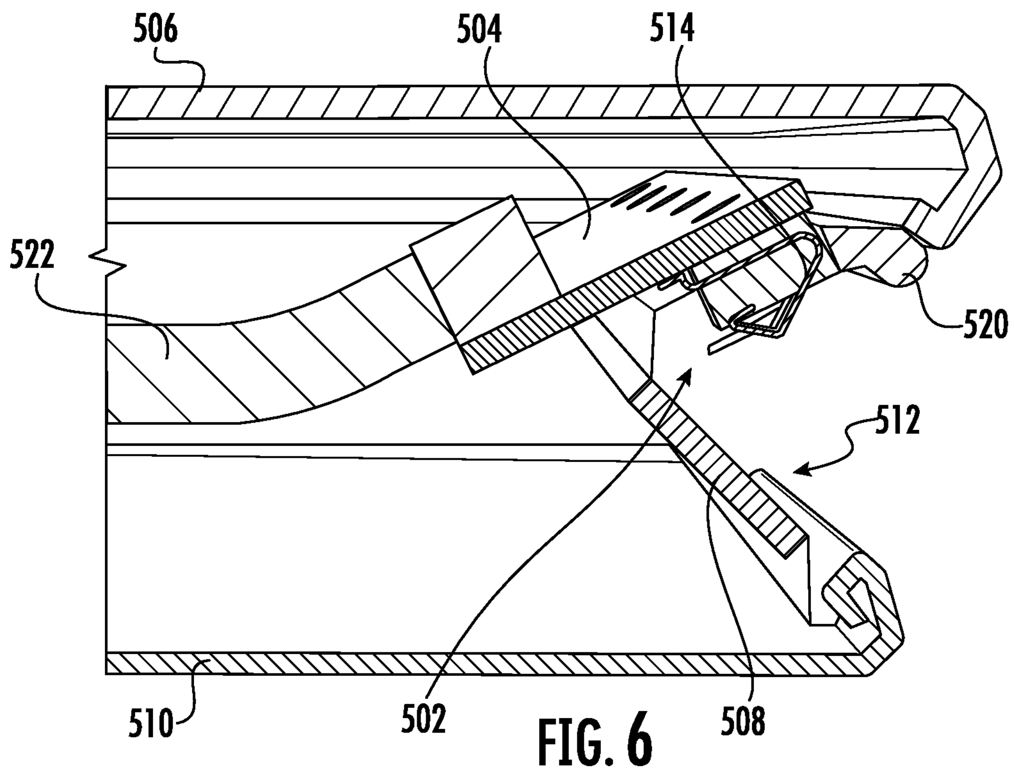
FIG. 6 illustrates a side cutaway view of the dock of FIG. 5 in an assembled state.
Figure 7:
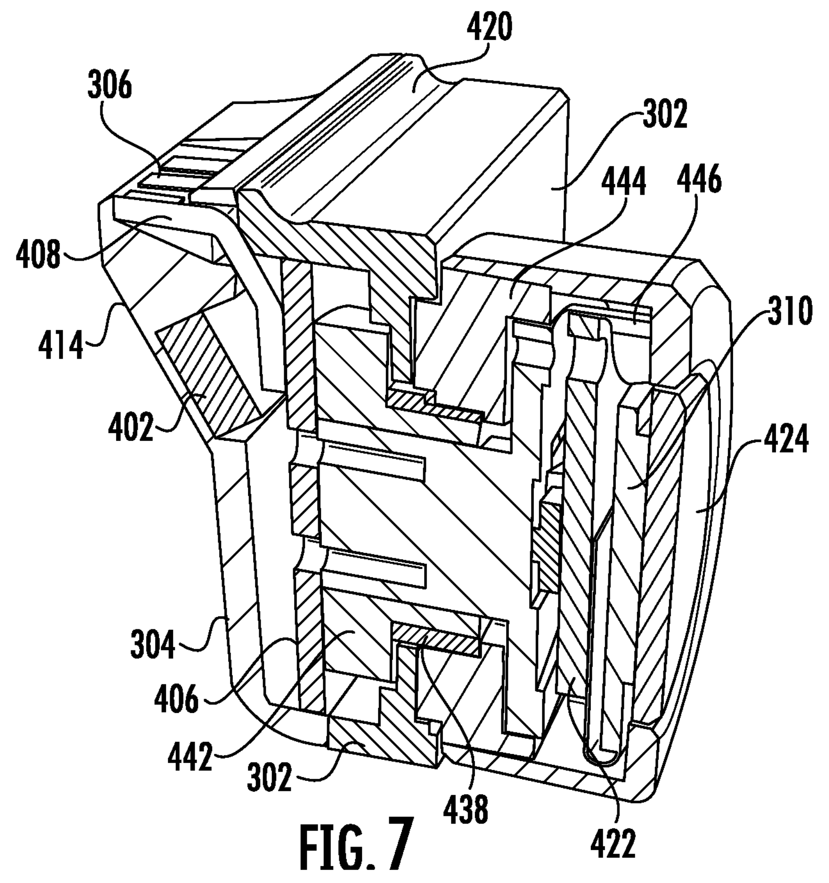
FIG. 7 illustrates a side cutaway view of the modular programmable widget of FIG. 4B in an assembled state.

FIG. 6 illustrates a side cutaway view of the dock 202 of FIG. 6 in an assembled state. FIG. 7 illustrates a side cutaway view of the modular programmable widget 116 of FIG. 4B in an assembled state. As shown, the components of the dock 202 and modular programmable widgets 116 includes aspects to facilitate their selective mechanical and electrical connection.

Figures 8A, 8B, 8C:
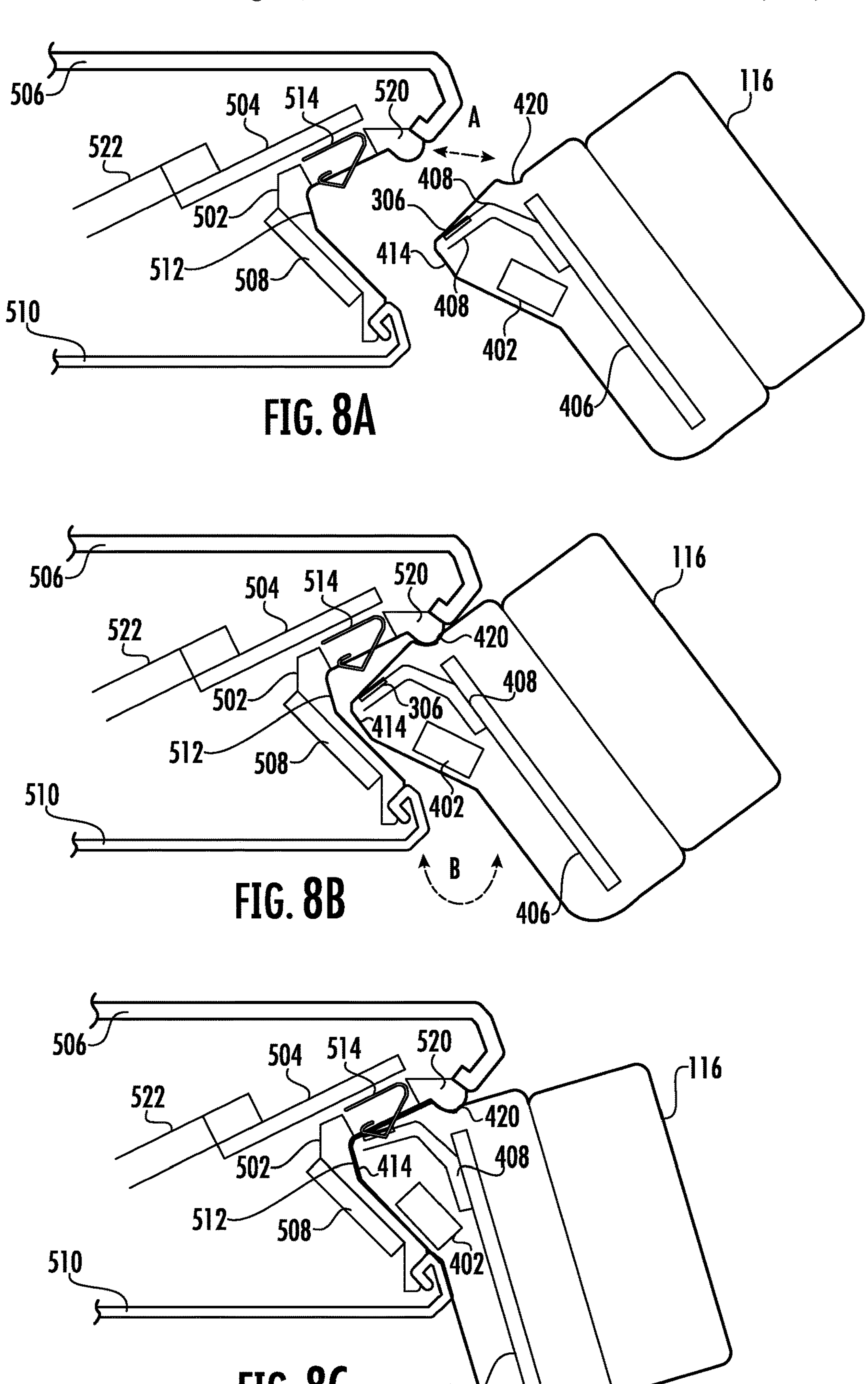
FIG. 8A illustrates a side view of a first operation in the attachment of an example modular programmable widget to the dock.
FIG. 8B illustrates a side view of a second operation in the attachment of an example modular programmable widget to the dock.
FIG. 8C illustrates a side view of a completed attachment of an example modular programmable widget to the dock.

FIG. 8A illustrates a first operation A in the attachment of an example modular programmable widget 116 to the dock 202. As shown, the operation A includes moving the modular programmable widget 116 towards the dock 202, such that the locating groove 420 of the modular programmable widget 116 is aligned with the protrusion 520 of the dock 202.

FIG. 8B illustrates a second operation B in the attachment of an example modular programmable widget 116 to the dock 202. As shown, the operation B includes, once the locating groove 420 is mated to the protrusion 520, pivoting the modular programmable widget 116 around the protrusion 520 such that the attachment body 414 of the modular programmable widget 116 moved into the securing channel 512. In doing so, the contact pad 306 of the modular programmable widget 116 moves towards electrical contact with the dock connector 514 of the dock 202.

FIG. 8C illustrates a completed attachment of an example modular programmable widget 116 to the dock 202. As shown, the attachment body 414 is mated into the inner surface of the securing channel 512, and the contact pad 306 of the modular programmable widget 116 is in electrical contact with the dock connector 514 of the dock 202. Also, the internal magnet 402 of the modular programmable widget 116 is attracted to the ferrous metal strip 508 within the dock 202, providing force to keep the modular programmable widget 116 in place within the dock 202.

Significantly, despite the differences in controls and size of the modular programmable widgets 116, the modular programmable widgets 116 each define the same connection components. For instance, each of the modular programmable widgets 116 has the same electrical contact pads 306 and locating groove 420 as discussed above. Thus, any of the modular programmable widgets 116 may be connected to the dock 202, allowing for a user to choose whichever modular programmable widget 116 has the desired controls and/or appearance.

Figure 9:
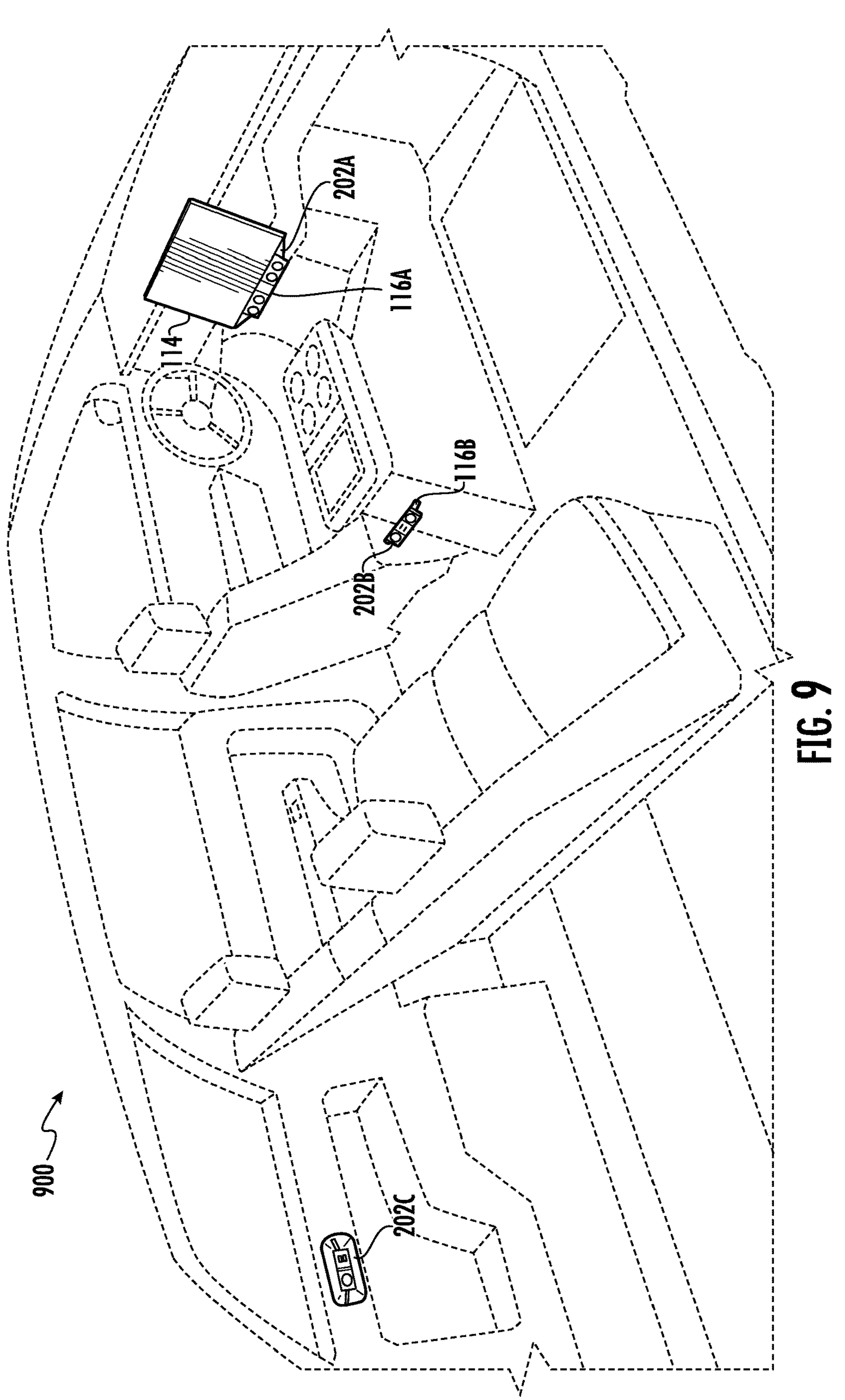
FIG. 9 illustrates an example cutaway view of a vehicle interior supporting the modular programmable widgets having an alternate packaging design.

FIG. 9 illustrates an example cutaway view of a vehicle interior 200 supporting the modular programmable widgets 116 having an alternate packaging design. Similar to as shown before, one or more first modular programmable widgets 116 may be attached to a dock 202A of the center stack configurable display 114. This location under the center stack configurable display 114 may be easily accessible for driver and passenger. Also shown, one or more second modular programmable widgets 116 may be attached to a console bin dock 202B. Here, the second modular programmable widget 116 is attached to the console bin dock 202B for access by rear passengers. As further shown, one or more third modular programmable widgets 116 may be attached to a cargo dock 202C in the rear cargo area. It should also be noted that the illustrated vehicle interior 200 is an example, and interiors having more, fewer, or differently located components may be used.

FIGS. 10A-10I illustrate example modular programmable widgets 116 in the alternative packaging. Referring collectively to FIGS. 10A-10I, an enclosure having a generally rectangular prism shape may be defined by a front housing 302 and a back housing 304. The front housing 302 may define a generally flat front surface of the modular programmable widget 116, while the back housing 304 may define the remainder of the enclosure, including the rear, side, and top walls that house the internal circuitry and other components of the modular programmable widget 116. Controls may be provided on the front housing 302, while connectivity to the vehicle 102 may be provided via contact pads 306 exposed through the top of the back housing 304. The contact pads 306 may allow for transmission of data and power between the modular programmable widgets 116 and the dock 202. In an example, the contact pads 306 may be leaf spring contacts.

Figure 10A:
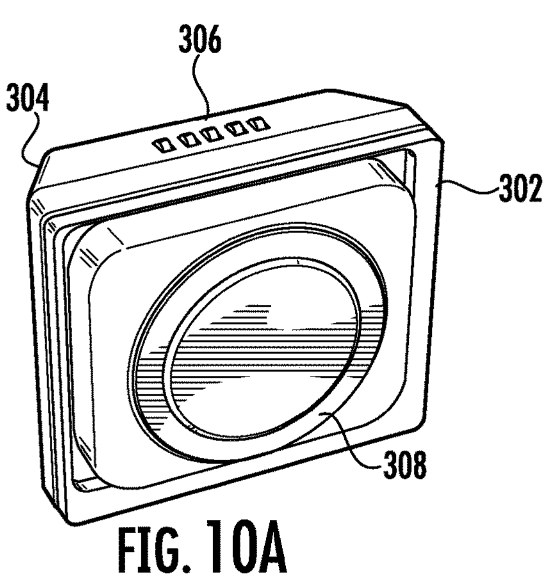
FIG. 10A illustrates an example perspective view of a modular programmable widget having a configurable button.
Figure 10B:
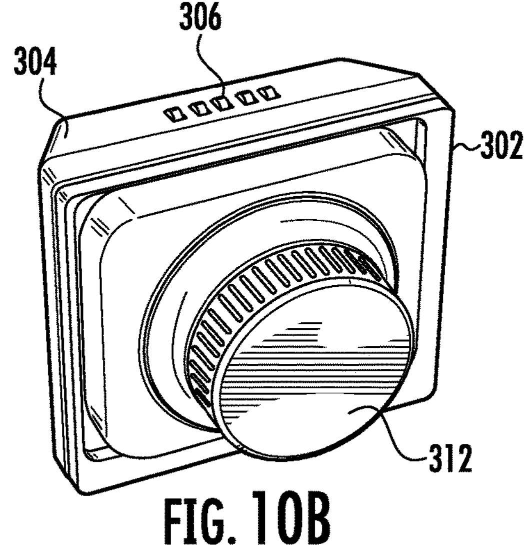
FIG. 10B illustrates an example perspective view of a modular programmable widget having a configurable dial.
Figure 10C:
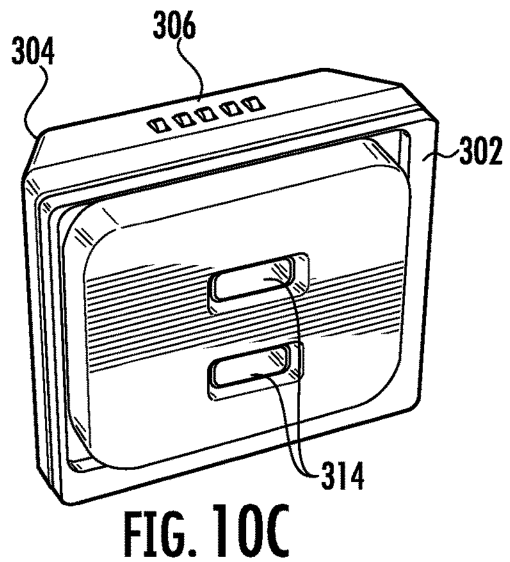
FIG. 10C illustrates an example perspective view of a modular programmable widget having additive power/data ports.
Figure 10D:
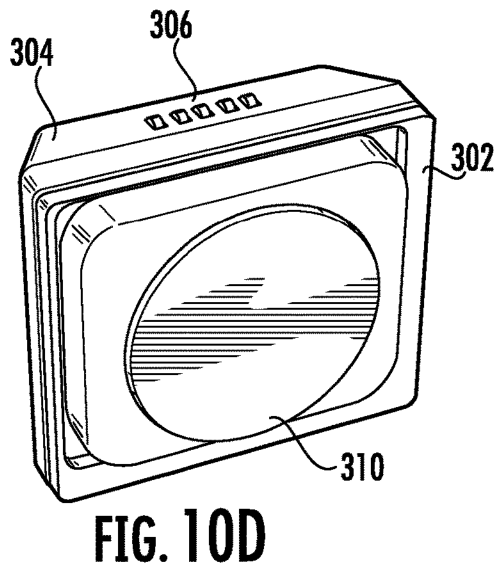
FIG. 10D illustrates an example perspective view of a modular programmable widget having a configurable display.

The front housing 302 may expose various controls that may provide interaction with the user. In the example of FIG. 10A, this may include a configurable button 308. While not shown, in some examples the configurable button 308 may include a display 310. FIG. 10B illustrates an example modular programmable widget 116 having a configurable dial 312. FIG. 10C illustrates an example modular programmable widget 116 having additive power/data ports 314. As shown, the modular programmable widgets 116 in FIG. 10C provides two USB power/data ports 314, but this is merely an example, and different quantities and types of connectors may be exposed by the modular programmable widgets 116. FIG. 10D illustrates an example modular programmable widget 116 having a display 310. As shown in this example, the modular programmable widget 116 provides a flat display 310 on the front surface of the modular programmable widget 116.

Figure 10E:
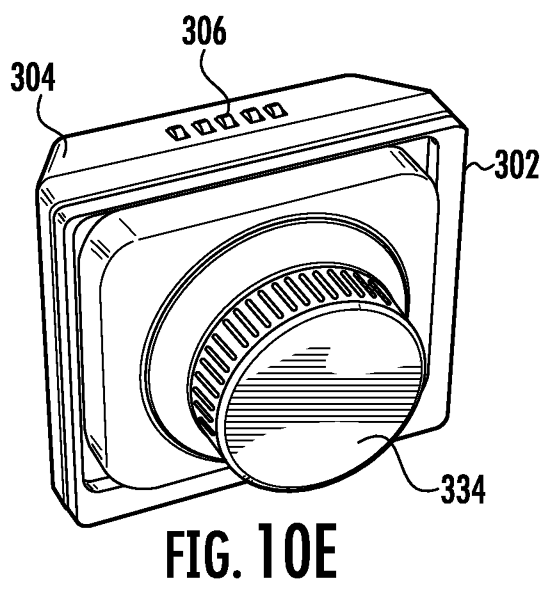
FIG. 10E illustrates an example perspective view of a modular programmable widget having a companion.
Figure 10F:
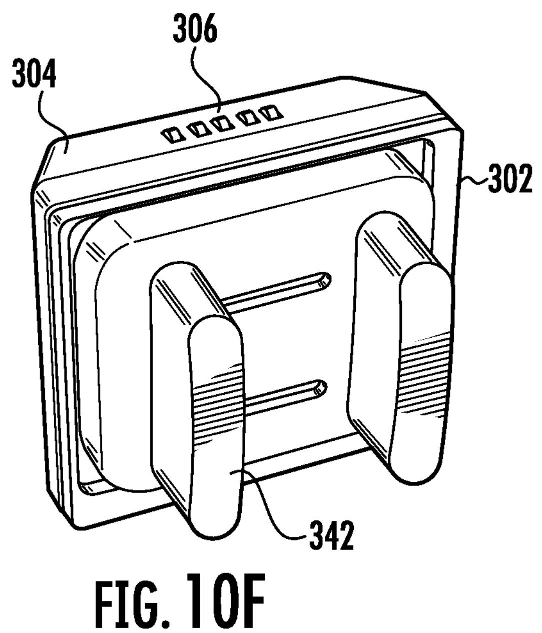
FIG. 10F illustrates an example perspective view of a modular programmable widget having a configurable joystick.
Figure 10G:
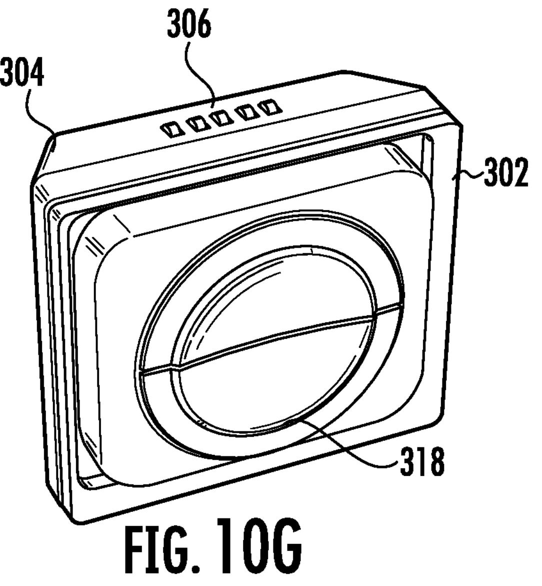
FIG. 10G illustrates an example perspective view of a modular programmable widget having trailer control.
Figure 10H:
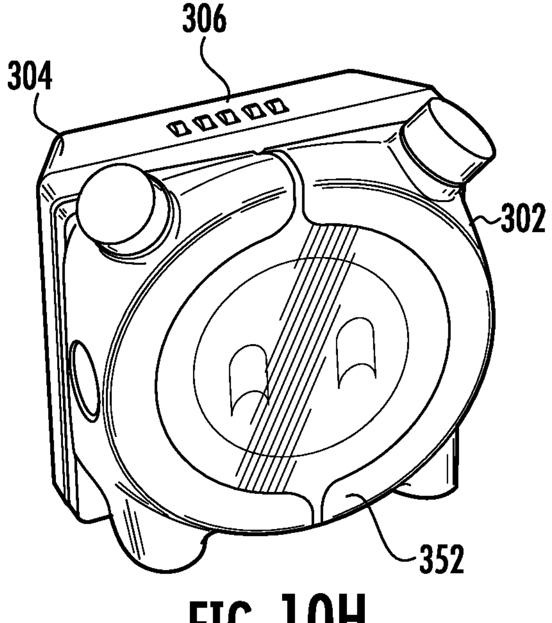
FIG. 10H illustrates an example perspective view of a modular programmable widget having a toggle button.

Further examples are possible, such as discussed above. For instance, FIG. 10E illustrates an example modular programmable widget 116 having a configurable joystick 334. FIG. 10F illustrates an example modular programmable widget 116 having a trailer control 342. FIG. 10G illustrates an example modular programmable widget 116 having toggle button 318. FIG. 10H illustrates an example modular programmable widget 116 having a companion 352.

It should be noted that the modular programmable widgets 116 shown in FIGS. 10A-10H share the same exterior dimensions. This standard size allows for easy addition and removal of the modular programmable widgets 116 from the docks 202. In other cases, however, the modular programmable widgets 116 may include modular programmable widgets 116 of a larger physical size. Such modular programmable widgets 116 may be able to include more controls as compared to the default size of the modular programmable widgets 116.

Figure 10I:
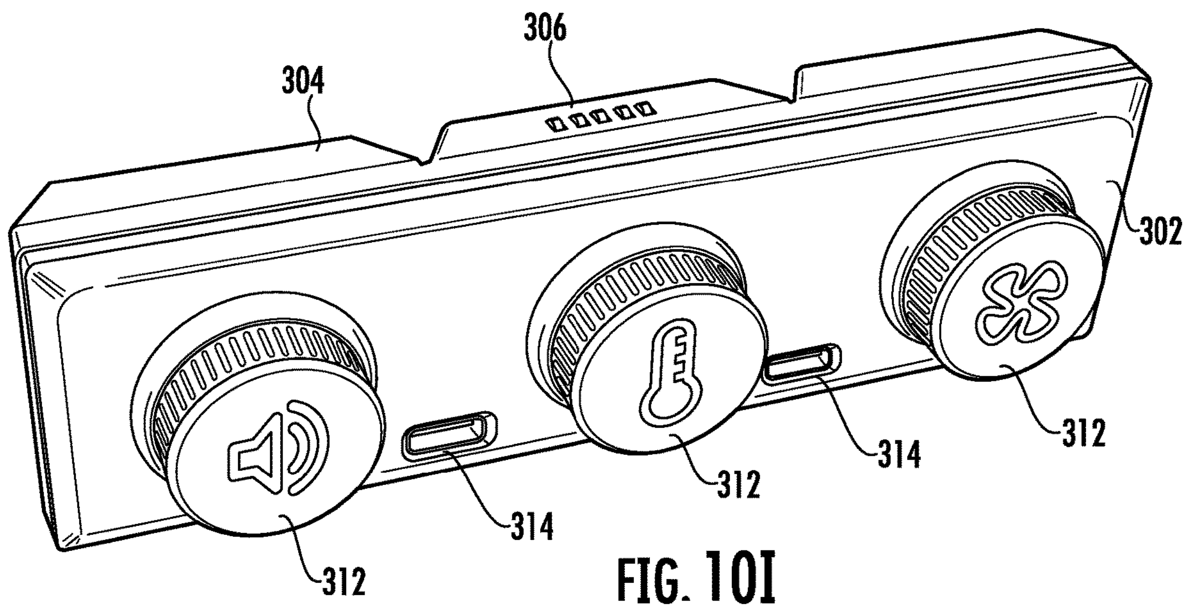
FIG. 10I illustrates an example perspective view of a modular programmable widget that is multiple times the length of a standard modular programmable widget as shown in FIGS. 10A-10H.

FIG. 10I illustrates an example modular programmable widget 116 that is multiple times the length of a standard modular programmable widget 116 as shown in FIGS. 10A-10H. In this example, the modular programmable widget 116 is three times the length of the standard modular programmable widgets 116. Due to the increased length, the modular programmable widget 116 in FIG. 10I is able to provide multiple configurable dials 312 (here three) spaced apart along the front housing 302, with two additive power/data ports 314 arranged in the spaces between the configurable dials 312. In an example, the configurable dials 312 of this modular programmable widget 116 may provide a set of predefined second row bundle of controls, such as volume, temperature, and fan speed controls. For example, the main circuit board 406 of the modular programmable widget 116 may be preprogrammed to control those aspects by communication with the widget controller 112 when the modular programmable widget 116 is electrically connected to the dock 202.

Figure 11:
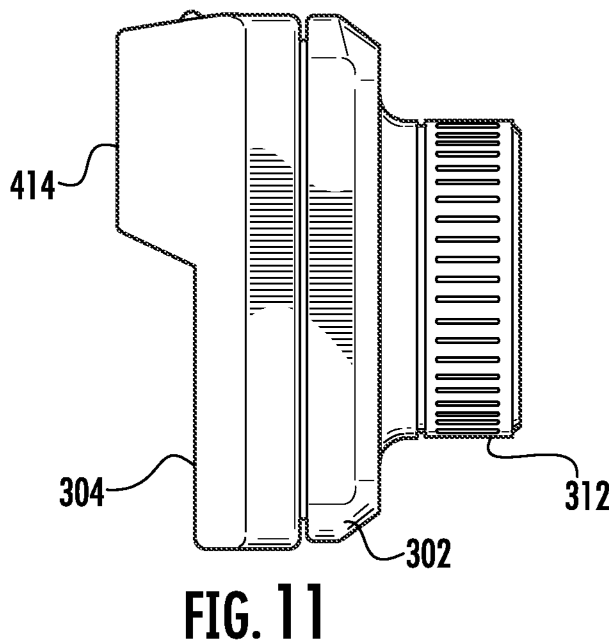
FIG. 11 illustrates an example side view of the modular programmable widget of FIG. 10B having a configurable dial.
Figure 12:
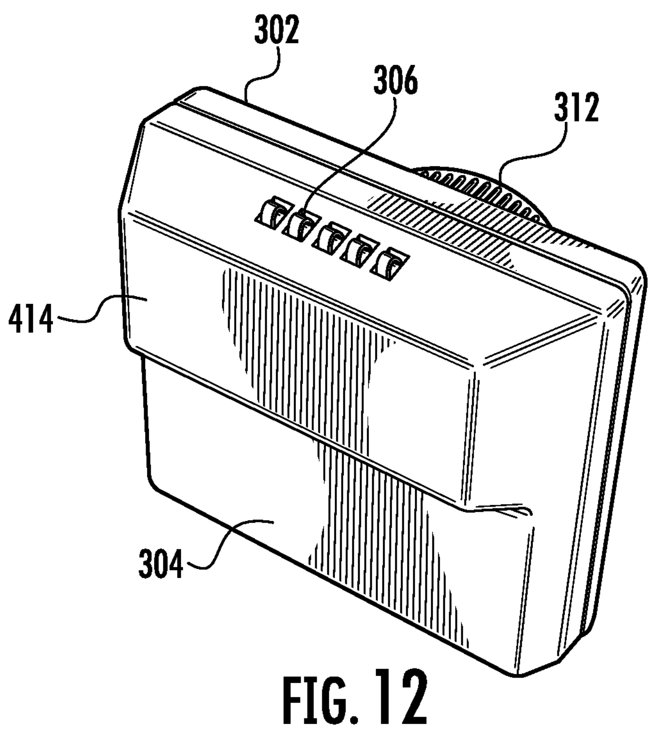
FIG. 12 illustrates an example rear perspective view of the modular programmable widget of FIG. 8B having a configurable dial.

FIG. 11 illustrates an example side view of the modular programmable widget 116 of FIG. 10B having a configurable dial 312. FIG. 12 illustrates an example rear perspective view of the modular programmable widget 116 of FIG. 10B having a configurable dial 312. As collectively shown in FIGS. 11-12, the back housing 304 of the modular programmable widget 116 may define a generally flat vertical surface of the rear of the modular programmable widget 116.

The back housing 304 may further define the attachment body 414 extending rearward from the vertical surface of the rear wall. In an example the attachment body 414 may form a frustrum or other shape extending rearwards from the back housing 304. In an example, the attachment body 414 may extend rearwards in the upper portion of the back housing 304 and may then taper towards the flat back of the rear face of the back housing 304.

Due to the greater depth provided by the attachment body 414 at the upper portion of the modular programmable widget 116, a contact window 416 may be defined by the top of the attachment body 414, above the contact slot 412, and may be configured to expose the contact pads 306 through the top of the back housing 304 for electrical connection to the dock 202. The attachment body 414 may further serve to lock the modular programmable widget 116 into place in the dock 202, as shown in further detail with respect to FIGS. 14-16.

Figures 13, 14:
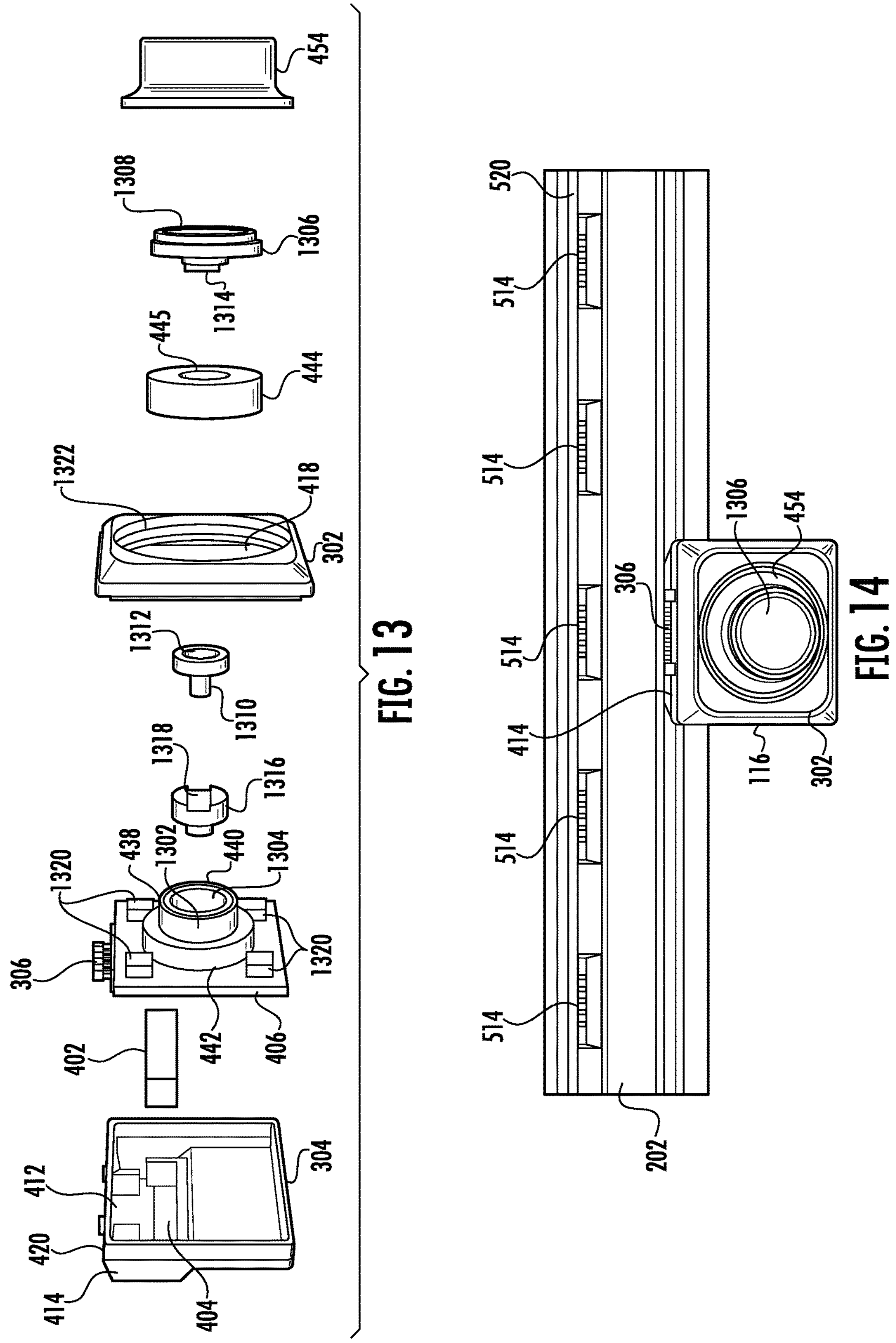
FIG. 13 illustrates an example exploded view of the modular programmable widget shown in FIG. 8B having a configurable dial.
FIG. 14 illustrates an example front view of the dock for receiving the modular programmable widgets.

FIG. 13 illustrates an example exploded view of the modular programmable widget 116 shown in FIG. 10B having a configurable dial 312. As mentioned above, the modular programmable widget 116 includes the front housing 302 and back housing 304. The back housing 304 of the modular programmable widget 116 may define a generally flat vertical surface of the rear of the modular programmable widget 116. An attachment body 414 may form a frustrum or other shape extending rearwards from the back housing 304. In an example, the attachment body 414 may extend rearwards from the top of the vertical rear wall of the back housing 304, then tapering towards the lower portion of the rear face of the back housing 304.

The modular programmable widget 116 further includes an internal magnet 402 configured to retain the modular programmable widget 116 in position. In an example, the inside rear wall of the back housing 304 defines a magnet recess 404 lengthwise across the rear wall, sized to receive the internal magnet 402 and hold the internal magnet 402 in position. As shown, the internal magnet 402 and magnet recess 404 are each of a generally rectangular shape.

The modular programmable widget 116 further includes a main circuit board 406 configured to physically hold the electronic components of the modular programmable widget 116. For example, the main circuit board 406 may hold the components responsible for data communication with the vehicle 102 and/or receiving power from the vehicle 102. The main circuit board 406 may also hold components supporting the specific functionality of the modular programmable widget 116. The main circuit board 406 may also define circuit traces and/or wires to electrically connect the electrical components to one another.

In one aspect, the main circuit board 406 may be physically and electrically connected to components to allow for the electrical connection of the modular programmable widget 116 to the dock 202. In an example, the top of the main circuit board 406 may hold the contact pads 306 configured to provide electrical connection to the dock 202. The contact pads 306 may slide into a contact slot 412 formed into the top of the attachment body 414 of the back housing 304.

As opposed to being defined by the front housing 302 as shown earlier, in the alternate packaging, the top face of the back housing 304 defines the locating groove 420 providing a concave surface along the length of its top face. Despite the different assembly, this locating groove 420 functions similarly, however to may aid in locating and locking the modular programmable widget 116 into the dock 202.

To support the functionality of the dial, the modular programmable widget 116 may also include a rotary encoder 438 mounted to the main circuit board 406. The rotary encoder 438 may be configured to convert rotational movement and/or speed of its encoder shaft 440 into an electrical signal, using various mechanical, optical, and/or magnetic techniques.

The front housing 302 may define a front window 418 defining a location for mounting of the controls of the modular programmable widget 116. In the example shown in FIG. 11, the modular programmable widget 116 is a configurable dial 312, and the front window 418 is sized to the diameter of assembled rotary encoder 438. The encoder shaft 440 may be configured to be inserted outwards through the front window 418 of the front housing 302.

A switch 1302 may be mounted onto the main circuit board 406 (better seen in FIG. 16) within a cylindrical aperture 3312 defined by the rotary encoder 438. The switch 1302 may have a front-facing button mounted to the main circuit board 406 that, when pressed, activates the switch 1302 and that when unpressed or released, deactivates the switch 1302.

A signifier cap 1306 may define a front center surface of the rotary encoder 438 and may be pressed by the user to activate the switch 1302. The signifier cap 1306 may define a generally flat, circular shape, having a customizable front face 1308. The customizable front face 1308 may include various content, such as an icon indicating a function to performed by pressing the signifier cap 1306.

To allow the signifier cap 1306 to reach the switch 1302, a switch stem 1310 may be configured to transfer pressure provided by a user to the signifier cap 1306 onto the switch 1302 mounted within the rotary encoder 438. The switch stem 1310 may define an elongate body with an inner end aimed towards the button to selectively transfer force onto the button. The outer end of the switch stem 1310 may define a stem receptacle 1312 for receiving a corresponding pin 1314 extending towards the switch stem 1310 from the inner face of the signifier cap 1306 opposite the customizable front face 1308. In one non-limiting example, the stem receptacle 1312 and pin 1314 may be of a triangular cross-sectional shape.

A switch guide 1316 may be installed within the aperture 3312, to limit the switch stem 1310 to linear motion towards or away from the switch 1302. The switch guide 1316 may be defined by a circular outer surface sized to allow for insertion into the aperture 3312 as well as a guide aperture 1318 open to receive the elongate body of the switch stem 1310. The switch guide 1316 may remain stationary, while the aperture 3312 may slide inwards responsive to the user pressing the signifier cap 1306. In an example, the switch stem 1310 and the guide aperture 1318 may each define a generally square cross-section sized to allow the switch stem 1310 to move linearly in and out, but not rotate or otherwise move. Thus, when the signifier cap 1306 is pressed, the signifier cap 1306 pushes the switch stem 1310 inwards, activating the switch 1302.

An encoder bearing 444 may be pressed onto the encoder shaft 440 protruding from the front window 418. The encoder bearing 444 may spin with the encoder shaft 440, although the signifier cap 1306 may not, allowing the signifier cap 1306 to preserve its upright orientation.

A rotary dial 454 (sometime referred to as a rotary cap) may be sized to receive the encoder bearing 444 and signifier cap 1306 and to provide a surface for manipulation of the rotary encoder 438 by a user. The rotary dial 454 may be snapped onto the exterior of the encoder bearing 444. The rotary dial 454 may be rotatable by the user to allow for rotation of the rotary encoder 438 and may also serve as a bezel surrounding and protecting the rotary encoder 438 components.

The modular programmable widget 116 may also include lighting features. For example, the main circuit board 406 may include one or more light modules 1320. These light modules 1320 may be LEDs, in an example, that may be configured to display different colors and/or intensities of light. The front housing 302 may include a light ring 1322 around the front window 418 to act as a light guide to direct the light from the light modules 1320 for providing illumination around the perimeter of the front window 418.

FIG. 14 illustrates an example front view of the dock 202 for receiving the modular programmable widgets 116. A modular programmable widget 116 having a design as shown in FIG. 13 shown along with the dock 202. To facilitate the attachment, the contact pad 306 exposed by the attachment body 414 is aligned with the middle dock connector 514 of the dock 202.

FIG. 15A illustrates perspective and side views of a first operation in the attachment of an example alternate design modular programmable widget 116 to the dock 202. As shown, the first operation includes moving the modular programmable widget 116 towards the dock 202, such that the locating groove 420 of the modular programmable widget 116 is aligned with the protrusion 520 of the dock 202.

FIG. 15B illustrates perspective and side views of a second operation in the attachment of an example alternate design modular programmable widget 116 to the dock 202. As shown, the second operation includes, once the locating groove 420 is mated to the protrusion 520, pivoting the modular programmable widget 116 around the protrusion 520 such that the attachment body 414 of the modular programmable widget 116 moved into the securing channel 512. In doing so, the contact pad 306 of the modular programmable widget 116 moves towards electrical contact with the dock connector 514 of the dock 202.

FIG. 15C illustrates perspective and side views of a completed attachment of an example alternate design modular programmable widget 116 to the dock 202. Once installed, the attachment body 414 is mated into the inner surface of the securing channel 512, and the contact pad 306 of the modular programmable widget 116 is in electrical contact with the dock connector 514 of the dock 202. Also, the internal magnet 402 of the modular programmable widget 116 is attracted to a ferrous metal strip 508 within the dock 202, providing force to keep the modular programmable widget 116 in place within the dock 202.

Figure 16:
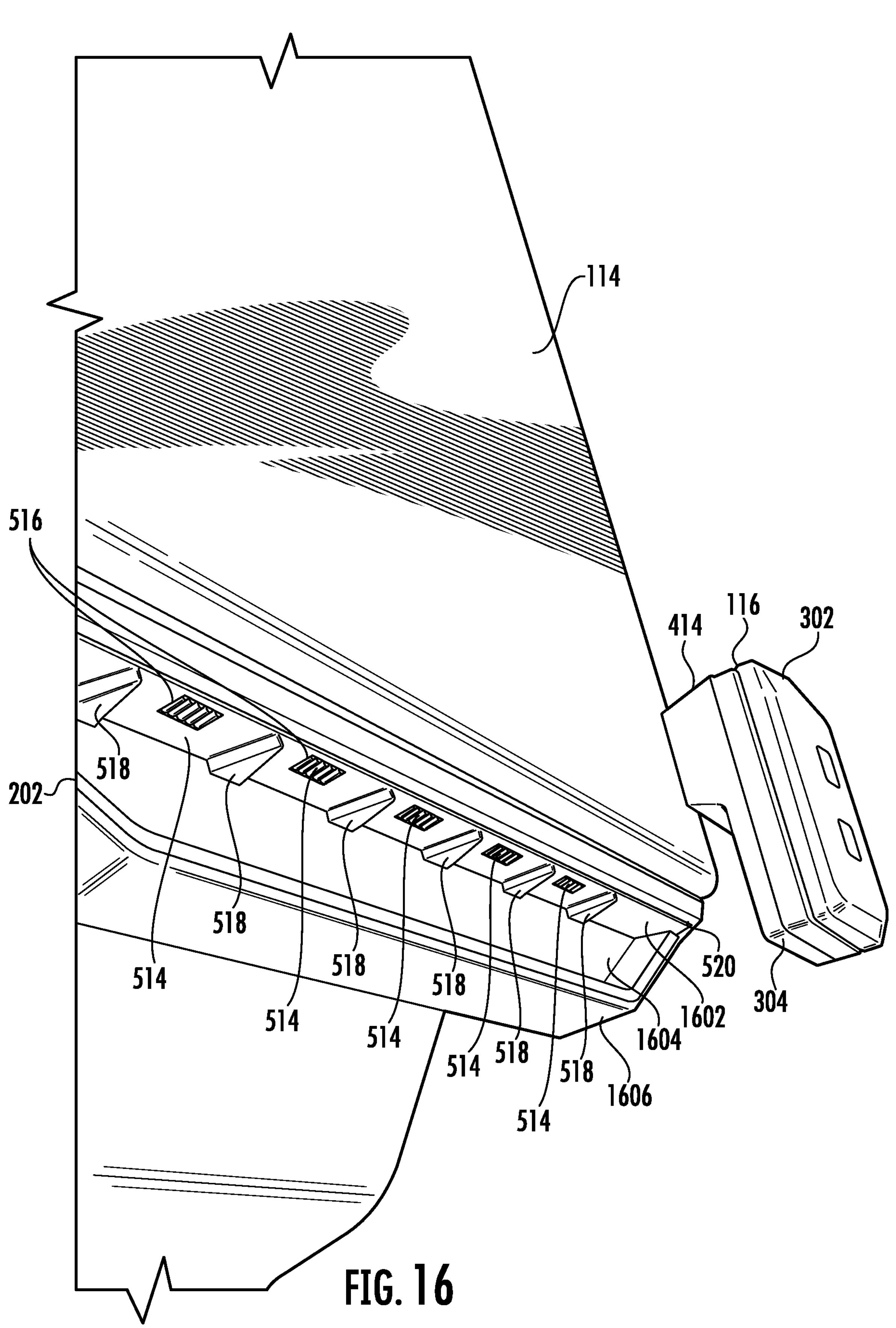
FIG. 16 illustrates a perspective view of the dock integrated below a configurable display of the vehicle for attachment of the modular programmable widgets.

FIG. 16 illustrates a perspective view of the dock 202A integrated below a configurable display 114 of the vehicle 102 for attachment of the modular programmable widgets 116. In this example, the securing channel 512 of the dock 202 is collectively defined by a housing surface 1602 of the configurable display 114, a rear surface 1604 extending downwards from the housing surface 1602 spaced away from the front of the configurable display 114, and a lower dock housing 1606 completing the lower portion of the securing channel 512. The dock connectors 514 may accordingly be exposed through contact apertures 516 defined by housing surface 1602.

The housing surface 1602 may further define locators 518 spaced on either side of each of the contact apertures 516. These locators 518 may extend downwards into the securing channel 512 from the housing surface 1602, on either side of each of the dock connectors 514. These locators 518 may serve to aid in the placement of the modular programmable widgets 116 in positions where the contact pad 306 of the modular programmable widget 116 is aligned with the dock connector 514. As shown, the locators 518 define a triangular shape that widens into the depth of the securing channel 512. This triangular shape may conform to the tapering of the frustrum shape of the attachment body 414, serving to guide the modular programmable widget 116 into position when inserted (such as shown in FIGS. 15A-15C).

Thus, despite the differences in controls and size of the modular programmable widgets 116, the modular programmable widgets 116 each define the same connection components. For instance, each of the modular programmable widgets 116 has the same electrical contact pads 306 and locating groove 420 as discussed above. Thus, any of the modular programmable widgets 116 may be connected to the dock 202, allowing for a user to choose whichever modular programmable widget 116 has the desired controls and/or appearance.

Figure 17:
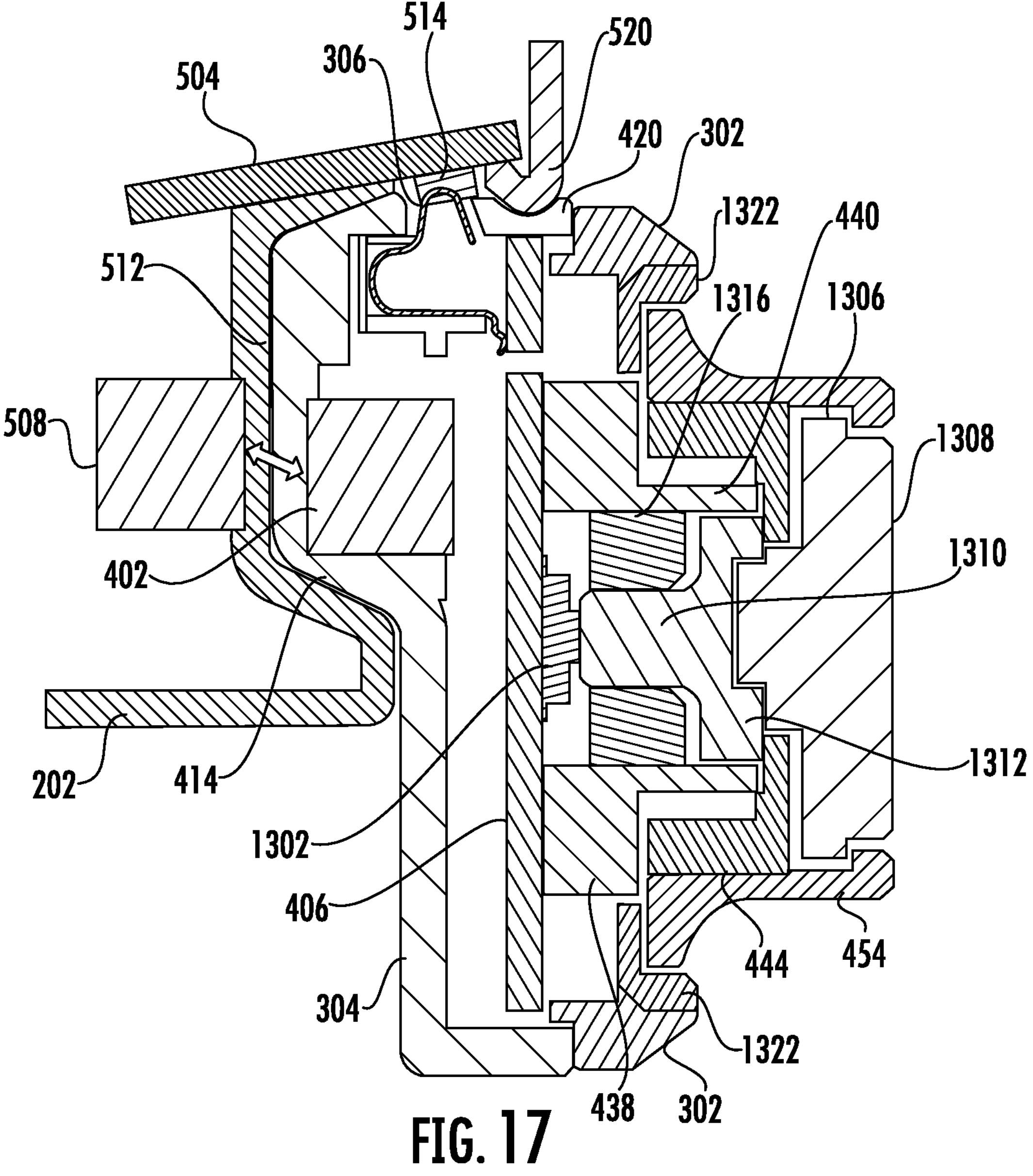
FIG. 17 illustrates a side cutaway view of the modular programmable widget shown in FIGS. 8B and 12-13, in assembled form and attached to the dock.

FIG. 17 illustrates a side cutaway view of the modular programmable widget 116 shown in FIGS. 8B and 12-13, in assembled form and attached to the dock 202. As shown, the components of the dock 202 and modular programmable widgets 116 includes aspects to facilitate their selective mechanical and electrical connection.

FIGS. 18-20 collectively illustrate further aspects of the customizable front face 1308 of the signifier cap 1306. Referring to FIG. 18, the figure illustrates the removal of the rotary dial 454 from an assembled modular programmable widget 116 to allow for changing out of the signifier cap 1306. As shown, the rotary dial 454 has been slid off the encoder bearing 444, allowing the signifier cap 1306 to be pulled off of the stem receptacle 1312.

FIG. 19 illustrates a selection of different signifier caps 1306, each having a different customizable front face 1308. For instance, the signifier cap 1306A has a customizable front face 1308A having an icon representation of a function (here a fan). The signifier cap 1306B has a customizable front face 1308B of a customized color. The signifier cap 1306C has a customizable front face 1308C of a customized material or texture. These signifier caps 1306 may be freely changeable by the user, allowing for customization of the look of the modular programmable widgets 116.

FIG. 20 illustrates an example selection of different signifier caps 1306 installed to various modular programmable widgets 116. As shown, the different signifier caps 1306 expose different customizable front faces 1308.

Figure 21A:
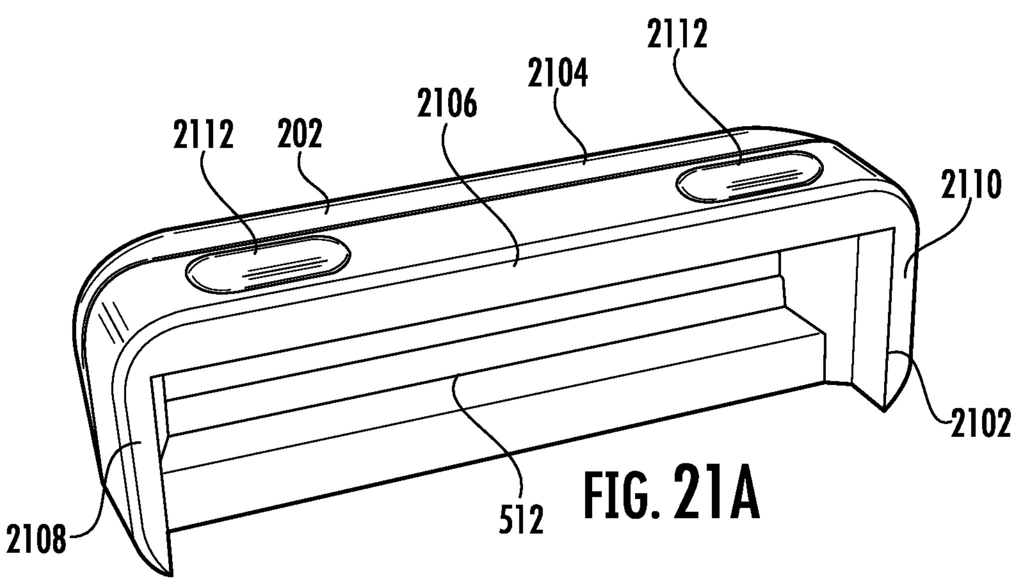
FIG. 21A illustrates a front perspective view of an empty mobile dock without attachment of any modular programmable widgets.
Figure 21B:
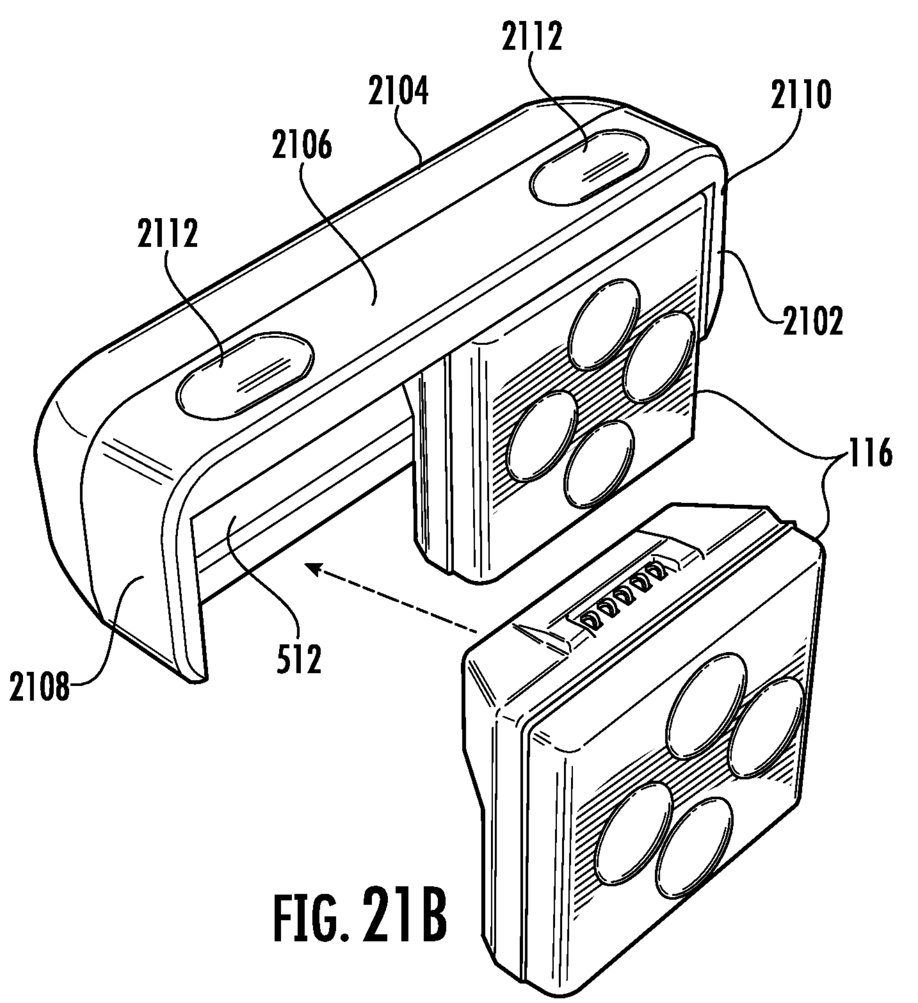
FIG. 21B illustrates a front perspective view of the mobile dock in the process of attachment of modular programmable widgets.
Figure 21C:
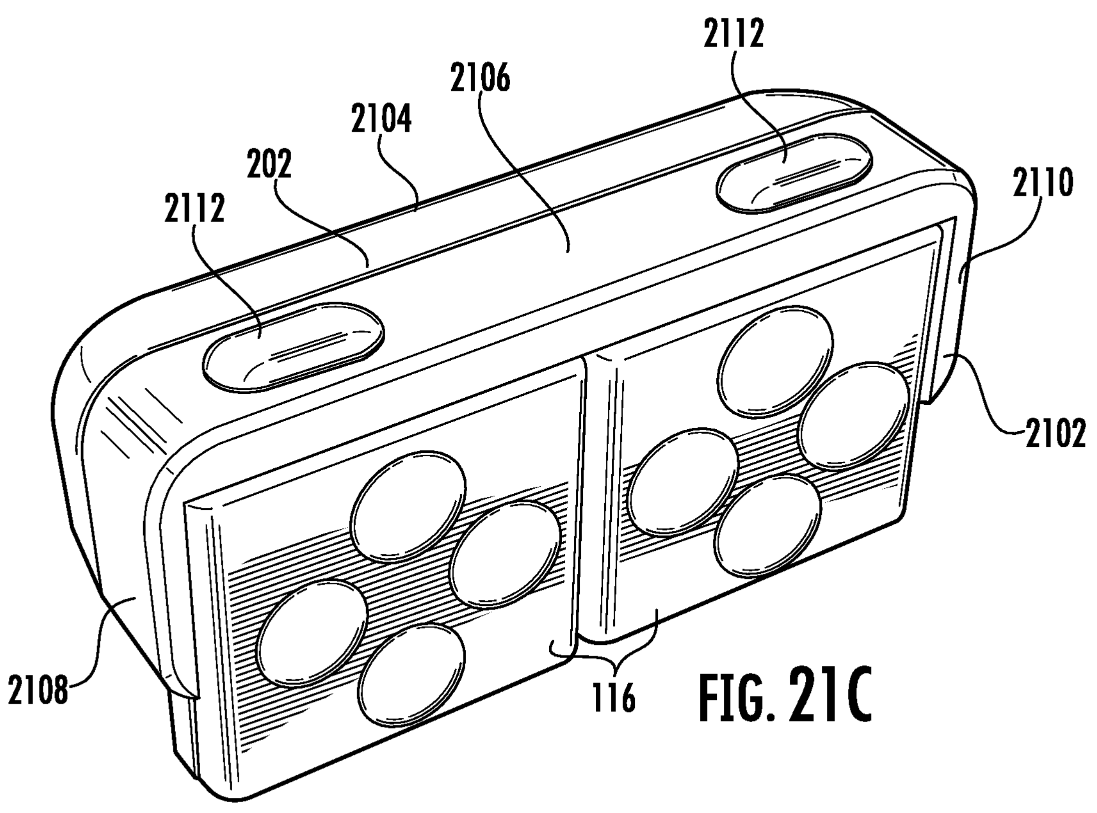
FIG. 21C illustrates a front perspective view of the mobile dock having modular programmable widgets attached.
Figure 21D:
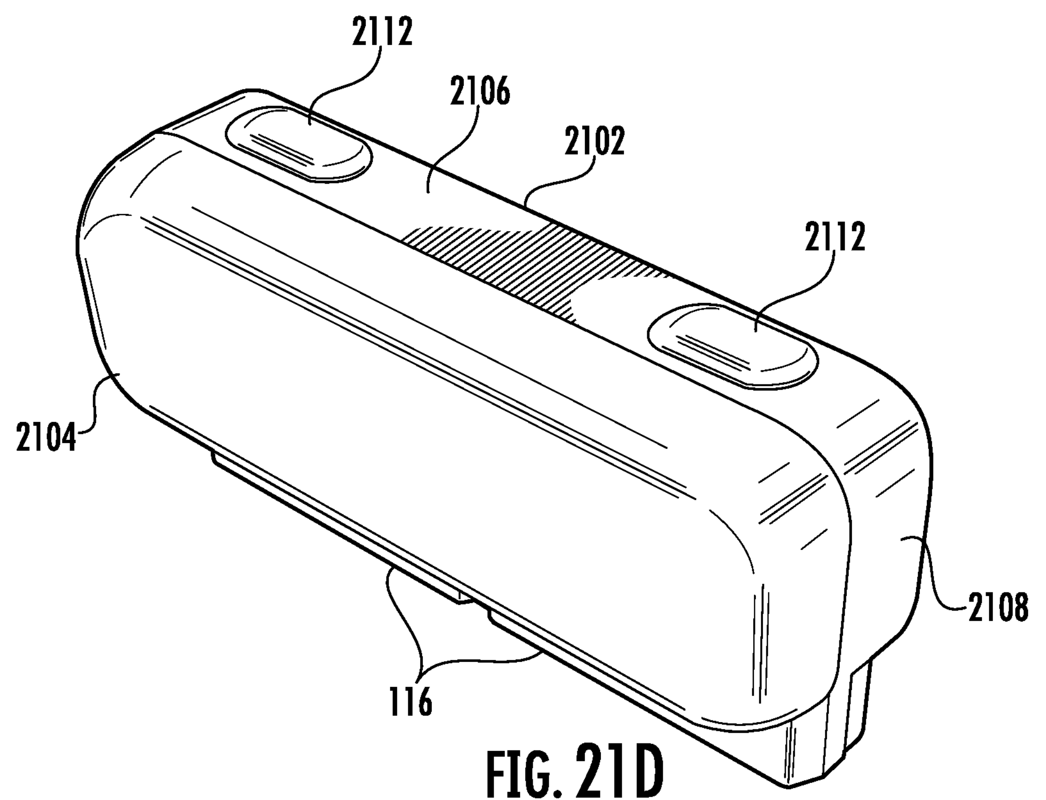
FIG. 21D illustrates a rear perspective view of the mobile dock having modular programmable widgets attached.

FIGS. 21A-21D collectively illustrates aspects of a mobile dock 202. FIG. 21A illustrates a front perspective view of an empty mobile dock 202 without attachment of any modular programmable widgets 116. FIG. 21B illustrates a front perspective view of the mobile dock 202 in the process of attachment of modular programmable widgets 116. FIG. 21C illustrates a front perspective view of the mobile dock 202 having modular programmable widgets 116 attached. FIG. 21D illustrates a rear perspective view of the mobile dock 202 having modular programmable widgets 116 attached.

In general, the mobile dock 202 may be configured to receive modular programmable widgets 116, using a mating geometry of the attachment body 414 with the securing channel 512 and the internal magnets 402, consistent with attachment of the modular programmable widgets 116 to the in-vehicle docks 202. The mobile dock 202 may include wireless communications functionality (e.g., BLUETOOTH), and an internal battery, which may allow the mobile dock 202 to be used for remote control and/or game controller use cases with the vehicle 102 (or with other wireless devices such as smartphones, tablets, video game consoles, etc.). For instance, mobile dock 202 may sync with the configurable display 114 of the vehicle 102 for gaming and entertainment (although the main display may be restricted unless the vehicle 102 is in Park).

The mobile dock 202 may comprise a front housing 2102 and a rear housing 2104. The front housing 2102 and rear housing 2104 may collectively define an enclosure of a size suitable for hand-held operation. The enclosure may have rounded corners and/or faces to allow for comfortable holding in the user's hands. As shown, the length of the dock 202 allows for a quantity of modular programmable widgets 116 to be received. The illustrated dock 202 has length for receiving two modular programmable widgets 116 but docks 202 of different sizes may allow for the insertion of more or fewer modular programmable widgets 116.

The front housing 2102 may define a top wall 2106, opposing side walls 2108, 2110. With the area enclosed by the inner faces of the walls 2106, 2108, and 2110, the front housing 2102 may define the securing channel 512 for attachment of the modular programmable widgets 116.

Consistent with the other docks 202, the locating groove 420 may be sized to conform with the profile of the attachment body 414 of the rear of the modular programmable widgets 116. The mobile dock 202 may include dock connectors 514 in the locating groove 420 configured for receiving the contact pads 306 of the modular programmable widgets 116, sized to fit within contact apertures 516 in the upper face of the locating groove 420. The securing channel 512 may also define locators 518 extending downwards into the securing channel 512, on either side of each of the dock connectors 514, again to aid in the placement of the modular programmable widgets 116 in positions where the contact pad 306 of the modular programmable widget 116 is aligned with the dock connector 514. The upper end of the securing channel 512 may define a protrusion 520 matching the profile of the concave locating groove 420 in the top of the front housing 302 of the modular programmable widget 116. Additionally, a ferrous metal strip 508 may be mounted within the mobile dock 202, below the securing channel 512, and may be attracted to by the internal magnets 402 of the modular programmable widget 116 to secure the modular programmable widget 116 into place.

As the mobile dock 202 is portable and not connected to the vehicle 102, the exterior faces of the front housing 2102 and/or rear housing 2104 may be able to provide fixed controls, independent of the removable controls of the modular programmable widgets 116. As shown, the top of the front housing 2102 defines two control buttons 2112 which may always be available, regardless of whether modular programmable widgets 116 are installed to the mobile dock 202.

Figure 22:
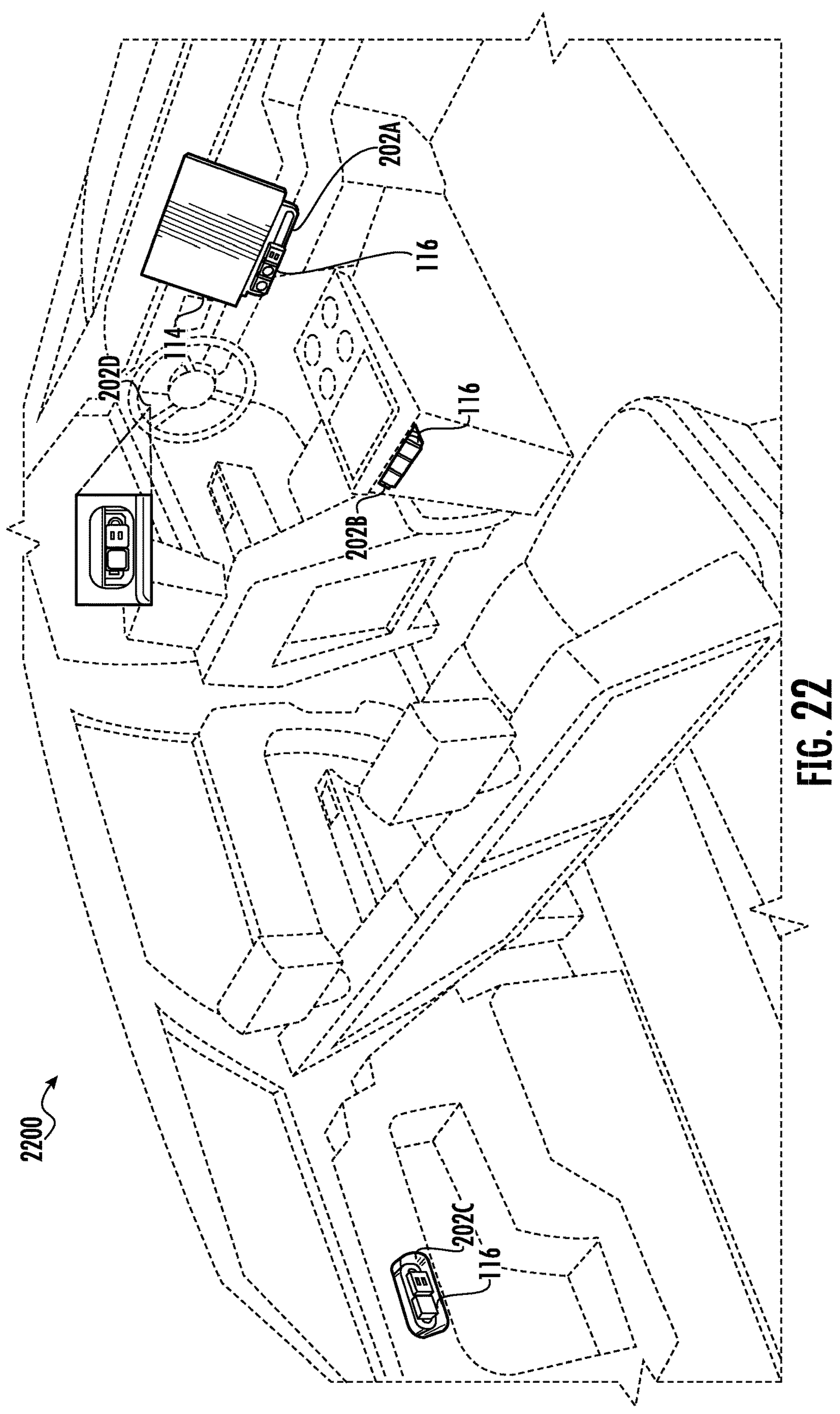
FIG. 22 illustrates an example cutaway view of a vehicle interior supporting the modular programmable widgets having another alternative alternate packaging design.

FIG. 22 illustrates an example cutaway view of a vehicle interior 200 supporting the modular programmable widgets 116 having another alternative alternate packaging design. Similar to as shown before, one or more first modular programmable widgets 116 may be attached to a dock 202A of the center stack configurable display 114. This location under the center stack configurable display 114 may be easily accessible for driver and passenger. Also shown, one or more second modular programmable widgets 116 may be attached to a console bin dock 202B. Here, the second modular programmable widget 116 is attached to the console bin dock 202B for access by rear passengers. As further shown, one or more third modular programmable widgets 116 may be attached to a cargo dock 202C in the rear cargo area. Also shown, in this variation one or more fourth modular programmable widgets 116 may be attached to a gauge cluster dock 202D in the front dash area adjacent the steering wheel. It should also be noted that the illustrated vehicle interior 200 is an example, and interiors having more, fewer, or differently located components may be used.

FIGS. 23A-23F illustrate example modular programmable widgets 116 in the second alternative packaging. Referring collectively to FIGS. 23A-23F, an enclosure having a generally rectangular prism shape may be defined by a front housing 302 and a back housing 304. The front housing 302 may define a generally flat front surface of the modular programmable widget 116, while the back housing 304 may define the remainder of the enclosure, including the rear, side, and top walls that house the internal circuitry and other components of the modular programmable widget 116. Controls may be provided on the front housing 302, while connectivity to the vehicle 102 may be provided via a magnetic contact pad 306 exposed through the top of the back housing 304. The magnetic contact pad 306 may allow for transmission of data and power between the modular programmable widgets 116 and the dock 202. In this example, the contact pad 306 may be a magnetic universal serial bus (USB) jack.

The front housing 302 may expose various controls that may provide interaction with the user. In the example of FIG. 23A, this may include a configurable button 308. While not shown in FIG. 10A, in some examples the configurable button 308 may include a display 310. FIG. 23B illustrates an example modular programmable widget 116 having a configurable dial 312. FIG. 10C illustrates an example modular programmable widget 116 having additive power/data ports 314. As shown, the modular programmable widgets 116 in FIG. 23C provides two USB power/data ports 314, but this is merely an example, and different quantities and types of connectors may be exposed by the modular programmable widgets 116. FIG. 23D illustrates an example modular programmable widget 116 having a display 310. As shown in this example, the modular programmable widget 116 provides a flat display 310 on the front surface of the modular programmable widget 116. FIG. 23E illustrates an example modular programmable widget 116 having a companion 352. FIG. 23F illustrates an example perspective view of a modular programmable widget 116 having a configurable dial 312 with configurable display 114.

Similar to as noted previously, the modular programmable widgets 116 shown in FIGS. 23A-23F share the same exterior dimensions. This standard size allows for easy addition and removal of the modular programmable widgets 116 from the docks 202. In other cases, however, the modular programmable widgets 116 may include modular programmable widgets 116 of a larger physical size. Such modular programmable widgets 116 may be able to include more controls as compared to the default size of the modular programmable widgets 116.

FIG. 23G illustrates an example modular programmable widget 116 that is multiple times the length of a standard modular programmable widget 116 as shown in FIGS. 23A-23F. In this example, the modular programmable widget 116 is three times the length of the standard modular programmable widgets 116. Due to the increased length, the modular programmable widget 116 in FIG. 23G is able to provide multiple configurable dials 312 (here three) spaced apart along the front housing 302, with two additive power/data ports 314 arranged in the spaces between the configurable dials 312. In an example, the configurable dials 312 of this modular programmable widget 116 may provide a set of predefined second row bundle of controls, such as volume, temperature, and fan speed controls. For example, the main circuit board 406 of the modular programmable widget 116 may be preprogrammed to control those aspects by communication with the widget controller 112 when the modular programmable widget 116 is electrically connected to the dock 202.

It should also be noted that, as this example modular programmable widget 116 mechanically and electrically connects via magnetic USB, the modular programmable widget 116 includes multiple contact pads 306 for connection to the dock 202 (e.g., three in this example). This use of multiple magnetic connections may allow for better securing of the modular programmable widget 116 to the dock 202.

Figure 24:
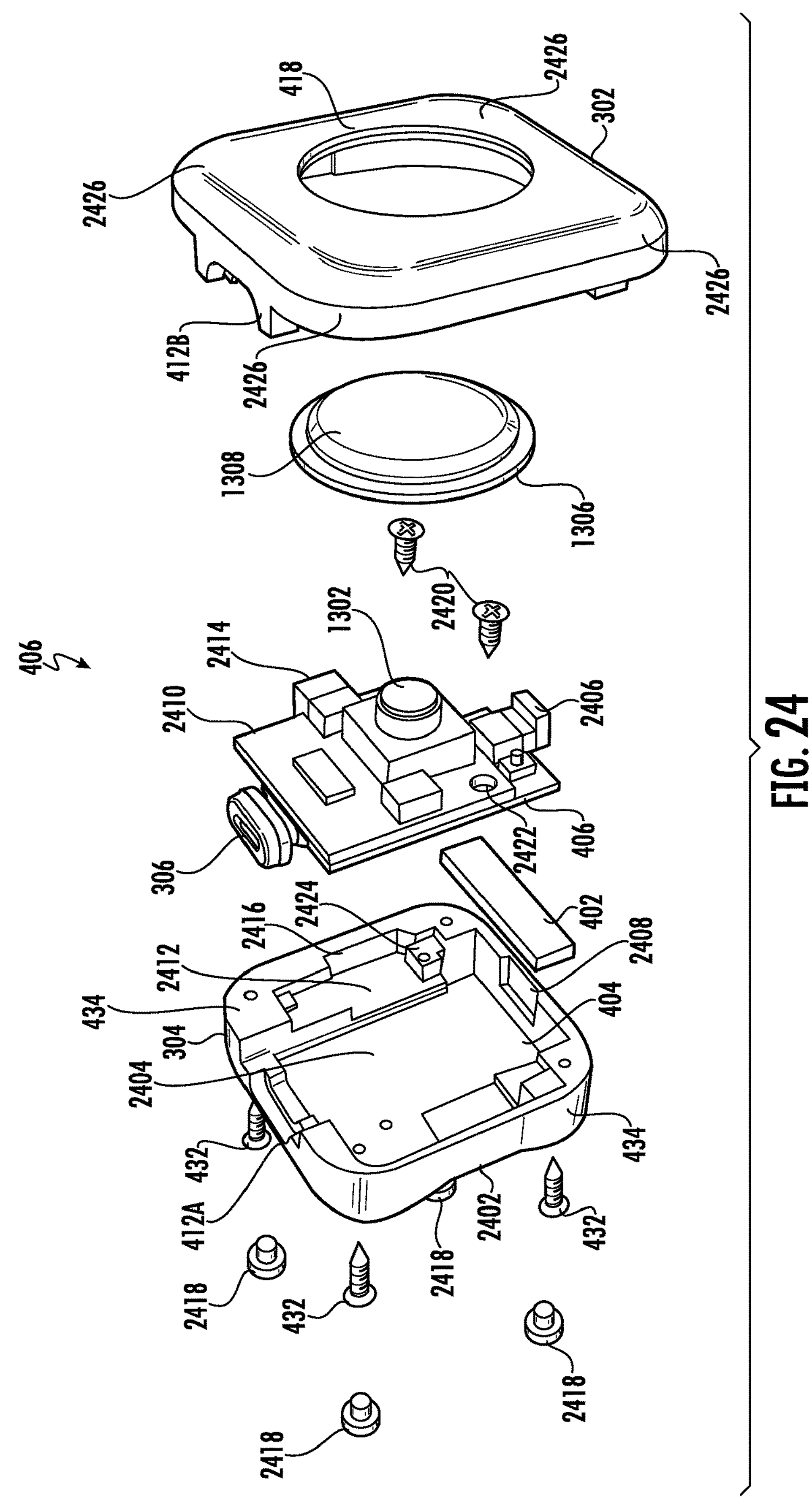
FIG. 24 illustrates an example exploded view of the modular programmable widget shown in FIG. 23A having a configurable button.

FIG. 24 illustrates an example exploded view of the modular programmable widget 116 shown in FIG. 23A having a configurable button 308. Similar to as mentioned above, these modular programmable widgets 116 includes the front housing 302 and back housing 304. The back housing 304 of the modular programmable widget 116 may define a generally flat vertical surface of the rear of the modular programmable widget 116. Here, instead of an attachment body 414, the back housing 304 instead defines a horizontal channel 2402 extending along the length of the back housing 304. As shown, the horizontal channel 2402 is placed along the middle of the back housing 304.

The modular programmable widget 116 further includes an internal magnet 402 configured to retain the modular programmable widget 116 in position. In an example, the inside rear wall of the back housing 304 defines a magnet recess 404 lengthwise across the rear wall, sized to receive the internal magnet 402 and hold the internal magnet 402 in position. As shown, the internal magnet 402 and magnet recess 404 are each of a generally rectangular shape.

The modular programmable widget 116 further includes a main circuit board 406 configured to physically hold the electronic components of the modular programmable widget 116. For example, the main circuit board 406 may hold the components responsible for data communication with the vehicle 102 and/or receiving power from the vehicle 102. The main circuit board 406 may also hold components supporting the specific functionality of the modular programmable widget 116. The main circuit board 406 may also define circuit traces and/or wires to electrically connect the electrical components to one another.

In one aspect, the main circuit board 406 may be physically and electrically connected to components to allow for the electrical connection of the modular programmable widget 116 to the dock 202. In an example, the top of the main circuit board 406 may hold the contact pad 306 configured to provide electrical connection to the dock 202. In this illustrated example, the contact pad 306 is a magnetic USB jack. The magnetic USB jack may have a rounded rectangular profile, and as shown is mounted lengthwise along the top of the modular programmable widget 116.

The contact pad 306 may slide into a contact slot 412 formed into the top of the attachment body 414 of the back housing 304. In this example, the contact slot 412 may be formed in two portions-a rear contact slot portion 412A defined by the upper face of the back housing 304 and conforming to the contour of a rear portion of the magnetic USB jack, and a front contact slot portion 412B defined by the upper face of the front housing 302 and conforming to the contour of a front portion of the magnetic USB jack. Collectively, the rear contact slot portion 412A and the front contact slot portion 412B may serve to hold the contact pad 306 in place when the modular programmable widget 116 is assembled.

The back housing 304 may define a main board cavity 2404 sized to receive the main circuit board 406 of the modular programmable widget 116. To ease placement of the main circuit board 406, the main circuit board 406 may hold a board locator 2406 extending from the main circuit board 406 and configured to be received into a corresponding indent 2408 in the back housing 304. Once located, the main circuit board 406 may be inserted into the main board cavity 2404.

The main circuit board 406 may contain the components in common to the different modular programmable widgets 116, such as the components supporting connectivity with the vehicle 102. The modular programmable widget 116 may further include a sister board 2410 configured to hold the controls that are specific to the type of the modular programmable widgets 116 and that may be exposed through the front of the modular programmable widget 116.

The back housing 304 may further define a sister board cavity 2412 sized to receive the sister board 2410. To ease placement of the sister board cavity 2412, the sister board cavity 2412 may similarly hold a board locator 2414 extending from the sister board cavity 2412 and configured to be received into a corresponding indent 2416 in the back housing 304. By use of the board locators 2406, 2414, the main circuit board 406 and the sister board 2410 may be secured in place in a spaced apart relationship. One or more fasteners 2420 (such as screws or rivets) placed through attachment through holes 2422 in the sister board 2410 and secured into connectors 2424 in the front side of the back housing 304.

A switch 1302 may be mounted onto the front side of the sister board 2410. The switch 1302 may have a front-facing button that, when pressed, activates the switch 1302 and that when unpressed or released, deactivates the switch 1302.

A signifier cap 1306 may define a front center surface of the rotary encoder 438 and may be pressed by the user to activate the switch 1302. The signifier cap 1306 may define a generally flat, circular shape, having a customizable front face 1308. The customizable front face 1308 may include various content, such as an icon indicating a function to performed by pressing the signifier cap 1306.

The front housing 302 may define a front window 418 defining a location for mounting of the controls of the modular programmable widget 116. In the example, the modular programmable widget 116 is a configurable button 308, and the front window 418 is a sized to receive the signifier cap 1306 of the configurable button 308. For instance, the signifier cap 1306 may define a flange extending radially outwards from the customizable front face 1308, such that the customizable front face 1308 is visible through the front window 418 but the flange of the signifier cap 1306 is retained behind the front window 418.

To facilitate assembly of the modular programmable widget 116, one or more fasteners 432, such as screws or pins, may be used to hold the back housing 304 and front housing 302 together. In an example, through holes 2422 may be formed through the back of the back housing 304 which may be aligned with apertures 2426 (e.g., threaded holes, not shown) into the rear face of the front housing 302. It should be noted that other approaches to assembling the modular programmable widgets 116 may be used in other examples, such as snap fit connectors and/or glue. Dampening feet 2428 may be applied to the fasteners 432 (e.g., that fit into the screw heads of the fasteners 432). The dampening feet 2428 may be a rubber material may serve to maintain the modular programmable widgets 116 in place when installed to the dock 202.

Figure 25:
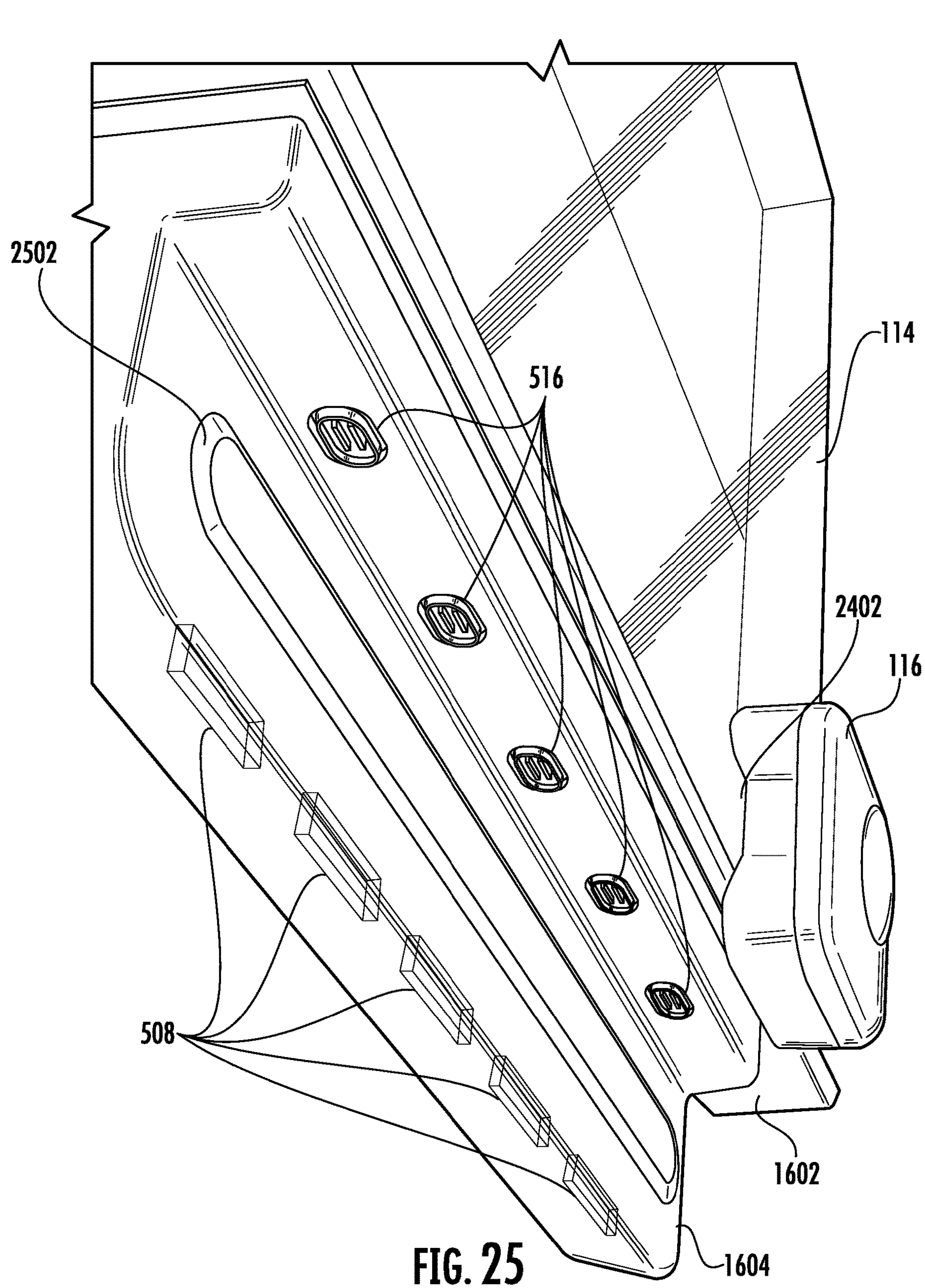
FIG. 25 illustrates a perspective view of the dock integrated below a configurable display of the vehicle for attachment of the modular programmable widgets.

FIG. 25 illustrates a perspective view of the dock 202A integrated below a configurable display 114 of the vehicle 102 for attachment of the modular programmable widgets 116. In this example, the dock 202 is collectively defined by a lower housing surface 1602 of the configurable display 114, and a rear surface 1604 extending downwards from the housing surface 1602 spaced away from the front of the configurable display 114. The dock connectors 514 may accordingly be exposed through contact apertures 516 defined through lower housing surface 1602.

The dock 202 may define additional features for the alignment and securing of the modular programmable widgets 116 to the dock 202. For instance, one or more dock magnets 2502 may be mounted behind the rear surface 1604, positioned to be attracted to the internal magnets 402 of the modular programmable widget 116 to secure the modular programmable widget 116 into place. The dock magnets 2502 may be placed in positions corresponding to the locations of the USB dock connectors 514, such that the modular programmable widgets 116 are attracted into the docking positions.

Additionally, a mounting bar 2504 may be provided along the length of the front of the rear surface 1604. This mounting bar 2504 may define a contour corresponding to contour of the horizontal channel 2402 and may serve to guide the modular programmable widget 116 to the proper height for connection of the magnetic USB contact pad 306 to the USB dock connector 514 in the docking position being used by the modular programmable widgets 116.

Figure 26A:
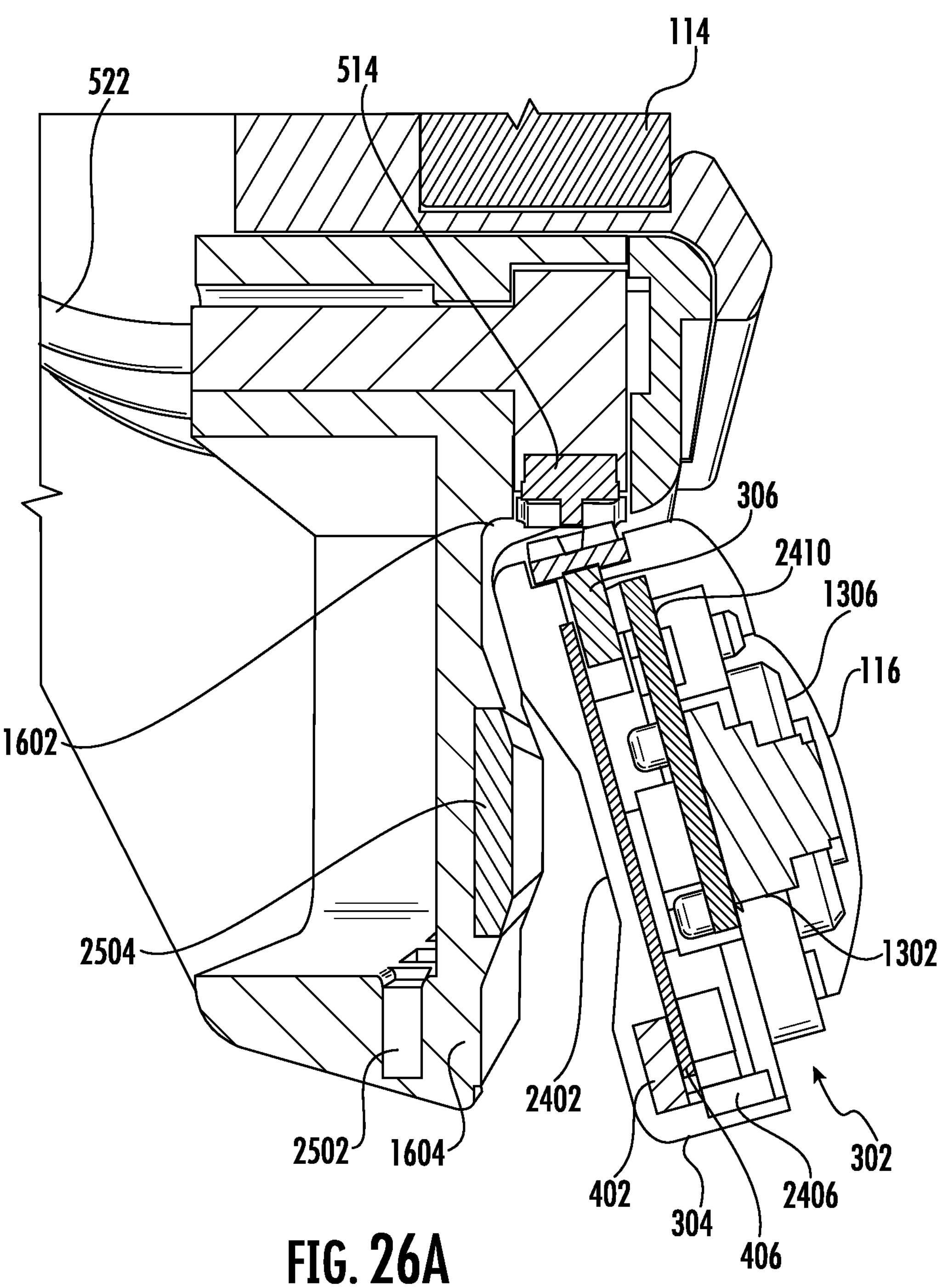
FIG. 26A illustrates a side view of an operation in the attachment of an example modular programmable widget to the dock.

FIG. 26A illustrates a side view of an operation in the attachment of an example modular programmable widget 116 to the dock 202. As shown, the operation includes moving the modular programmable widget 116 towards the dock 202, such that the horizontal channel 2402 of the modular programmable widget 116 is aligned with the mounting bar 2504 of the dock 202. Additionally, the magnetic USB contact pad 306 of the modular programmable widget 116 is aligned with one of the dock connectors 514.

Figure 26B:
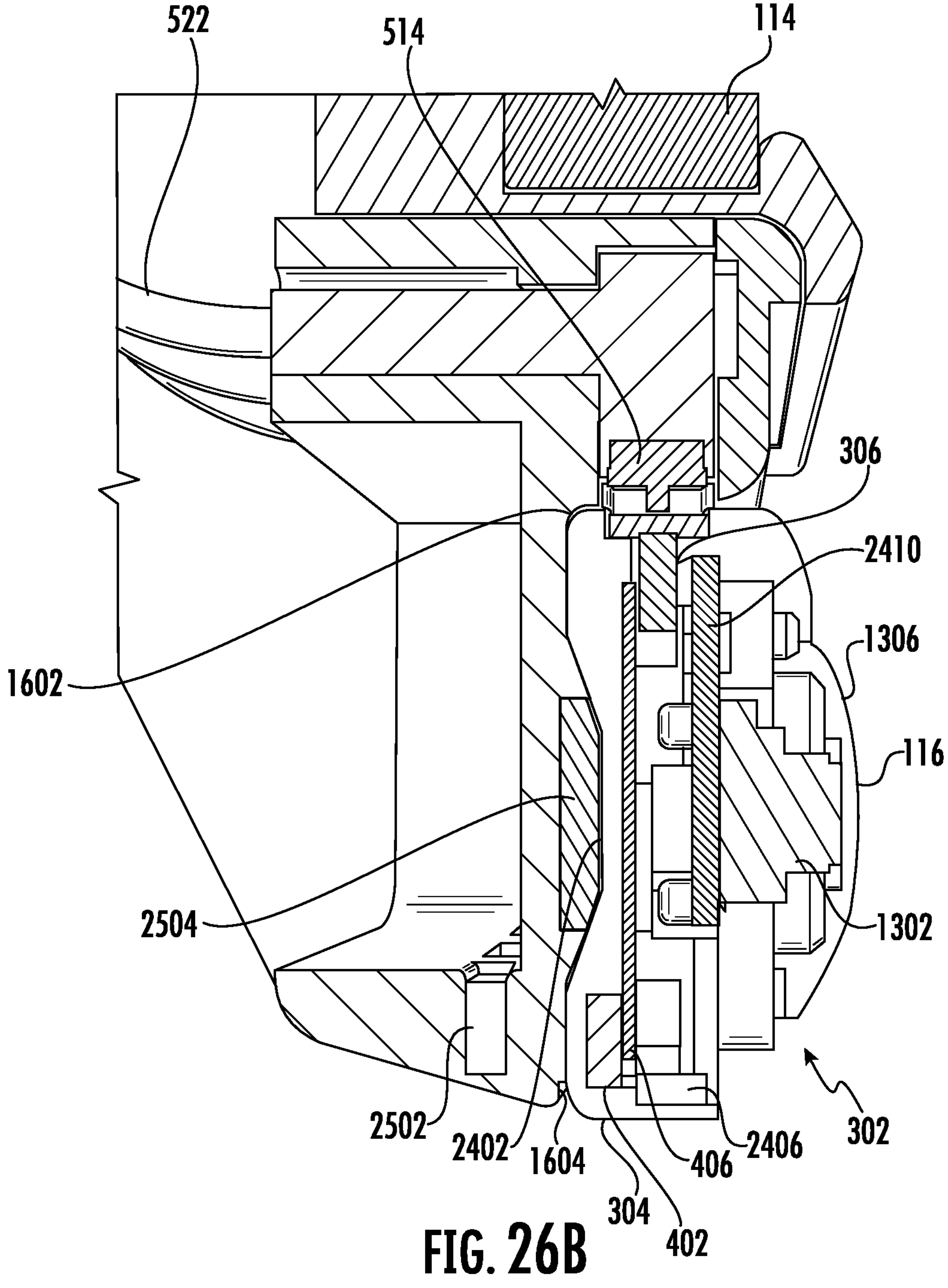
FIG. 26B illustrates a side view of a completed attachment of an example modular programmable widget to the dock.

FIG. 26B illustrates a side view of a completed attachment of an example modular programmable widget 116 to the dock 202. As shown, the horizontal channel 2402 is mated with the mounting bar 2504, and the contact pad 306 of the modular programmable widget 116 is in electrical and physical contact with the dock connector 514 of the dock 202. Also, the internal magnet 402 of the modular programmable widget 116 is attracted to a dock magnet 2502 within the dock 202, providing force to keep the modular programmable widget 116 in place within the dock 202.

Thus, despite the differences in controls and size of the modular programmable widgets 116, the modular programmable widgets 116 each define the same connection components. For instance, each of the modular programmable widgets 116 has the same electrical contact pads 306 and horizontal channel 2402 as discussed above. Thus, any of the modular programmable widgets 116 may be connected to the dock 202, allowing for a user to choose whichever modular programmable widget 116 has the desired controls and/or appearance.

Figure 27:
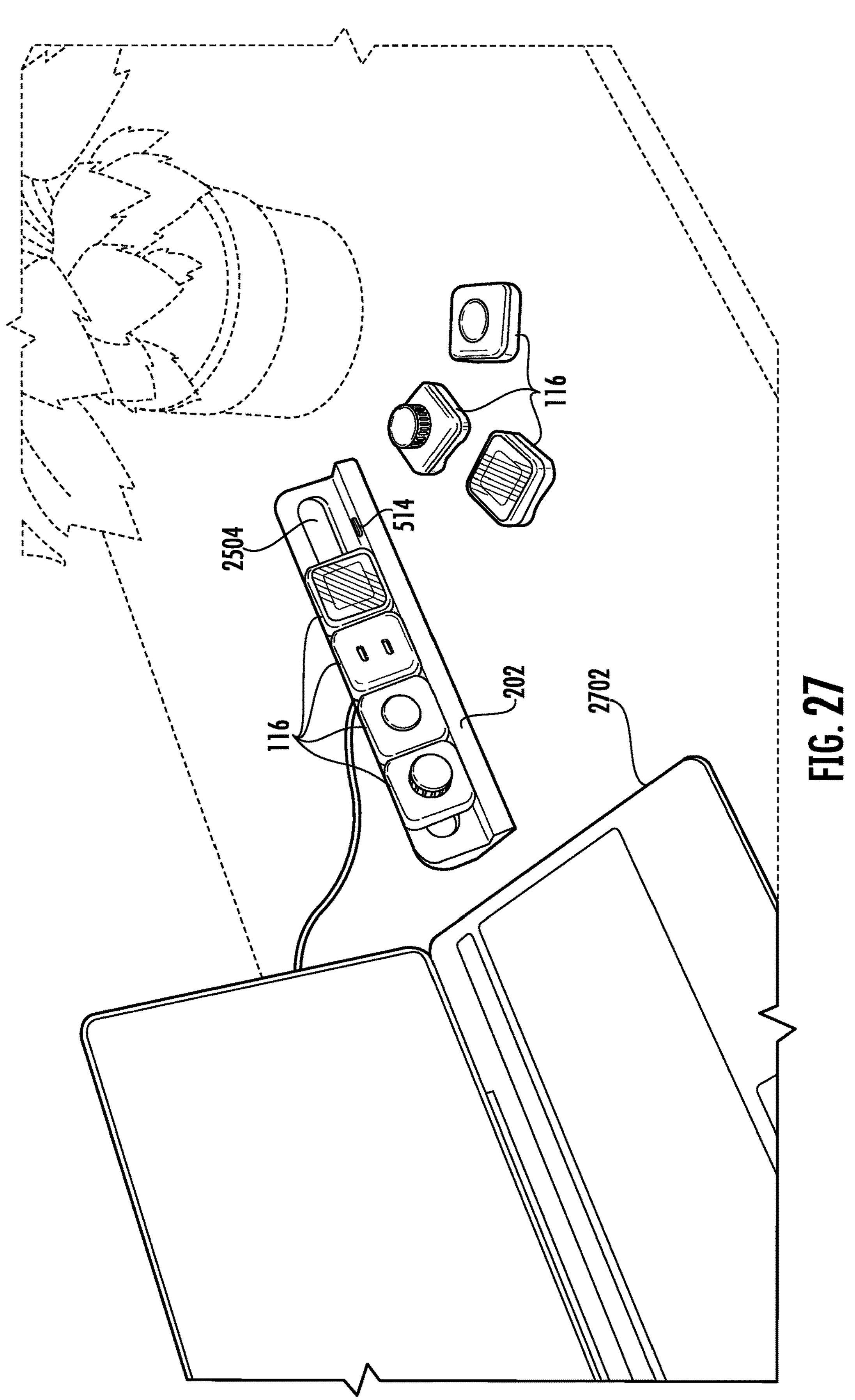
FIG. 27 illustrates an example of a home dock configured for receiving the modular programmable widgets.

FIG. 27 illustrates an example of a home dock 202 configured for receiving the modular programmable widgets 116. As shown, the home dock 202 may provide for connection of the modular programmable widgets 116 similar to the in-vehicle dock 202 discussed above with respect to FIGS. 25 and 26A-26B. The home dock 202 may similarly have dock magnets 2502, a mounting bar 2504, and dock connectors 514 for receiving the modular programmable widgets 116. Here it can be seen that the dock connectors 514 allow for attachment of the modular programmable widgets 116 with the contact pads 306 on the bottom as opposed to the top, but this is only an example and home docks 202 having different designs are possible.

In an example use case, the home dock 202 may allow the modular programmable widgets 116 to be used for controlling the vehicle 102 from outside the vehicle 102. For instance, the home dock 202 may include wireless connectivity configured to allow the home dock 202 to communicate with the vehicle 102, e.g., via the telematics control module 130 of the vehicle 102. This may allow the dock 202 to send commands to the widget controller 112 via the telematics control module 130, allowing the user to utilize the modular programmable widgets 116 to control the vehicle 102 as if the modular programmable widget 116 were connected to the in-vehicle dock 202.

In another example use case, the home dock 202 may allow the modular programmable widgets 116 to be used for controlling smart home features independent of the vehicle 102. In such an example, the home dock 202 may be connected to a computing device 2702, such as a laptop or other computer, and may be used as additional input devices to the computing device 2702. This may allow for the easy control of home features from the tactile user interface provided by the modular programmable widgets 116.

FIGS. 28A-F illustrates examples of various configurations of modular programmable widgets 116 for a dock 202 supporting five modular programmable widgets 116. These examples illustrate some possibilities of how the modular programmable widgets 116 can evolve with user need or desire. Moreover, it should be noted that the modular programmable widgets 116 may also offer partnership opportunities with third parties and personalization opportunities for the user of the vehicle 102.

Figure 28A:
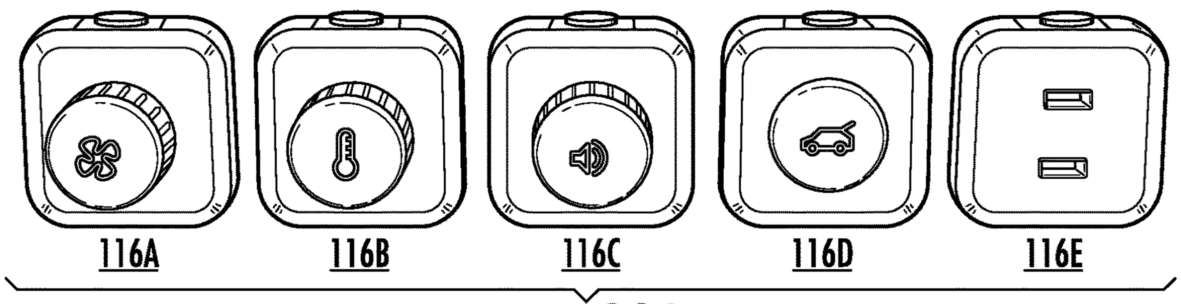
FIG. 28A illustrates an example of a first set of modular programmable widgets, in a common hardcoded, individual configuration.

FIG. 28A illustrates an example of a first set of modular programmable widgets 116, in a common hardcoded, individual configuration. In this example, the set includes five separate modular programmable widgets 116 having hardcoded functions. As shown, the modular programmable widgets 116 include a first modular programmable widget 116A in the form of a dial 312 for operating a fan function; a second modular programmable widget 116B in the form of a dial 312 for operating a temperature function; a third modular programmable widget 116C in the form of a dial 312 for operating a volume function; a fourth modular programmable widget 116D in the form of a button 308 for operating a lift gate function; and a fifth modular programmable widget 116E in the form of additive power/data ports 314.

Figure 28B:
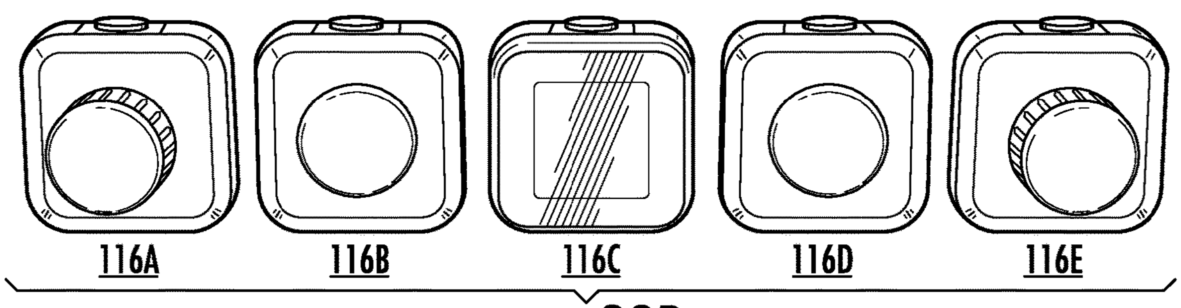
FIG. 28B illustrates an example of a second set of modular programmable widgets, in a configurable, individual configuration.

FIG. 28B illustrates an example of a second set of modular programmable widgets 116, in a configurable, individual configuration. In this example, the set includes five separate modular programmable widgets 116 having configurable functions. As shown, the modular programmable widgets 116 include a first modular programmable widget 116A in the form of a configurable dial 312; a second modular programmable widget 116B in the form of a configurable button 308; a third modular programmable widget 116C in the form of a configurable touch screen 316; a fourth modular programmable widget 116D in the form of a configurable button 308; and a fifth modular programmable widget 116E in the form of a configurable dial 312.

Figure 28C:
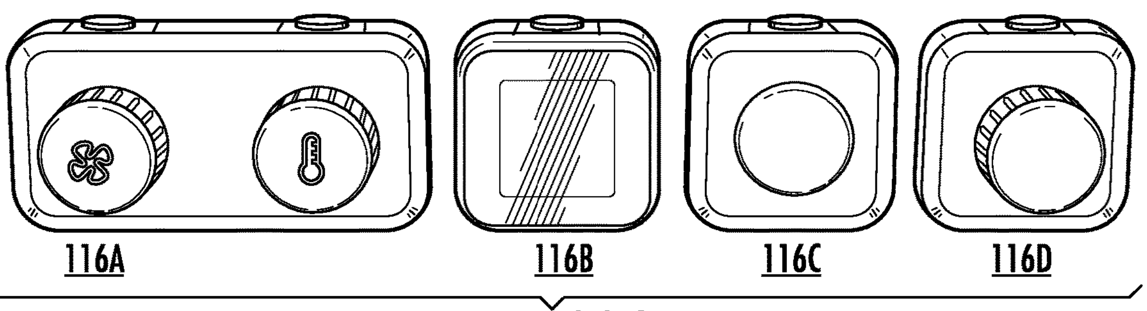
FIG. 28C illustrates an example of a third set of modular programmable widgets, in a common grouped and configurable individual configuration.

FIG. 28C illustrates an example of a third set of modular programmable widgets 116, in a common grouped and configurable individual configuration. As shown, the modular programmable widgets 116 include a first modular programmable widget 116A in the form of a combined double-length module including a dial 312 for operating a fan function and also a dial 312 for operating a temperature function; a second modular programmable widget 116B in the form of a configurable touch screen 316; a third modular programmable widget 116C in the form of a configurable button 308; and a fourth modular programmable widget 116D in the form of a configurable dial 312.

Figure 28D:
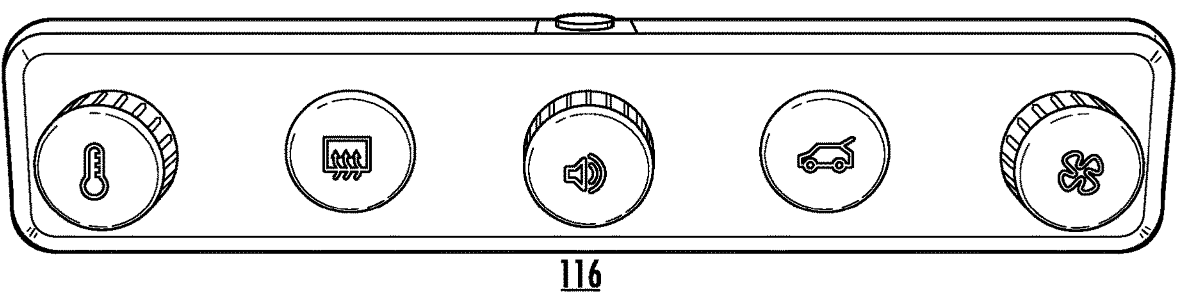
FIG. 28D illustrates an example of a fourth set of modular programmable widgets, in a hardcoded grouped configuration.

FIG. 28D illustrates an example of a fourth set of modular programmable widgets 116, in a hardcoded grouped configuration. As shown, a single modular programmable widget 116 having a width of five modular programmable widgets 116 includes a dial 312 for operating a fan function, a button 308 for operating a defrost function, a dial 312 for operating a volume function; a button 308 for operating a lift gate function; and dial 312 for operating a fan function.

Figure 28E:
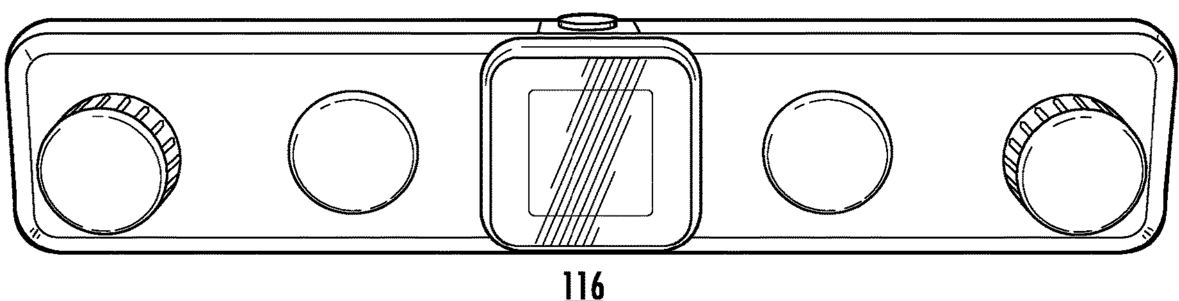
FIG. 28E illustrates an example of a fifth set of modular programmable widgets in a configurable grouped configuration.

FIG. 28E illustrates an example of a fifth set of modular programmable widgets 116 in a configurable grouped configuration. As shown, a single modular programmable widget 116 having a width of five modular programmable widgets 116 includes a configurable dial 312, a configurable button 308, a configurable touch screen 316, a configurable button 308, and a configurable dial 312.

Figure 28F:
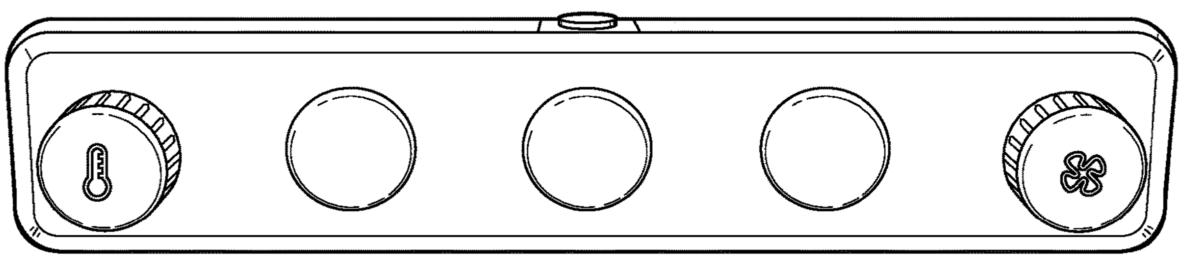
FIG. 28F illustrates an example of a sixth set of modular programmable widgets in a hybrid bar configuration.

FIG. 28F illustrates an example of a sixth set of modular programmable widgets 116 in a hybrid bar configuration. In this context, hybrid refers to a modular programmable widget 116 having both preprogrammed and configurable controls. As shown, the single modular programmable widget 116 has a width of five modular programmable widgets 116 includes a dial 312 for operating a temperature function, three configurable buttons 308, and a dial 312 for operating a fan function.

FIGS. 29A-29E illustrate example modular programmable widgets 116 in yet another alternative packaging. Referring collectively to FIGS. 29A-29E, an enclosure having a generally rectangular prism shape may be defined by a front housing 302 and a back housing 304. The front housing 302 may define a generally flat front surface of the modular programmable widget 116, while the back housing 304 may define the remainder of the enclosure, including the rear, side, and top walls that house the internal circuitry and other components of the modular programmable widget 116. Controls may be provided on the front housing 302, while connectivity to the vehicle 102 may be provided via contact pads 306 exposed through the rear of the back housing 304. The contact pads 306 may allow for transmission of data and power between the modular programmable widgets 116 and the dock 202. In an example, the contact pads 306 may include a pin-based connector (as best seen in FIG. 31).

Figure 29A:
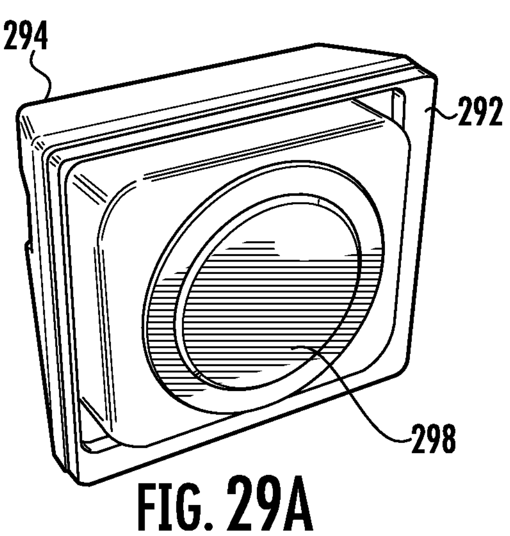
FIG. 29A illustrates an example perspective view of a modular programmable widget having a configurable button with a display.
Figure 29B:
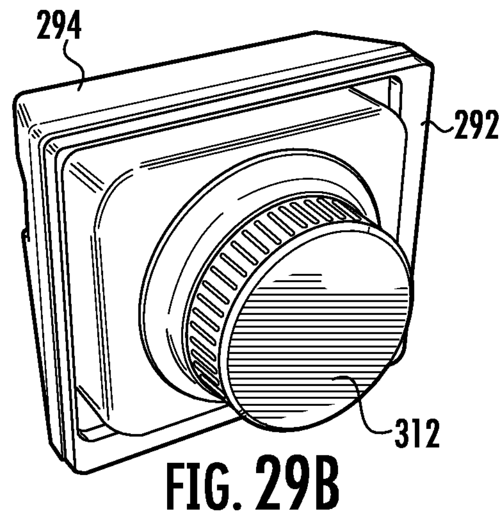
FIG. 29B illustrates an example perspective view modular programmable widget having a configurable dial with a display.
Figure 29C:
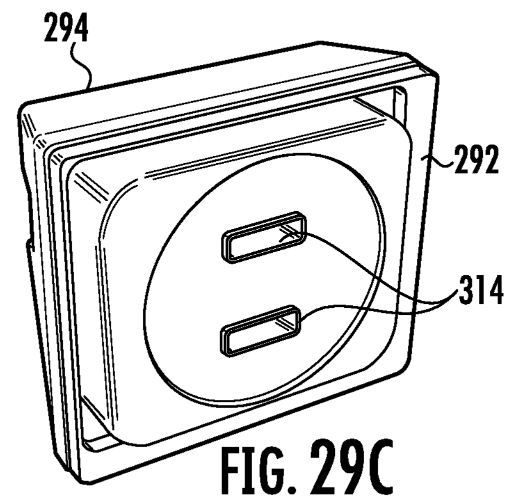
FIG. 29C illustrates an example perspective view modular programmable widget having additive power and data ports.
Figure 29D:
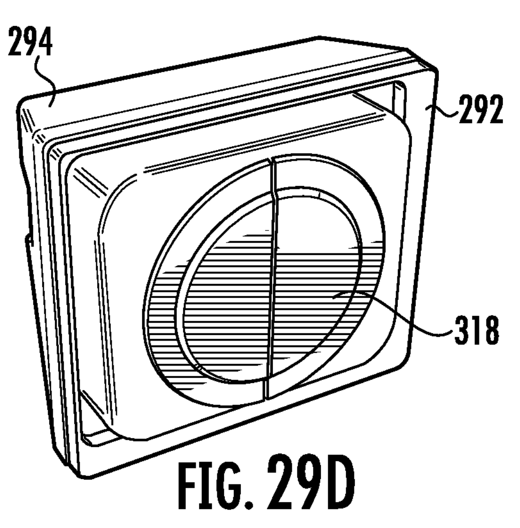
FIG. 29D illustrates an example perspective view modular programmable widget having a toggle button.
Figure 29E:
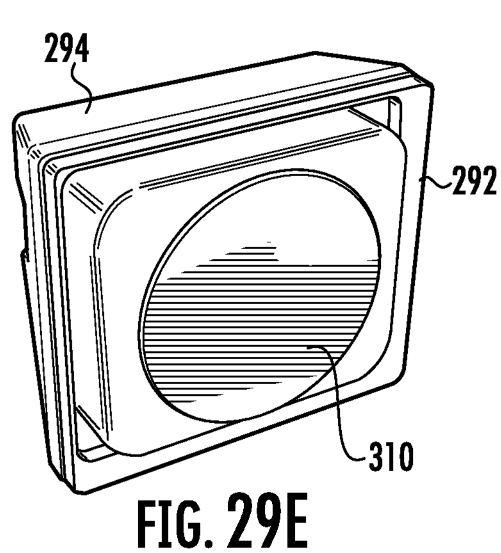
FIG. 29E illustrates an example perspective view modular programmable widget having a configurable touch screen.

The front housing 302 may expose various controls that may provide interaction with the user. In the example of FIG. 29A, this may include a configurable button 308. While not shown, in some examples the configurable button 308 may include a display 310. FIG. 29B illustrates an example modular programmable widget 116 having a configurable dial 312. FIG. 29C illustrates an example modular programmable widget 116 having additive power/data ports 314. As shown, the modular programmable widgets 116 in FIG. 10C provides two USB power/data ports 314, but this is merely an example, and different quantities and types of connectors may be exposed by the modular programmable widgets 116. FIG. 29D illustrates an example modular programmable widget 116 having a toggle button 318. FIG. 29E illustrates an example modular programmable widget 116 having a display 310. As shown in this example, the modular programmable widget 116 provides a flat display 310 on the front surface of the modular programmable widget 116.

Figure 30:
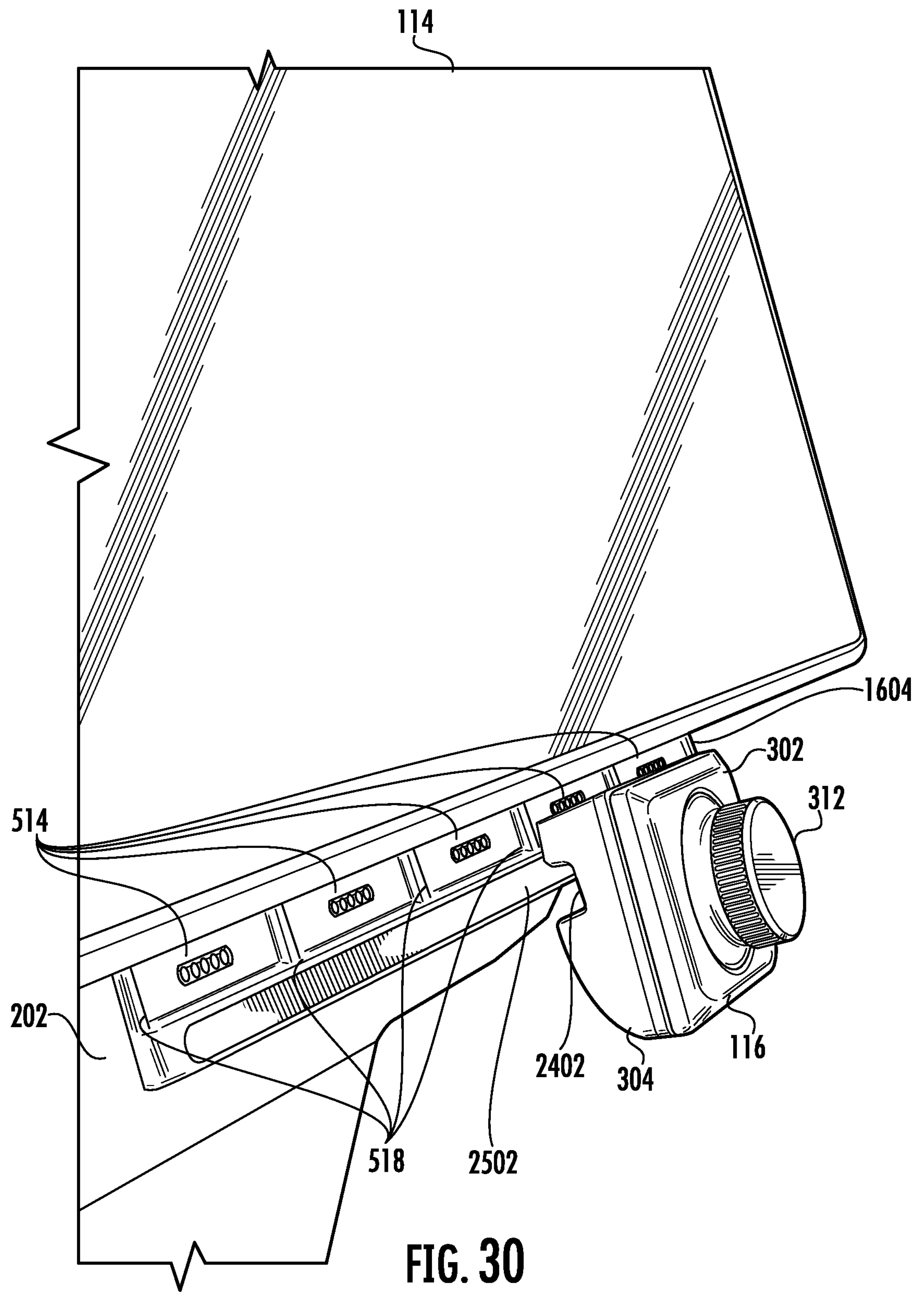
FIG. 30 illustrates a perspective view of the dock integrated below a configurable display of the vehicle for attachment of the modular programmable widgets.
Figure 32:
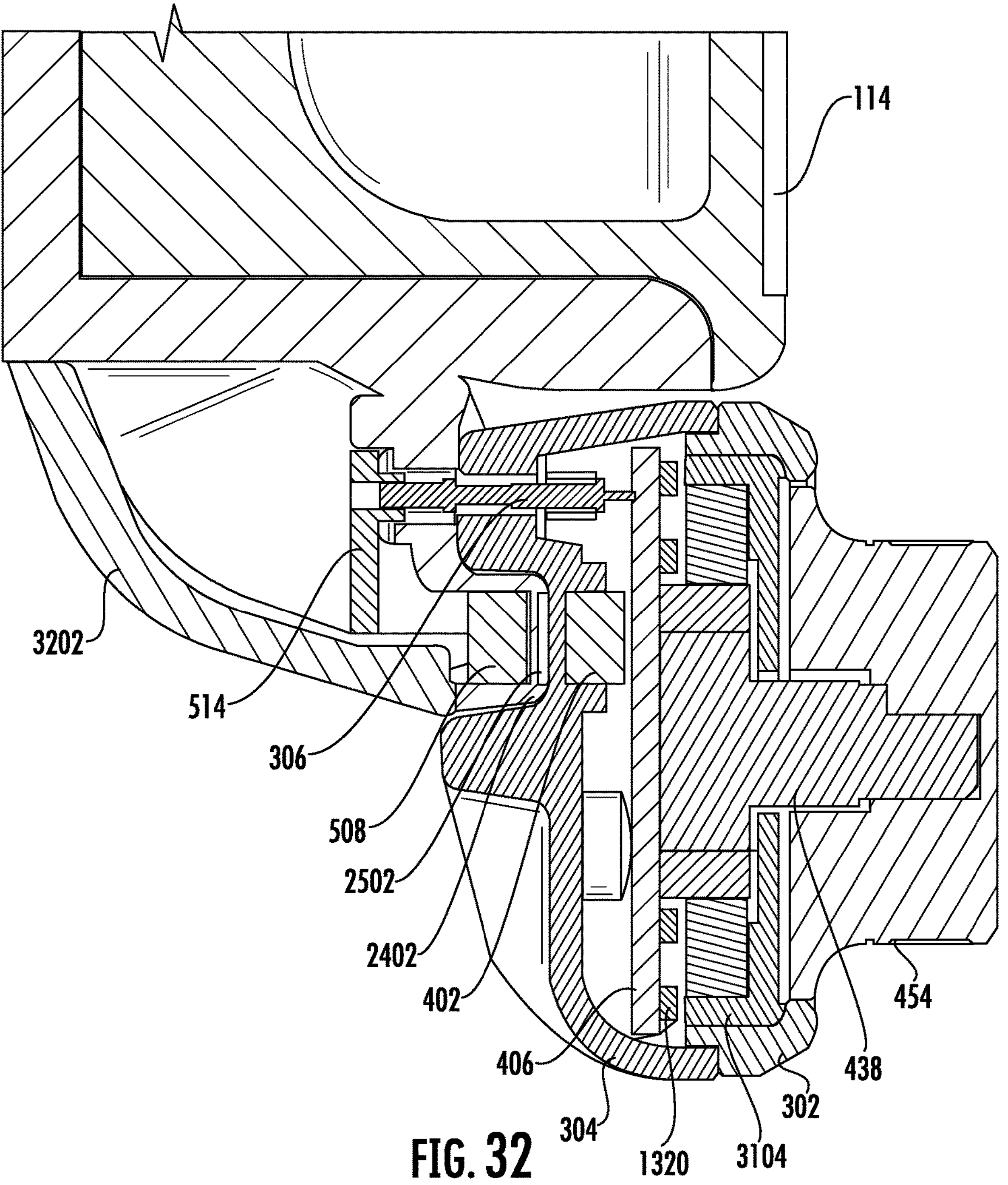
FIG. 32 illustrates a side cutaway view of an attachment of an example modular programmable widget to the dock.

FIG. 30 illustrates a perspective view of the dock 202A integrated below a configurable display 114 of the vehicle 102 for attachment of the modular programmable widgets 116. Similar to the previous packaging example, the back housing 304 of the modular programmable widgets 116 may define a horizontal channel 2402 configured to mate with a corresponding mounting bar 2504 disposed on the rear surface 1604 of the dock 202. Also similar to as discussed, the rear surface 1604 may expose dock connectors 514 for connection to the contact pads 306 of the modular programmable widgets 116. The rear surface 1604 may also define locators 518 to aid in the placement of the modular programmable widgets 116 with respect to the dock connectors 514. In this example the locators 518 may define vertical bars extending forwards between the locations for receiving the modular programmable widgets 116, serving to guide the modular programmable widget 116 into position when inserted (such as shown in FIG. 32).

Figure 31:
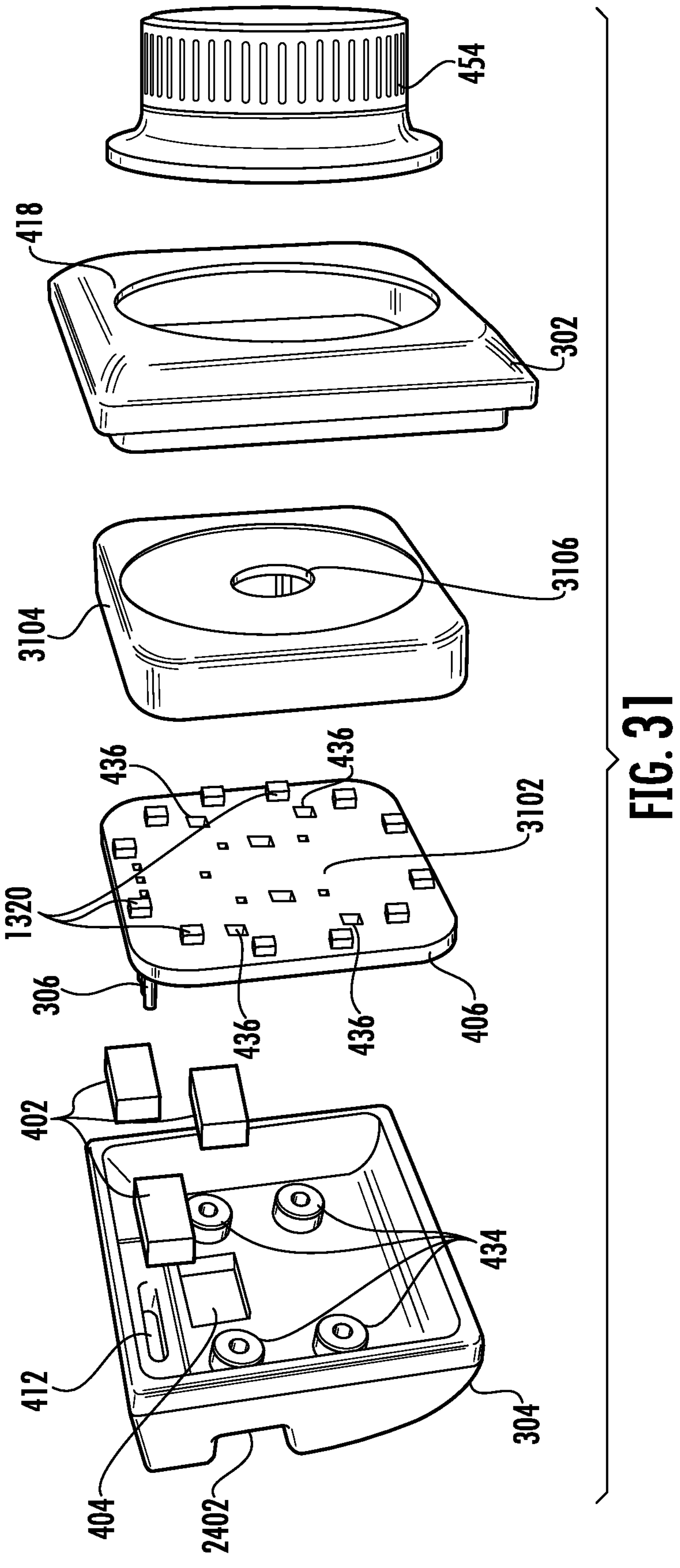
FIG. 31 illustrates an example exploded view of the modular programmable widget shown in FIG. 29B having a configurable dial.

FIG. 31 illustrates an example exploded view of the modular programmable widget 116 shown in FIG. 29B having a configurable dial 312. As mentioned above, the modular programmable widget 116 includes the front housing 302 and back housing 304. The back housing 304 of the modular programmable widget 116 may define a generally flat vertical surface of the rear of the modular programmable widget 116. In this example, the back housing 304 defines a horizontal channel 2402 extending along the length of the back housing 304. As shown, the horizontal channel 2402 is defined along length of the back housing 304 between about one quarter from the top through about one half from the top of the modular programmable widget 116, forming about one quarter of the vertical height of the modular programmable widget 116. Below the horizontal channel 2402, the back housing 304 of the modular programmable widget 116 curves down to the front housing 302 of the modular programmable widget 116.

The modular programmable widget 116 further includes one or more internal magnets 402 configured to retain the modular programmable widget 116 in position. In the illustrated example, the modular programmable widget 116 includes three internal magnets 402 at different positions within the modular programmable widget 116. The inside rear wall of the back housing 304 defines magnet recesses 404 lengthwise across the rear wall, sized to receive the internal magnets 402 and to hold the internal magnet 402 in position. As shown, the internal magnets 402 and magnet recesses 404 are each of a generally rectangular shape.

The modular programmable widget 116 further includes a main circuit board 406 configured to physically hold the electronic components of the modular programmable widget 116. For example, the main circuit board 406 may hold the components responsible for data communication with the vehicle 102 and/or receiving power from the vehicle 102. The main circuit board 406 may also hold components supporting the specific functionality of the modular programmable widget 116. In an example, the main circuit board 406 may define predefined connection points 3102 for receiving component such as rotary encoders 438 and/or switches 1302. The main circuit board 406 may also include one or more light modules 1320. These light modules 1320 may be LEDs, in an example, that may be configured to display different colors and/or intensities of light. The main circuit board 406 may also define circuit traces and/or wires to electrically connect the electrical components to one another.

The main circuit board 406 may also be physically and electrically connected to components to allow for the electrical connection of the modular programmable widget 116 to the dock 202. In an example, the top of the main circuit board 406 may hold the contact pad 306 configured to provide electrical connection to the dock 202. In this illustrated example, the contact pad 306 is a set of pins extending rearwards towards the back of the modular programmable widget 116. The contact pad 306 may slide into a contact slot 412 formed into the rear of the attachment body 414 of the back housing 304. In this example, the contact slot 412 may be formed as an aperture allowing the pins of the contact pad 306 to pass through the back housing 304.

An inner housing 3104 may define a cover having a front face and peripheral walls extending towards the rear of the modular programmable widgets 116. The inner housing 3104 may be sized to enclose the main circuit board 406 against the front face of the back housing 304. To facilitate assembly of the modular programmable widget 116, one or more fasteners 432, such as screws or pins, may be used to hold the back housing 304 and inner housing 3104 together. In an example, through holes 434 may be formed through the back of the back housing 304 which may be aligned with through holes through the main circuit board 406, and finally fixed into apertures (e.g., threaded holes, not shown) into the rear face of the inner housing 3104. It should be noted that other approaches to assembling the modular programmable widgets 116 may be used in other examples, such as snap fit connectors and/or glue. The inner housing 3104 may also define one or more inner windows 3106 to allow the user-manipulable controls, such as configurable buttons 308, configurable dials 312, configurable displays 114, etc., to be accessible through the inner housings 3104. As shown, the inner housing 3104 includes an inner window 3106 sized to allow passage of the rotary encoder 438 outside of the inner housing 3104.

The front housing 302 may define a front window 418 defining a location for mounting of the controls of the modular programmable widget 116. In this example, the modular programmable widget 116 is a configurable dial 312 and the front window 418 is a sized to receive the rotary dial 454 of the configurable dial 312 onto the rotary encoder 438. The front housing 302 may be configured to snap fit into the walls of the back housing 304, over the inner housing 3104, to form the finished front exterior of the modular programmable widget 116.

FIG. 32 illustrates a side cutaway view of an attachment of an example modular programmable widget 116 to the dock 202. As shown, the horizontal channel 2402 is mated with the mounting bar 2504, and the pins of the contact pad 306 of the modular programmable widget 116 is are electrical and physical contact with the dock connector 514 of the dock 202. Also, the internal magnet 402 of the modular programmable widget 116 is attracted to a dock magnet 2502 within the dock 202, providing force to keep the modular programmable widget 116 in place within the dock 202.

Thus, despite the differences in controls and size of the modular programmable widgets 116, the modular programmable widgets 116 each define the same connection components. For instance, each of the modular programmable widgets 116 has the same electrical contact pads 306 and locating groove 420 as discussed above. Thus, any of the modular programmable widgets 116 may be connected to the dock 202, allowing for a user to choose whichever modular programmable widget 116 has the desired controls and/or appearance.

The modular programmable widgets 116 are designed to be removable and changeable by the user. However, in some cases it may be desirable to implement locking features to secure the modular programmable widgets 116 into place.

Figure 33A:
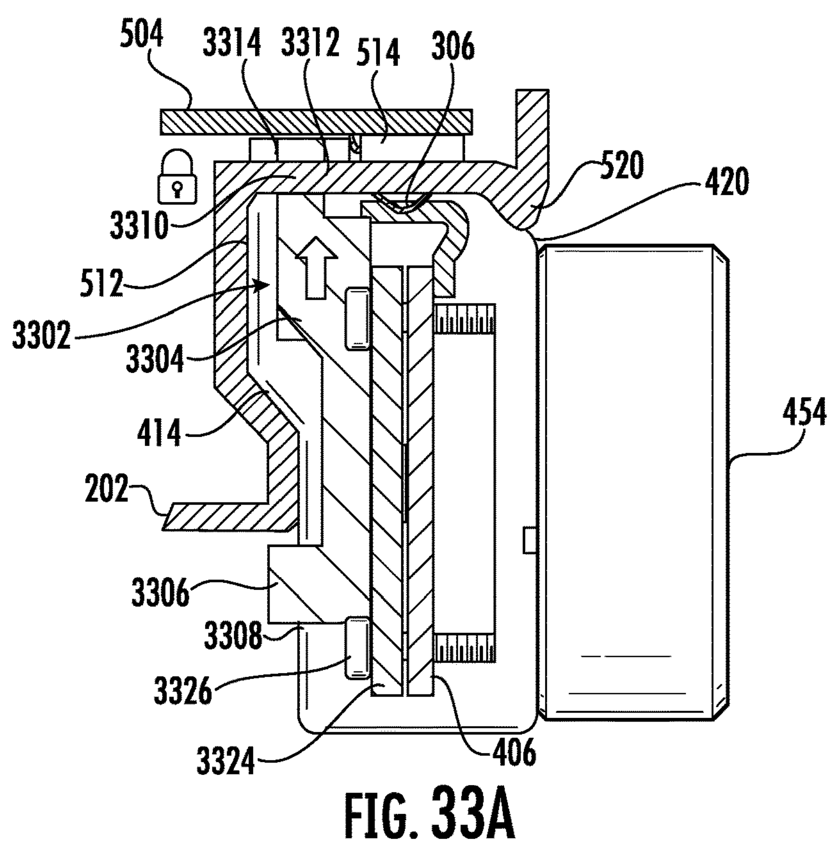
FIG. 33A illustrates a side cutaway view of a modular programmable widget having a locking slider in a locked position.
Figure 33B:
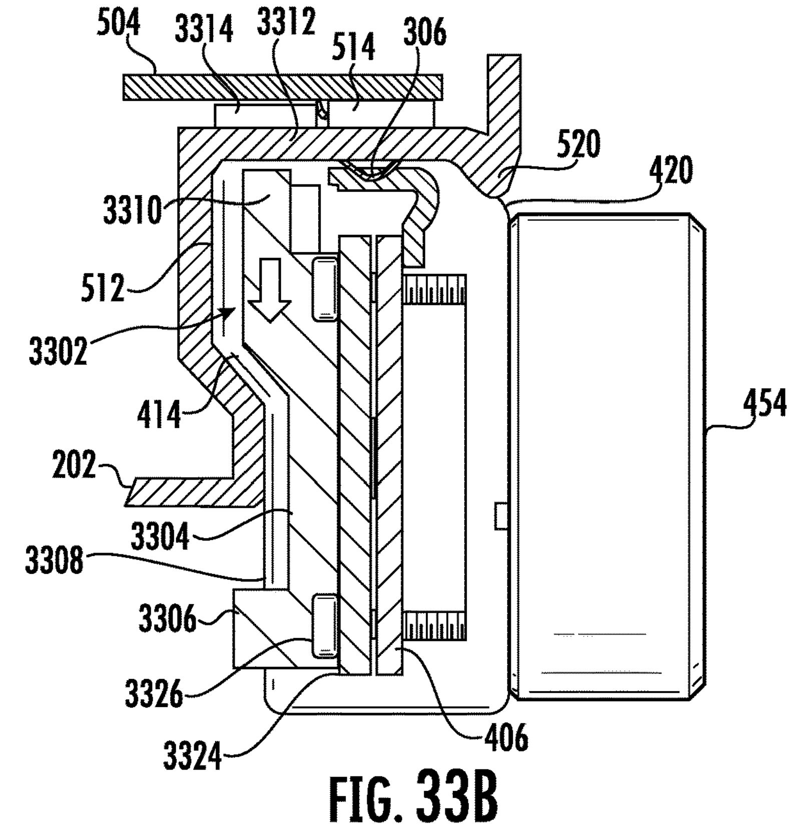
FIG. 33B illustrates a side cutaway view of the modular programmable widget of FIG. 33A with the locking slider in an unlocked position.
Figure 33C:
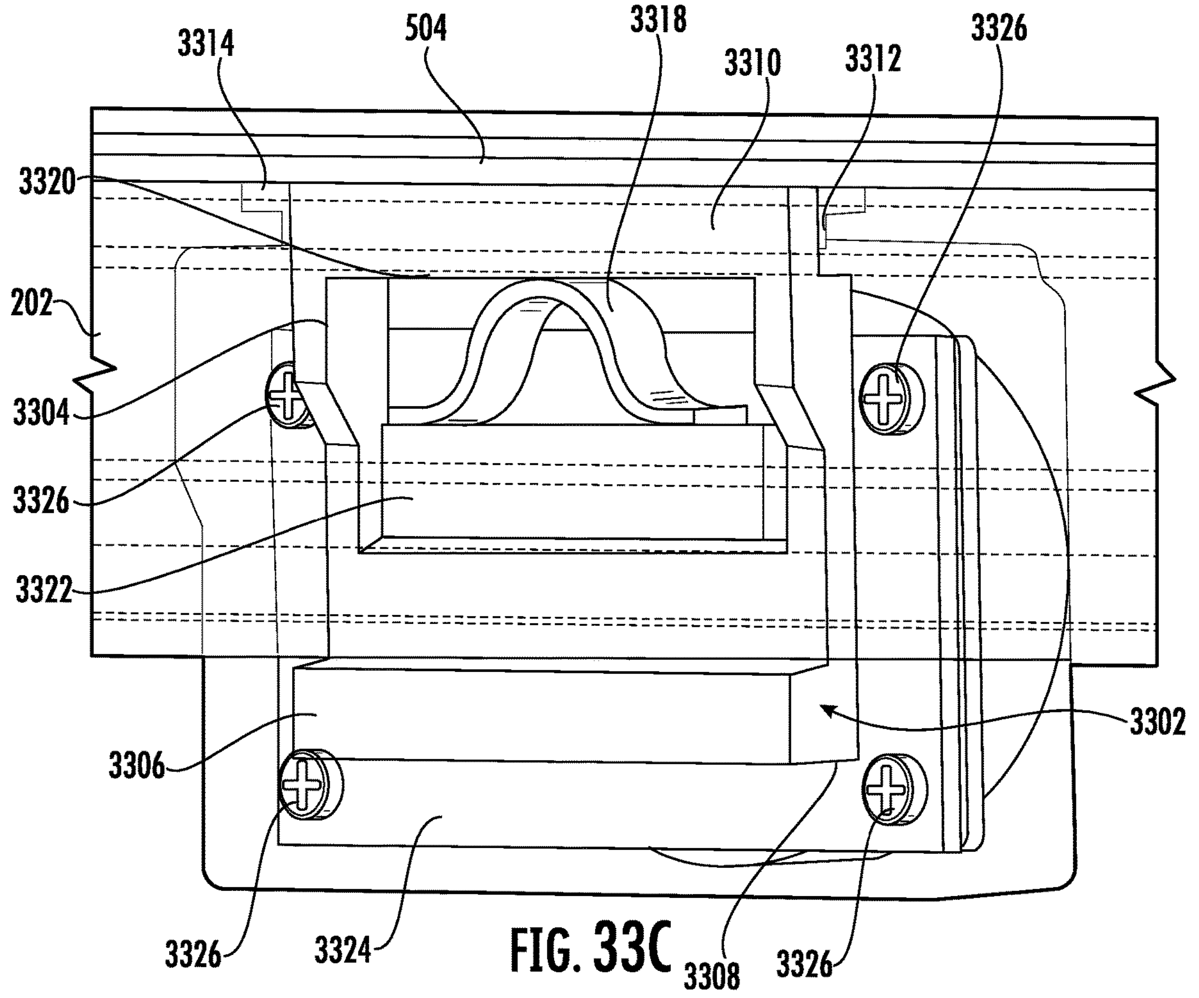
FIG. 33C illustrates a rear perspective partially transparent view of the modular programmable widget of FIG. 33A having the locking slider in the locked position.

FIGS. 33A-33C collectively illustrates aspects of an approach to locking the modular programmable widgets 116. FIG. 33A illustrates a side cutaway view of a modular programmable widget 116 having a slidable lock 3302 in a locked position. FIG. 33B illustrates a side cutaway view of the modular programmable widget 116 showing the slidable lock 3302 in an unlocked position. FIG. 33C illustrates a rear perspective partially transparent view of the modular programmable widget 116 having the lock 3302 in the locked position.

The lock 3302 may define a lock body 3304 provided within the interior of the modular programmable widget 116, such that the lock body 3304 is nested between the front housing 302 and back housing 304 of the modular programmable widget 116. The lock body 3304 may be movable within and relative to the modular programmable widgets 116, such that the lock body 3304 is vertically slidable within and relative to the door modular programmable widget 116 between a lower, unlocked position and a raised, locked position.

The lock 3302 may further defines a grip portion 3306, illustrated herein at a lower end of the lock 3302 extending outwards from an opening 3308 through the back housing 304. The grip portion 3306 may facilitate operation of the lock 3302 by giving the user a convenient handle to grip onto and lower the lock 3302 as desired. The grip portion 3306 that is exposed to a user's hand is hidden on the back side of the modular programmable widget 116. Advantageously, this may prevent affecting the outer look or aesthetics of the front of the modular programmable widget 116.

The lock body 3304 may further define a locking pin 3310 protruding upwards from an upper end of the lock body 3304. The housing of the modular programmable widget 116 may expose an aperture 3312 through which the locking pin 3310 may extend upwards above the top face of the housing. The locking pin 3310 may be configured to engage with a receptacle 3314 defined by a portion of the housing below the configurable display 114, such as through the securing channel 512. The receptacle 3314 may be sized and located in a position to allow the locking pin 3310 to pass upwards into the dock 202 when the lock 3302 is in the raised, locked position.

A biasing element 3318 may be provided within the modular programmable widget 116 to bias the locking pin 3310 upwards when not being lowered by the user. In an example, the biasing element 3318 may be a spring element placed between a biasing surface 3320 of the lock body 3304 and a stop 3322, such that in a default state the biasing element 3318 presses the biasing surface 3320 upwards and therefore the lock body 3304 upwards into the raised, locked position.

The stop 3322 may be fixed to a mounting plate 3324, which may be installed inside the modular programmable widget 116 parallel to the main circuit board 406. As shown, fasteners 3326 secure the mounting plate 3324 to the main circuit board 406. Thus, the mounting plate 3324 and the inside of the rear wall of the modular programmable widget 116 server to collectively form a channel into which the lock 3302 may slide up and down, in a controlled linear motion.

When installing the modular programmable widget 116 into the dock 202, the locating groove 420 of the modular programmable widget 116 may be aligned with the protrusion 520 of the dock 202. As the locating groove 420 is mated to the protrusion 520, the modular programmable widget 116 may be around the protrusion 520 such that the attachment body 414 of the modular programmable widget 116 moves into the securing channel 512. In doing so, the contact pad 306 of the modular programmable widget 116 moves towards electrical contact with the dock connector 514 of the dock 202. As placement of the modular programmable widget 116 is completed, the biasing element 3318 urges the locking pin 3310 of the lock 3302 through the aperture 3312 and into the receptacle 3314, locking the modular programmable widget 116 into place in the dock 202.

To remove the modular programmable widget 116, the user may grab and push down on the grip portion 3306 of the lock 3302 on the back of the modular programmable widget 116. This may accordingly move the locking post upwards, in turn lifting the locking pin 3310 out of the receptacle 3314 and into the lowered, unlocked state. Once moved, the user may then pull the modular programmable widget 116 from the dock 202.

Variations on the lock 3302 are possible. In an example, the operation of the lock 3302 may be automated by use of a solenoid, nitinol wire, or other device that may be electrically signaled by the widget controller 112 to allow for the controlled locking and unlocking of the modular programmable widget 116. Such a lock feature may provide a level of security, e.g., if there are modular programmable widgets 116 in a second row dock 202 of a vehicle 102 being used for ride-share. For instance, the user may be required to enter a credential (e.g., a PIN, another code, a voice command, a voice print, presence of an authorized key fob, presence of an authorized mobile device, etc.) to lock (or unlock) the modular programmable widgets 116 from the dock 202. Responsive to receipt of the credential, the vehicle 102 may perform the locking (or unlocking) operation.

In another example, the vehicle 102 may implement a feature that allows an owner to restrict access by the modular programmable widgets 116 to certain vehicles 102. In an example, the modular programmable widget 116 may be keyed to a credential e.g., a PIN, another code, a voice command, a voice print, presence of an authorized key fob, presence of an authorized mobile device, etc.), and that credential may be required to be received to the configurable display 114 or other HMI of the vehicle 102 to enable the modular programmable widget 116 to operate.

Figure 34A:
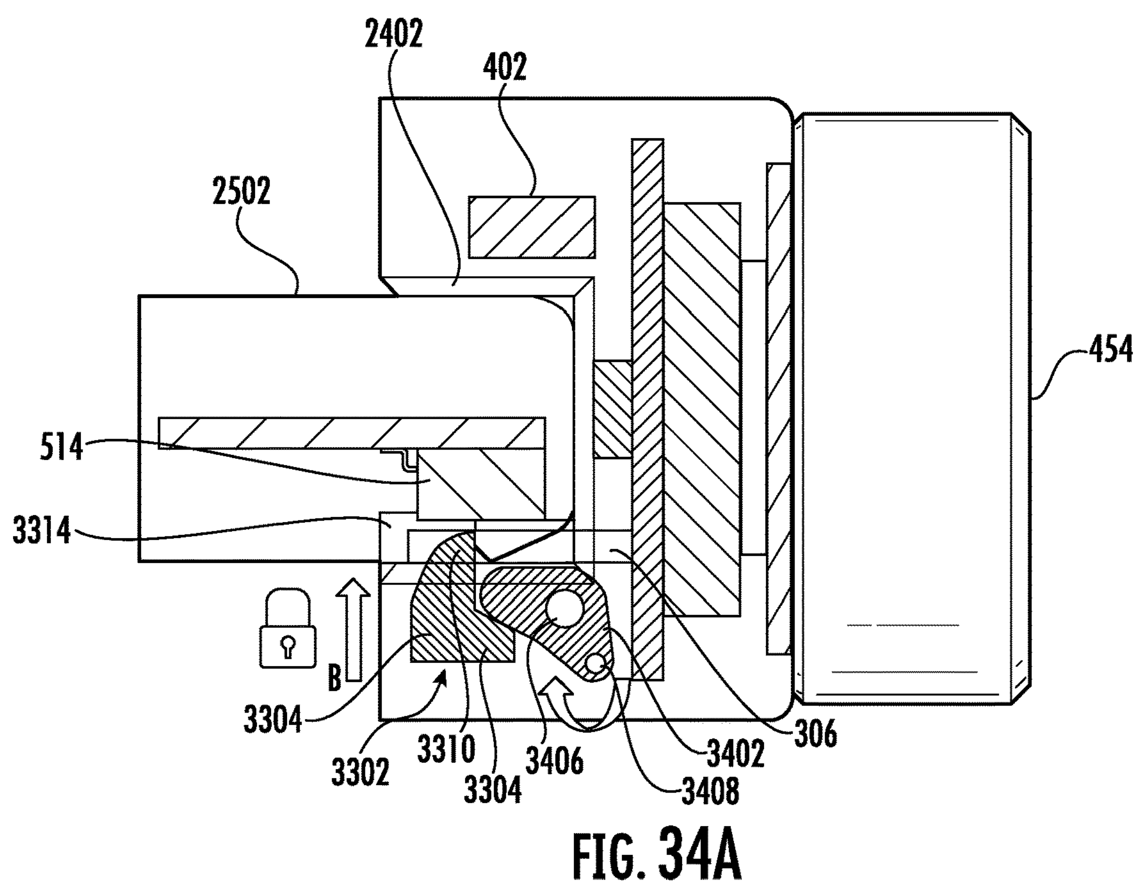
FIG. 34A illustrates a side cutaway view of a modular programmable widget having an alternate locking mechanism using a locking cam in a locked position.
Figure 34B:
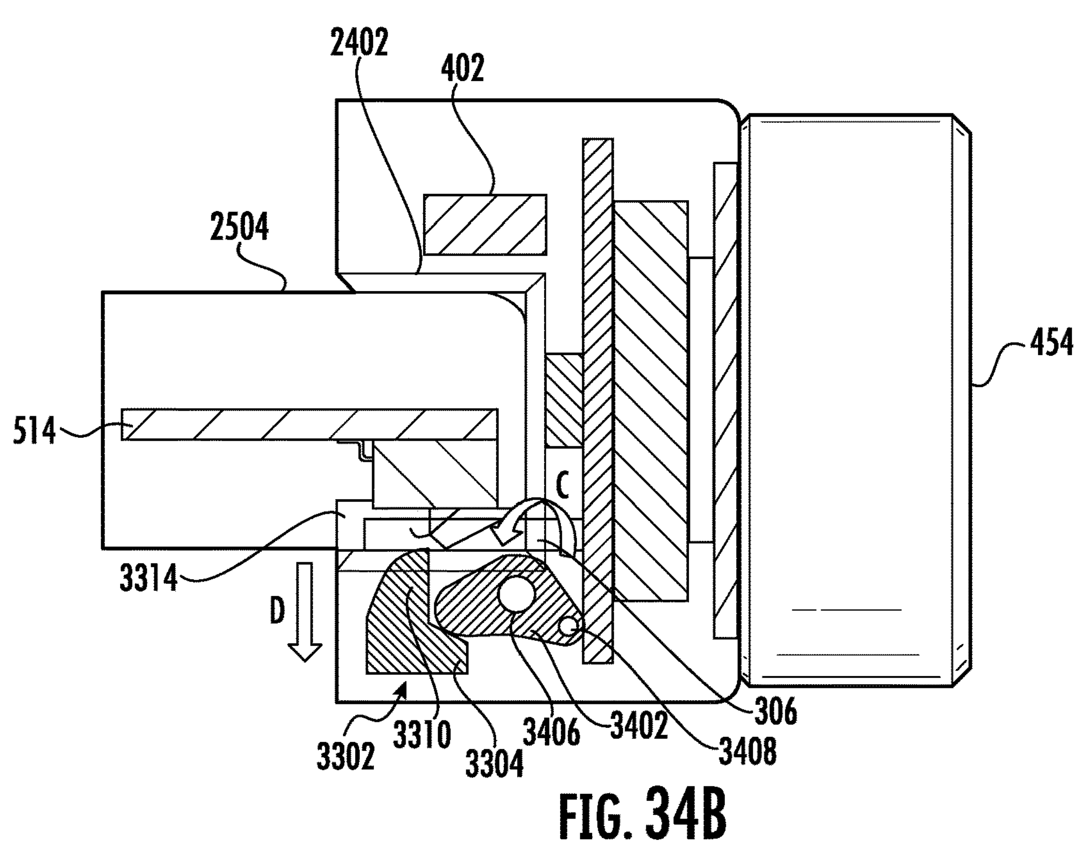
FIG. 34B illustrates a side cutaway view of the modular programmable widget of FIG. 34A having the locking cam in an unlocked position.
Figure 34C:
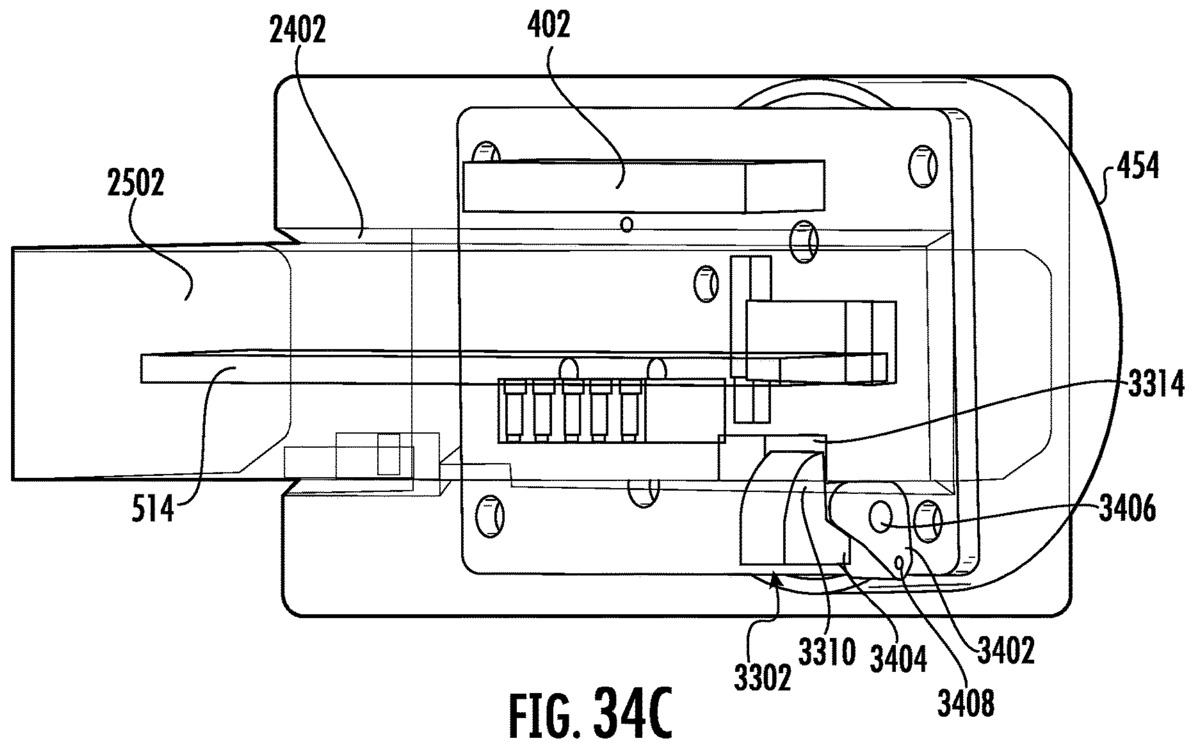
FIG. 34C illustrates a rear perspective partially transparent view of a modular programmable widget of FIG. 34A having a locking cam in the locked position.

FIGS. 34A-34C collectively illustrates aspects of an alternate approach to locking the modular programmable widgets 116. FIG. 34A illustrates a side cutaway view of a modular programmable widget 116 having the slidable lock 3302 in a locked position. FIG. 33B illustrates a side cutaway view of the modular programmable widget 116 showing the slidable lock 3302 in an unlocked position. FIG. 33C illustrates a rear perspective partially transparent view of the modular programmable widget 116 having the lock 3302 in the locked position.

As compared to the approach shown in FIGS. 33A-33C, in FIGS. 34A-34C the lock 3302 may be driven by an asymmetrical cam 3402. In this example, the lock 3302 may define a follower 3404 angling outwards from the generally vertical lock body 3304.

Similar to as discussed above, the lock body 3304 may further define a locking pin 3310 protruding upwards from an upper end of the lock body 3304. The housing of the modular programmable widget 116 may expose an aperture 3312 through which the locking pin 3310 may extend upwards above the top face of the housing. In this example, the locking pin 3310 may be configured to engage with a receptacle 3314 defined into the lower face of the mounting bar 2504. The receptacle 3314 may be sized and located in a position to allow the locking pin 3310 to pass upwards into the mounting bar 2504 when the lock 3302 is in the raised, locked position.

The cam 3402 may be mounted to an axle via through hole 3406 to provide for rotational movement of the asymmetrical cam 3402 about the axis defined by the through hole 3406. Additionally, the cam 3402 may define an attachment 3408 for receiving a connection to a release actuator. For instance, the attachment 3408 may operably connect to a nitinol wire driven by a release actuator, such that the release actuator may pull the cam 3402 counterclockwise, forcing the ovoid cam 3402 to push the follower 3404 downwards, and moving the locking pin 3310 downwards out of the receptacle 3314. Although not shown in FIGS. 34A-34C, a biasing element 3318 may be provided to bias the locking pin 3310 upwards when the release actuator is disengaged.

When installing the modular programmable widget 116 into the dock 202, the horizontal channel 2402 of the modular programmable widget 116 may be inserted onto the mounting bar 2504. In doing so, the contact pad 306 of the modular programmable widget 116 moves towards electrical contact with the dock connector 514 of the dock 202. As placement of the modular programmable widget 116 is completed, the biasing element 3318 urges the locking pin 3310 of the lock 3302 through the aperture 3312 and into the receptacle 3314, locking the modular programmable widget 116 into place on the mounting bar 2504.

To remove the modular programmable widget 116, the user may select a release option from the HMI display system 104. This may accordingly drive the release actuator to pull the cam 3402, in turn pulling the locking pin 3310 out of the receptacle 3314 and into the lowered, unlocked state. Once moved, the user may then pull the modular programmable widget 116 from the mounting bar 2504.

Figures 35A, 35B:
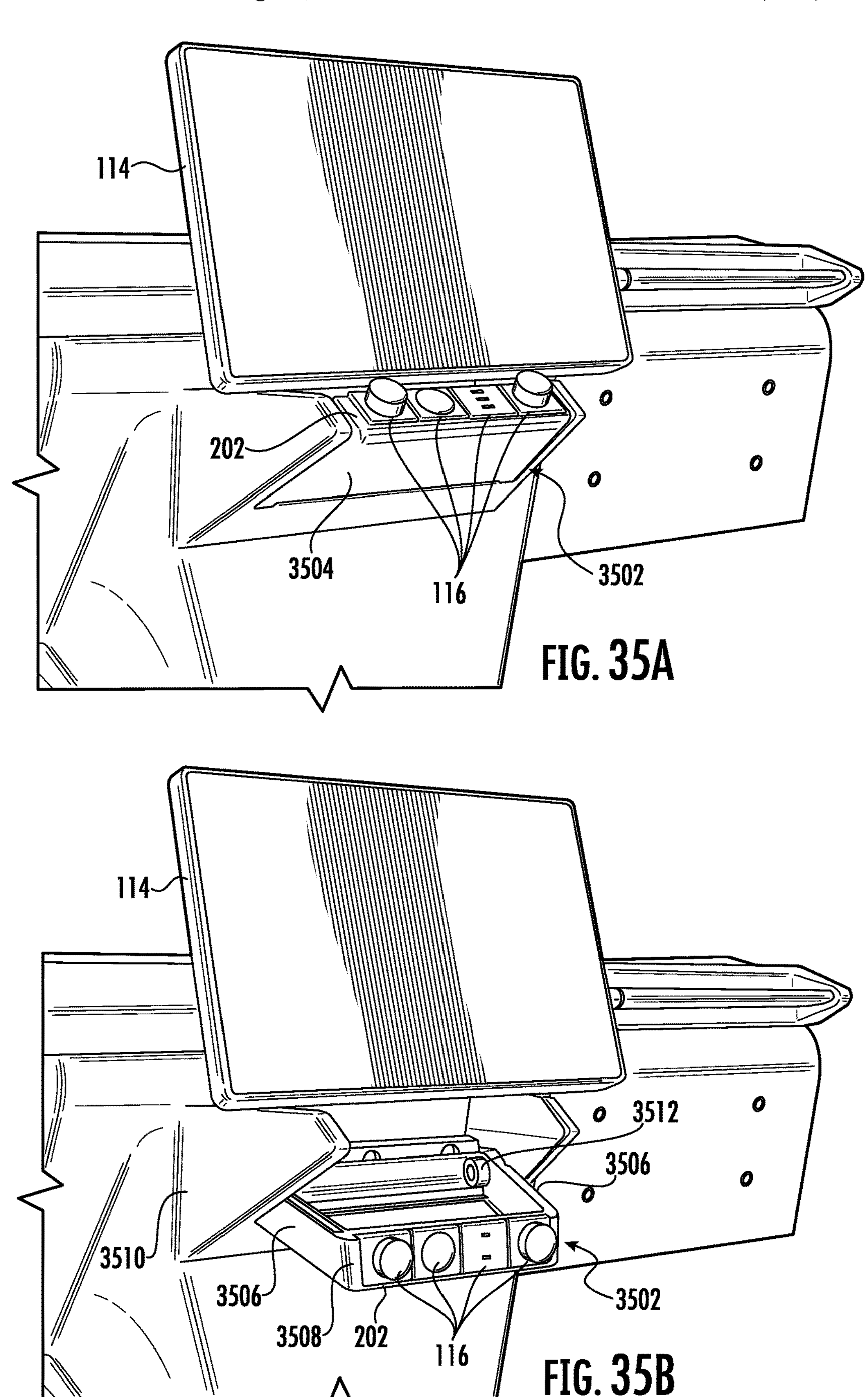
FIG. 35A illustrates an example of a storage compartment with integrated dock functionality, shown in a closed position.
FIG. 35B illustrates an example of the storage compartment with integrated dock of FIG. 35A in an open position.

FIGS. 35A-35B collectively illustrate an example of a storage compartment 3502 with integrated dock 202 functionality. FIG. 35A illustrate the storage compartment 3502 in a closed position while FIG. 35B illustrate the storage compartment 3502 in an opened position. In general, the storage compartment 3502 may provide a glove box style of hidden storage to the vehicle 102.

The storage compartment 3502 may define a generally rectangular tray with a flat tray bottom 3504, left and right side faces 3506, and a front face 3508. The rear ends of the left and right side faces 3506 may be hingedly attached to the dash 3510 of the vehicle 102 at pivot points 3512. This allows the storage compartment 3502 to rotate downwards via the pivot points 3512 into the open position as shown in FIG. 35B, and upwards into the closed position as shown in FIG. 35A. In some examples, the storage compartment 3502 may be lockable in the closed position with entry of an on-screen pin, e.g., into the configurable display 114.

The front face 3508 of the storage compartment 3502 may provide integrated dock 202 functionality. As shown, a selection of modular programmable widgets 116 are retained in the dock 202 located on the front face 3508 of the storage compartment 3502. The dock 202 and modular programmable widget 116 may be implemented using any of the various designs discussed in detail herein. A configurable dial 312, a configurable button 308, additive power/data ports 314, and another configurable dial 312 are connected in the illustration, but this is only one example and different quantities and types of modular programmable widgets 116 may be used.

FIGS. 36A-36C collectively illustrate examples of adding a phone dock 3602 to the storage compartment 3502 in addition to the with integrated dock 202 functionality. FIG. 36A illustrates use of a phone dock 3602 and dock plate 3604 for use with the storage compartment 3502. FIG. 36B illustrates a single phone dock 3602 with a landscape orientation. FIG. 36B illustrates a dual phone dock 3602 with a portrait orientation.

The phone dock 3602 may be a device configured to wirelessly charge a user's mobile device 3606. The phone dock 3602 may also provide a data connection between the mobile device 3606 and the vehicle 102, for example, to allow for applications executed by the mobile device 3606 to utilize the configurable display 114 or other features of the HMI display system 104.

The dock plate 3604 may define a surface above the phone dock 3602 onto which the mobile device 3606 may be placed for charging and/or connection to the vehicle 102. As shown, the phone dock 3602 may then be placed into the storage compartment 3502, and then the dock plate 3604 may be attached above the storage compartment 3502 to act as a cover or top over the storage compartment 3502. In an example, the left and right sides of the dock plate 3604 may define connectors 3608 (such as indentations) configured to secure onto corresponding protrusions extending upwards from the left and right side faces 3506 of the storage compartment 3502.

The upper face of the dock plate 3604 may include a rubberized material or other material to provide friction between the mobile device 3606 and the storage compartment 3502, to prevent the mobile device 3606 from moving while being charged. In some examples, the dock plate 3604 may define a recessed area 3612 into which the mobile device 3606 may be retained into position for charging and/or connection to the vehicle 102. In the example of FIG. 36B, a single mobile device 3606 is placed on top of the dock plate 3604, while in the example of FIG. 36C, two mobile devices mobile device 3606 are placed onto the larger dock plate 3604.

FIGS. 37A-37D collectively illustrate aspects of an alternative dock 202 having rotating dock slots 3702. As shown, the dock 202 may extend for a length below the configurable display 114 between left and right dock endcaps 3704. Each of the rotating dock slots 3702 may define a generally horizontal cylindrical shape with a length sufficient to hold a modular programmable widget 116. Each of dock spacers 3706 may also define a generally horizontal cylindrical shape, as shown with the same radius as that of the rotating dock slots 3702. The dock 202 may define a series of alternating dock spacers 3706 and rotating dock slots 3702 aligned end-to-end along their flat surfaces. Each of the dock endcaps 3704 may also provide a smooth rounded appearance for the ends of the dock 202, with generally the same radius as the rotating dock slots 3702. The dock spacers 3706 may be fixed in rotation, but the rotating dock slots 3702 may be mounted to rotate along their cylindrical axis.

The rotating dock slots 3702 may each also define a flat face 3708, cut or otherwise formed into the surface of the cylinder. The flat face 3708 may expose the dock connector 514 for providing electrical connection and/or mechanical connection to the modular programmable widgets 116 when attached to the dock 202. Each of the rotating dock slots 3702 may be opened to reveal an individual dock connector 514 on the flat face 3708 for receiving a modular programmable widget 116. When not being used, the rotating dock slots 3702 may be rotated closed to hide the flat face 3708 and the dock connector 514. When closed, the dock slots 3702 may give the appearance of a decorative trim peace, without showing the details of the disconnected electrical dock connectors 514.

Figure 37A:
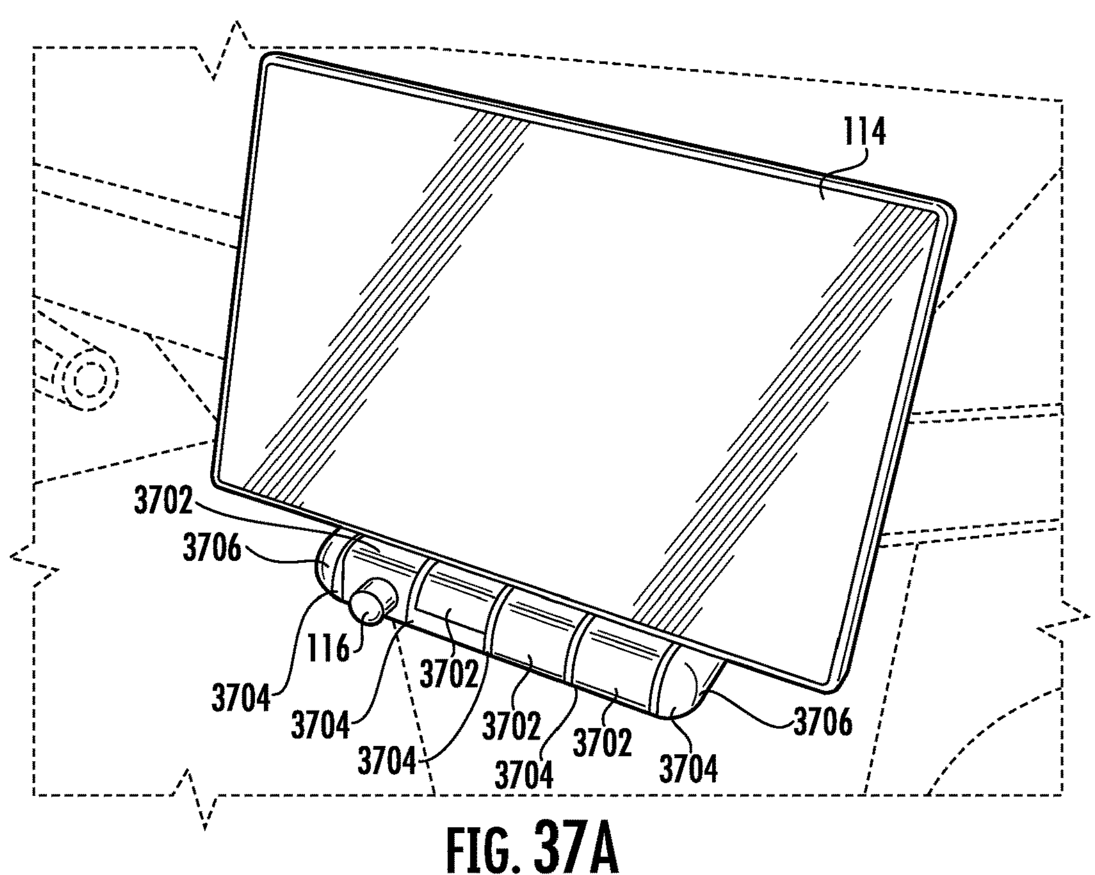
FIG. 37A illustrates an example of a rotating dock with four rotating dock slots, with the first dock slot in the open position and holding a modular programmable widget, the second in an intermediate position, and the remaining dock slots in the closed position.

FIG. 37A illustrates an example of the rotating dock 202 with four rotating dock slots 3702. From left to right, the first of the rotating dock slots 3702 is in the opened position, and the second of the rotating dock slots 3702 is in an intermediate rotation between the opened and closed position. The first of the rotating dock slots 3702 is holding a modular programmable widget 116. The remaining two rotating dock slots 3702 are in the closed position.

Figure 37B:
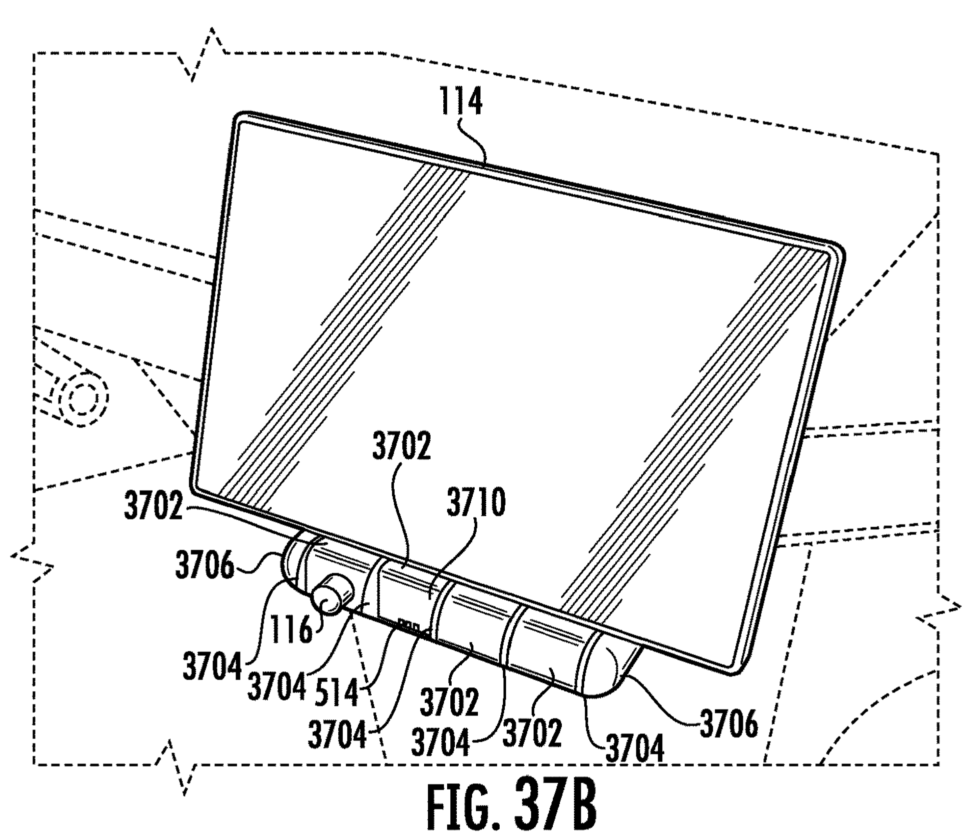
FIG. 37B illustrates an example of a rotating dock with four rotating dock slots, with the first dock slot in the open position and modular programmable widget, the second in the open position and empty, and the remaining dock slots in the closed position.

FIG. 37B illustrates an example of a rotating dock 202 with four rotating dock slots 3702, with the first rotating dock slot 3702 in the open position and holding a modular programmable widget 116, the second rotating dock slot 3702 in the open position and empty, and the remaining rotating dock slot 3702 in the closed position.

Figure 37C:
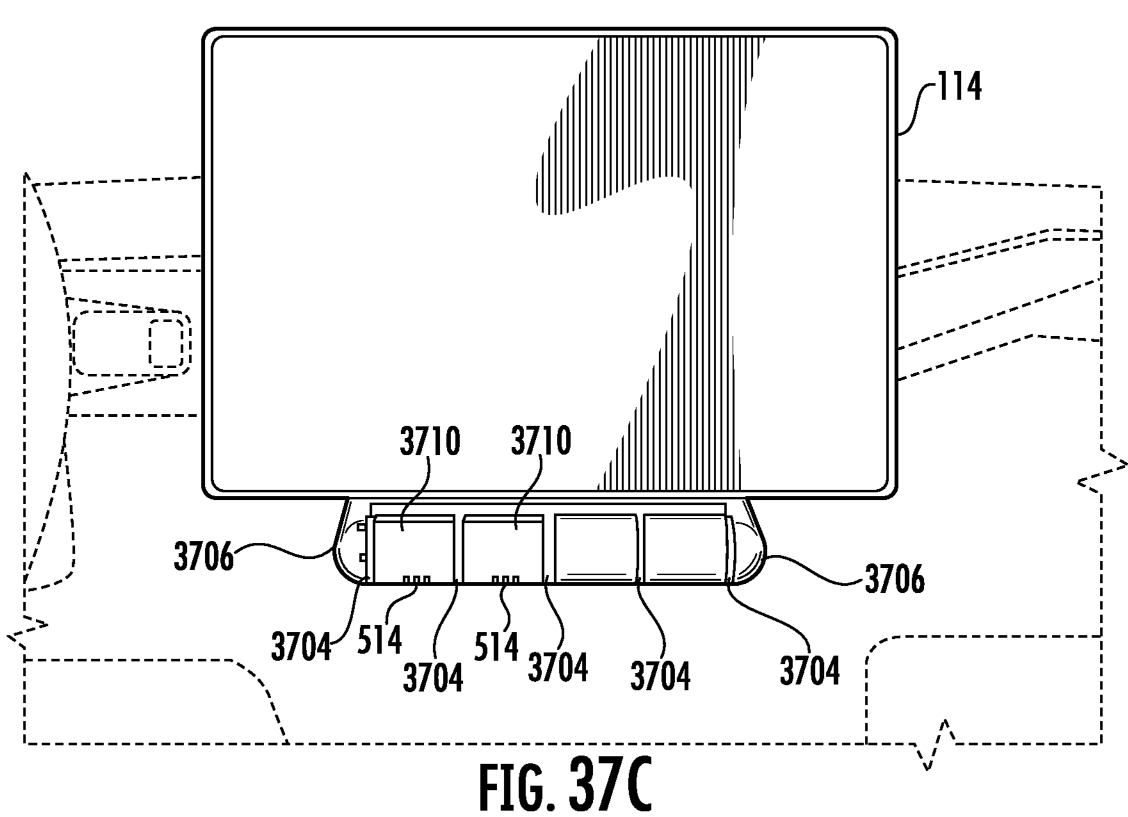
FIG. 37C illustrates an example of a rotating dock with four rotating dock slots, with the first two dock slot open and filled with modular programmable widgets, and the remaining dock slots in the closed position.

FIG. 37C illustrates an example of a rotating dock 202 with four rotating dock slots 3702, with the first two rotating dock slots 3702 open and filled with modular programmable widgets 116, and the remaining rotating dock slot 3702 in the closed position.

Figure 37D:
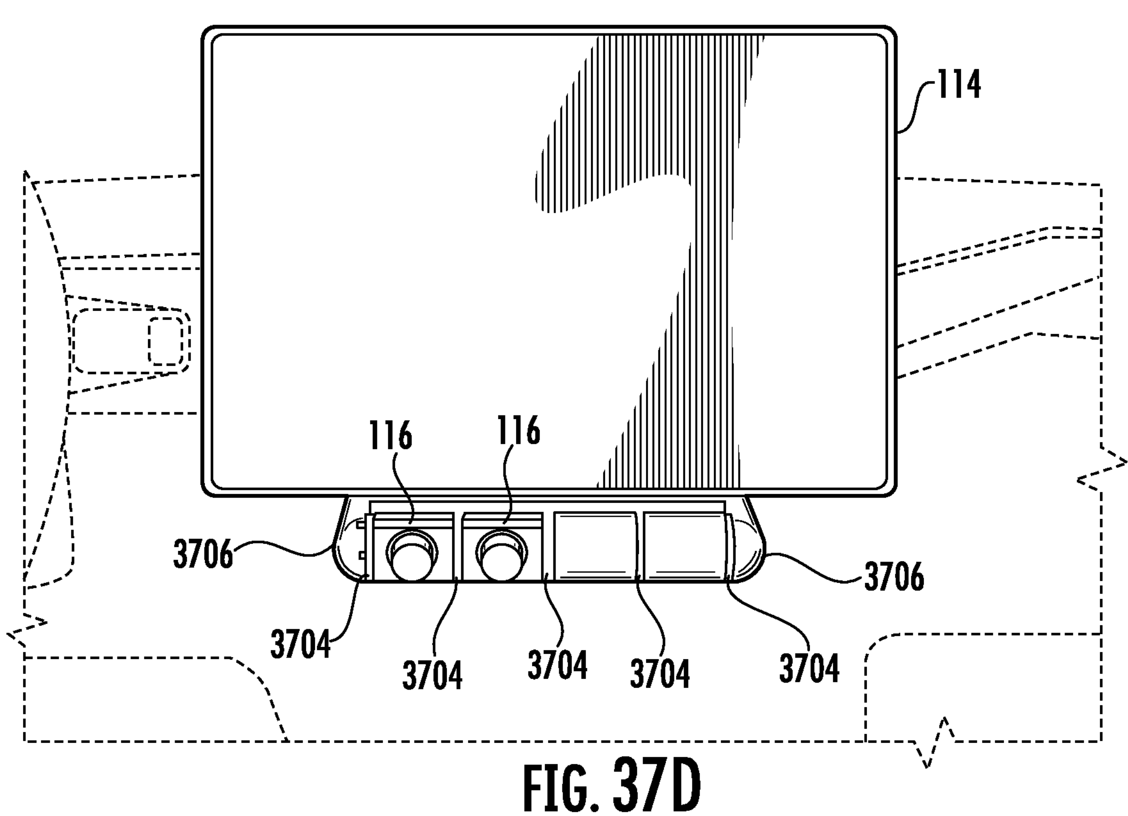
FIG. 37D illustrates an example of a rotating dock with four rotating dock slots, with the first two dock open and slot empty, and the remaining dock slots in the closed position.

FIG. 37D illustrates an example of a rotating dock 202 with four rotating dock slots 3702, with the first two rotating dock slots 3702 open and empty, and the remaining two rotating dock slots 3702 in the closed position.

A user may typically perform a set of activities or actions upon arriving home. These actions may include opening the garage door, unlocking the front door to the house, setting the home thermostat to a desired temperature, deactivating security cameras, recalling a smart vacuum device to its dock, and turning on the kitchen lights or other entry lights. The performance of these actions is referred to herein as transitioning to the home mode.

The user may also typically perform a second set of activities or actions in anticipation of departing the home. These actions may include closing the garage door, locking the front door, setting the home thermostat to an eco mode, activating security cameras, setting the smart vacuum device to be on patrol, and turning off the kitchen lights or other lights. The performance of these actions is referred to herein as transitioning to the away mode.

Figure 38A:
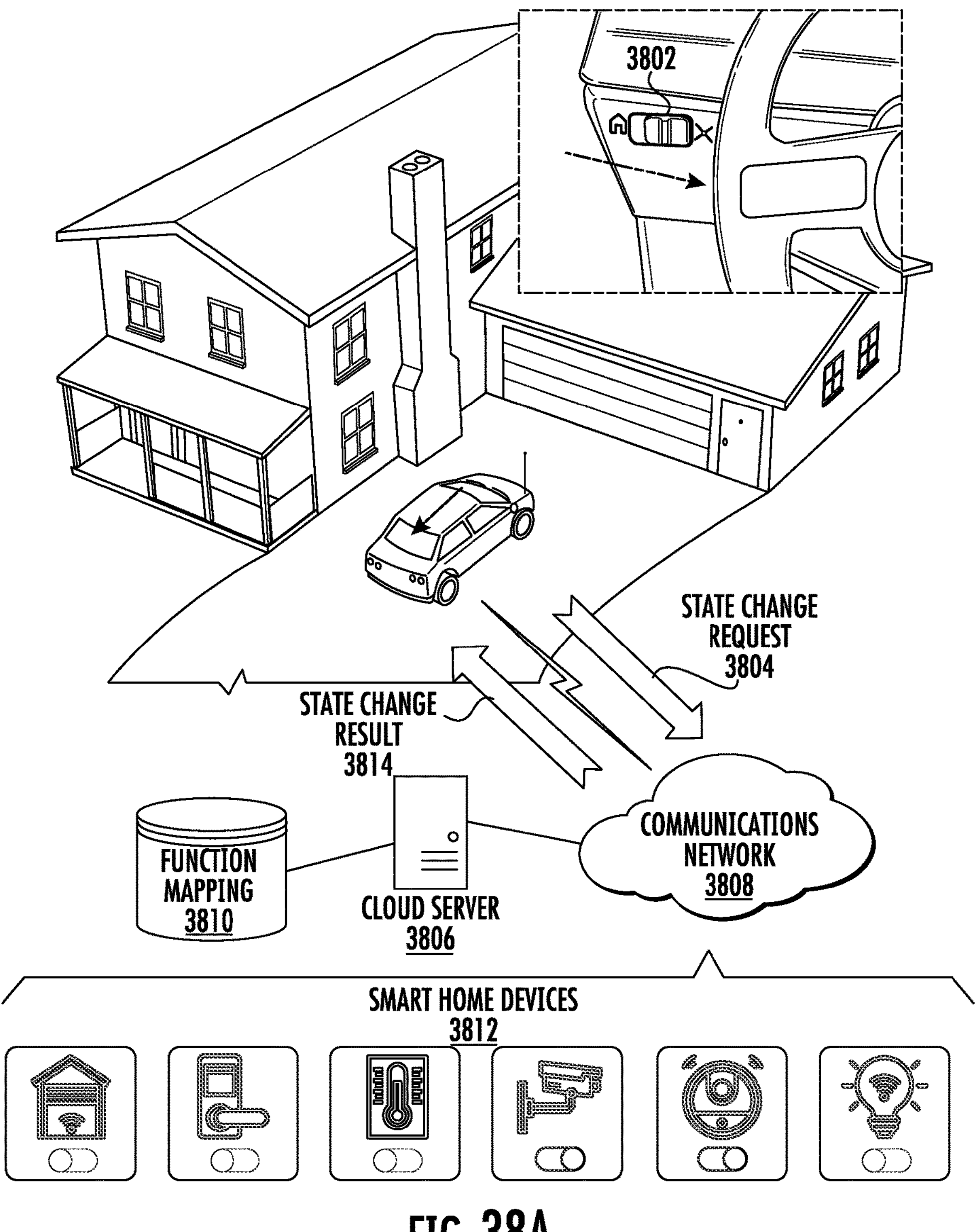
FIG. 38A illustrates an example physical toggle button to facilitate switching between a home mode and an away mode, with the physical toggle button in the away mode.
Figure 38B:
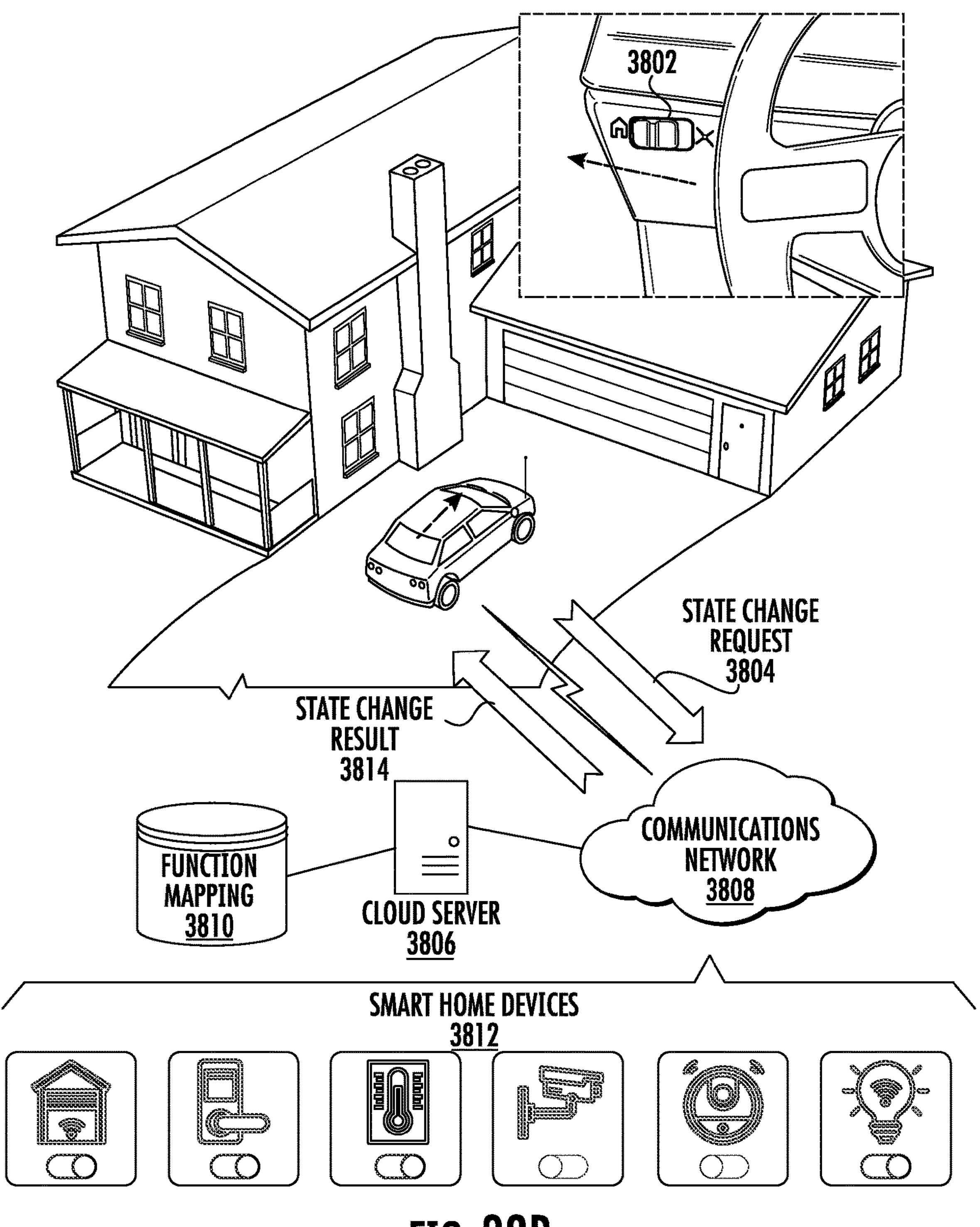
FIG. 38B illustrates an example physical toggle button to facilitate switching between a home mode and an away mode, with the physical toggle button in the home mode.

FIGS. 38A-B illustrate an example system 3800 for automatically switching between the home mode and the away mode. The system 3800 may include a physical toggle button 3802 included within the cabin of the vehicle 102. The physical toggle button 3802 may be a two-state physical device, allowing the vehicle 102 to be easily transitioned between the home and away modes. FIG. 38A illustrates the physical toggle button 3802 in the away mode, while FIG. 38B illustrates the physical toggle button 3802 in the home mode.

As shown, the physical toggle button 3802 is located outboard of the steering wheel, but this is only one example position. In another example, the physical toggle button 3802 may be located below the center screen (e.g., below the configurable display 114). In yet another example, the physical toggle button 3802 may be located on the center console. In still another example, the physical toggle button 3802 may be located on the header above the windshield, on the rear view mirror, etc.

Figure 39A:
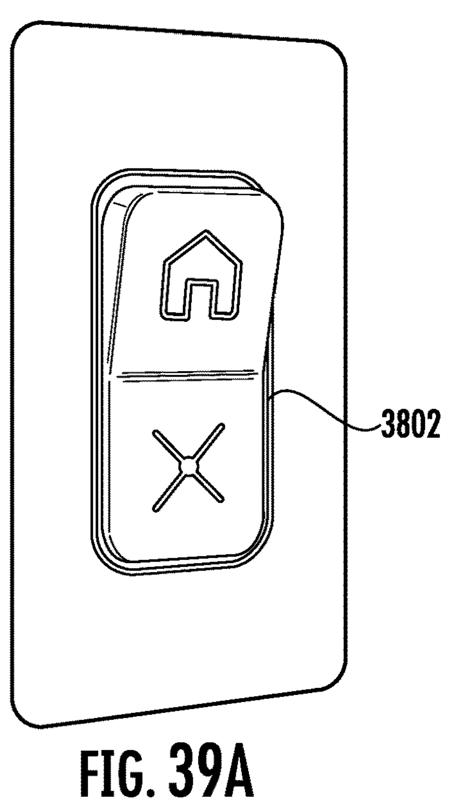
FIG. 39A illustrates an example flip style physical toggle for use in switching between the home and away modes.
Figure 39B:
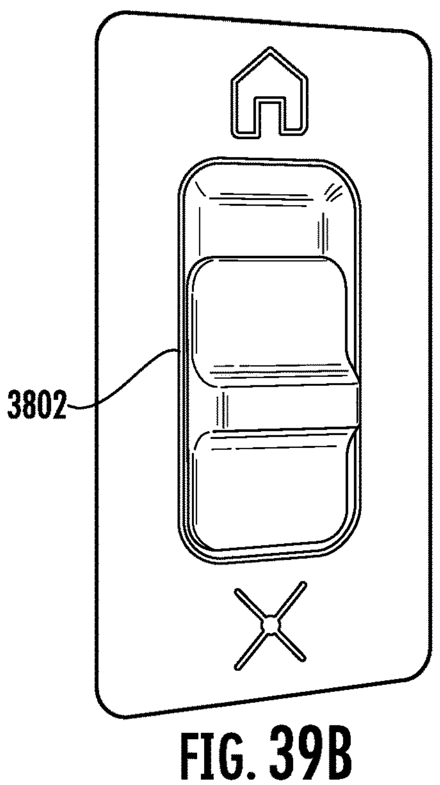
FIG. 39B illustrates an example slide style physical toggle button for use in switching between the home and away modes.
Figure 39C:
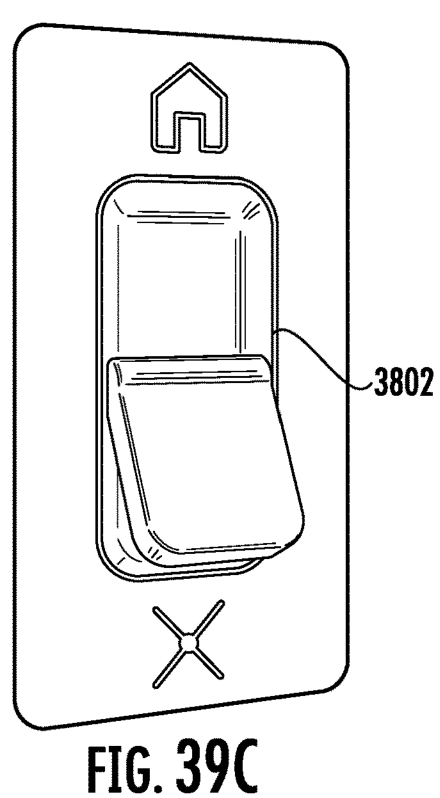
FIG. 39C illustrates an example toggle style physical toggle button for use in switching between the home and away modes.
Figure 39D:
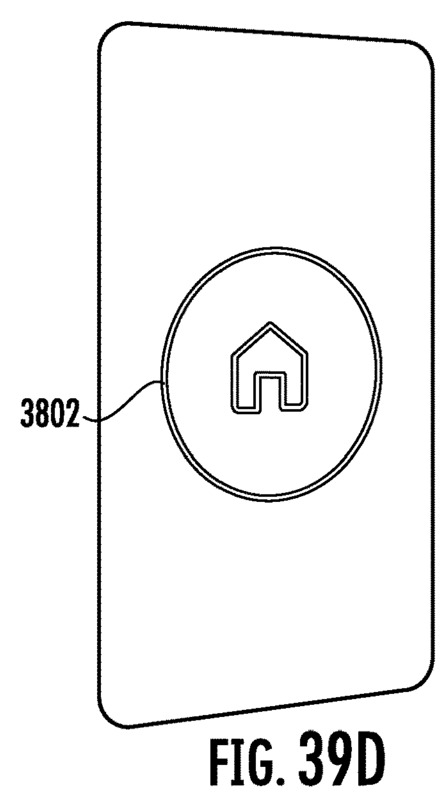
FIG. 39D illustrates an example pushbutton style physical toggle button for use in switching between the home and away modes.

FIGS. 39A-39D illustrate example designs for the physical toggle button 3802. FIG. 39A illustrates an example flip style physical toggle button 3802. This example physical toggle button 3802 may be toggled by pressing in the desired side. FIG. 39B illustrates an example slide style physical toggle button 3802. This example physical toggle button 3802 may be toggled by sliding the switch to the desired side. FIG. 39C illustrates an example toggle style physical toggle button 3802. This example physical toggle button 3802 may be toggled by moving the toggle to the desired side. FIG. 39D illustrates an example pushbutton style physical toggle button 3802. This example physical toggle button 3802 may be toggled by pressing the button.

Instead of or in addition to the physical toggle button 3802, it should be noted that one or more of the modular programmable widgets 116 may be programmed to perform the toggle function as well. For instance, a configurable button 308, configurable display 114, configurable four-way button pad 336, configurable multi-directional control 344, etc. may be programmed by the user to invoke the toggle between the home and away modes.

Returning to FIGS. 38A-38B, the system 3800 further includes one or more smart home devices 3804. The smart home devices 3804 may include various devices that may be remotely controlled to perform one or more home automation functions. An example smart home device 3804 may be a garage door opener. The garage door opener smart home device 3804 may support functions such as open garage door and close garage door. Another example smart home device 3804 may be a front door lock. The front door opener smart home device 3804 may support functions such as unlock front door and lock front door. Yet another example smart home device 3804 may be a home thermostat. The home thermostat door opener smart home device 3804 may support functions such as set temperature, turn on air conditioning, turn off air conditioning, turn on heat, turn off heat, set to eco mode, set to occupied mode, etc. In another example, the smart home device 3804 may be a security camera. The security camera smart home devices 3804 may support function such as activate camera and deactivate camera. As still another example, the smart home device 3804 may be a robot vacuum. The robot vacuum smart home device 3804 may support function such as begin cleaning patrol and return to charger base. In another example, the smart home device 3804 may be a light. The light smart home device 3804 may support functions such as turn on light, turn off light, set light brightness, and set light color.

When the state of the physical toggle button 3802 is changed by the user, the arriving or departing behavior may be automatically performed. For example, the set of arriving actions may be automatically performed by the vehicle 102 responsive to transitioning the physical toggle button 3802 from the away mode to the home mode. In addition, the set of departing actions may be automatically performed by the vehicle 102 responsive to transitioning the physical toggle button 3802 from the home mode to the away mode.

To perform the actions, the vehicle 102 may send a state change request 3806 to a cloud server 3808 over a communications network 3810. The cloud server 3808 may use a function mapping 3812 stored to or otherwise accessible to the cloud server 3808 to identify the actions to be performed. For instance, the function mapping 3812 may indicate network addresses of the smart home devices 3804, account/login details of the smart home devices 3804, and/or the functions to activate or deactivate for the smart home devices 3804. The cloud server 3808 may then communicate with the smart home devices 3804 to implement the identified actions. By sending the state change request 3806 to the cloud server 3808 and having the cloud server 3808 forward the commands to the smart home devices 3804, the vehicle 102 may be able to configure the mode of the smart home devices 3804 without having to be in Wi-Fi or other communications with the home itself.

The cloud server 3808 may further provide a state change result 3814 as a confirmation to the vehicle 102 indicating the result of the configuration of the smart home devices 3804. In an example, the state change result 3814 may indicate whether or not the state change is completed. In another example, the state change result 3814 may indicate which functions from the function mapping 3812 could or could not be completed.

In some examples, the HMI display system 104 may provide a chime and/or an on screen icon to confirm the change in status. In another example, the physical toggle button 3802 may include a light, and the light may be activated responsive to the physical toggle button 3802 being confirmed by the state change result 3814 as being in sync with the home. In other words, when the physical toggle button 3802 is toggled, the light may be deactivated until the state change result 3814 is received, and if the state change result 3814 indicates success, then the light may be reactivated. This accordingly allows the user to easily understand that the state change has been performed.

Figure 40:
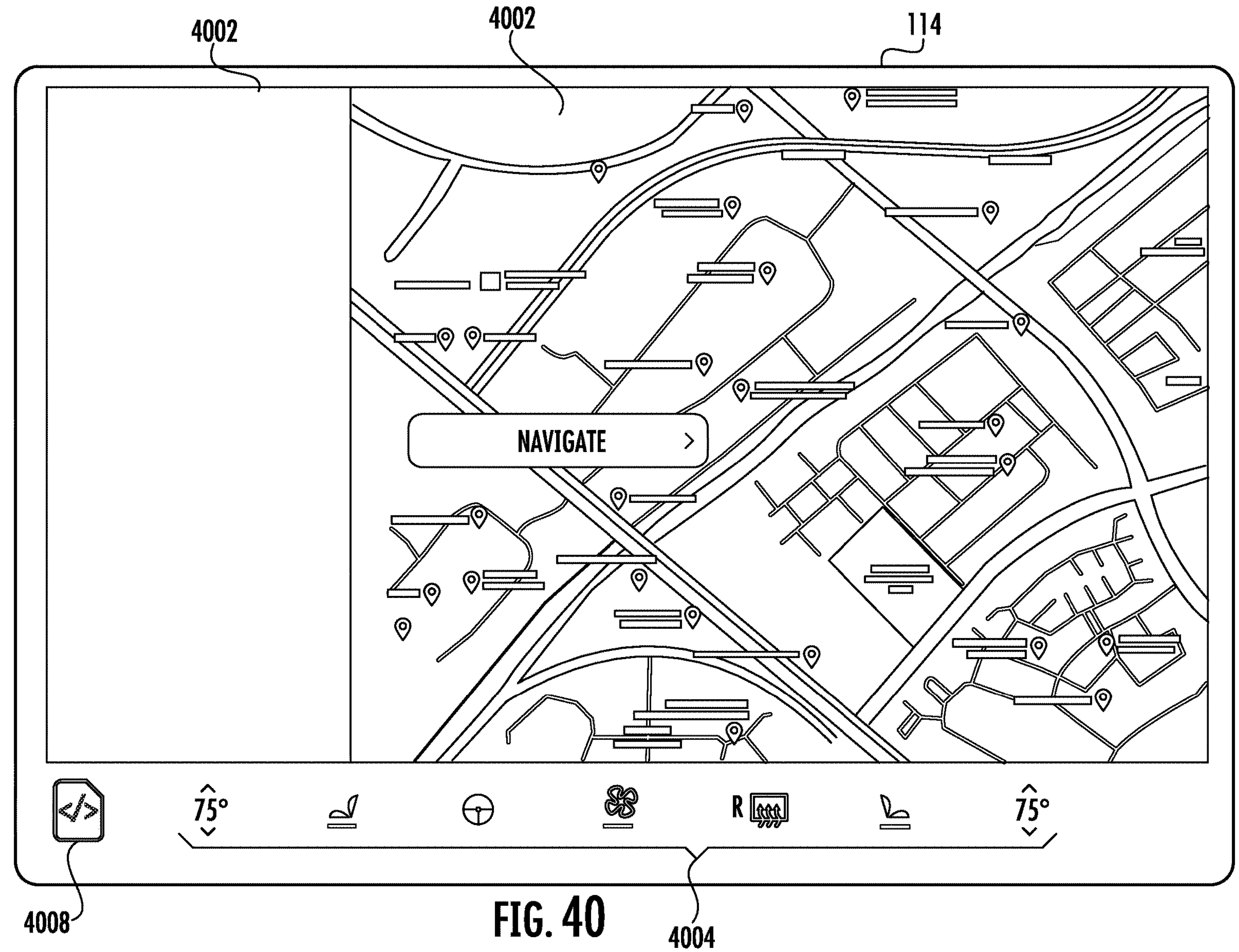
FIG. 40 illustrates an example main screen of the configurable display from which a configuration screen for the home and away modes is selectable.

FIG. 40 illustrates an example main screen 4002 of the configurable display 114 from which a configuration screen for the home and away modes is selectable. As shown, the configurable display 114 include a climate screen area 4004 offering touch controls to manipulate various climate control functions of the vehicle 102. The configurable display 114 may include a main screen area 4006 in which the currently active application may be displayed. As shown a navigation map application is currently being shown. Additionally, the main screen 4002 also provides a mode configuration control 4008 that, when selected causes the configuration screen for the home and away modes to be displayed.

Figure 41:
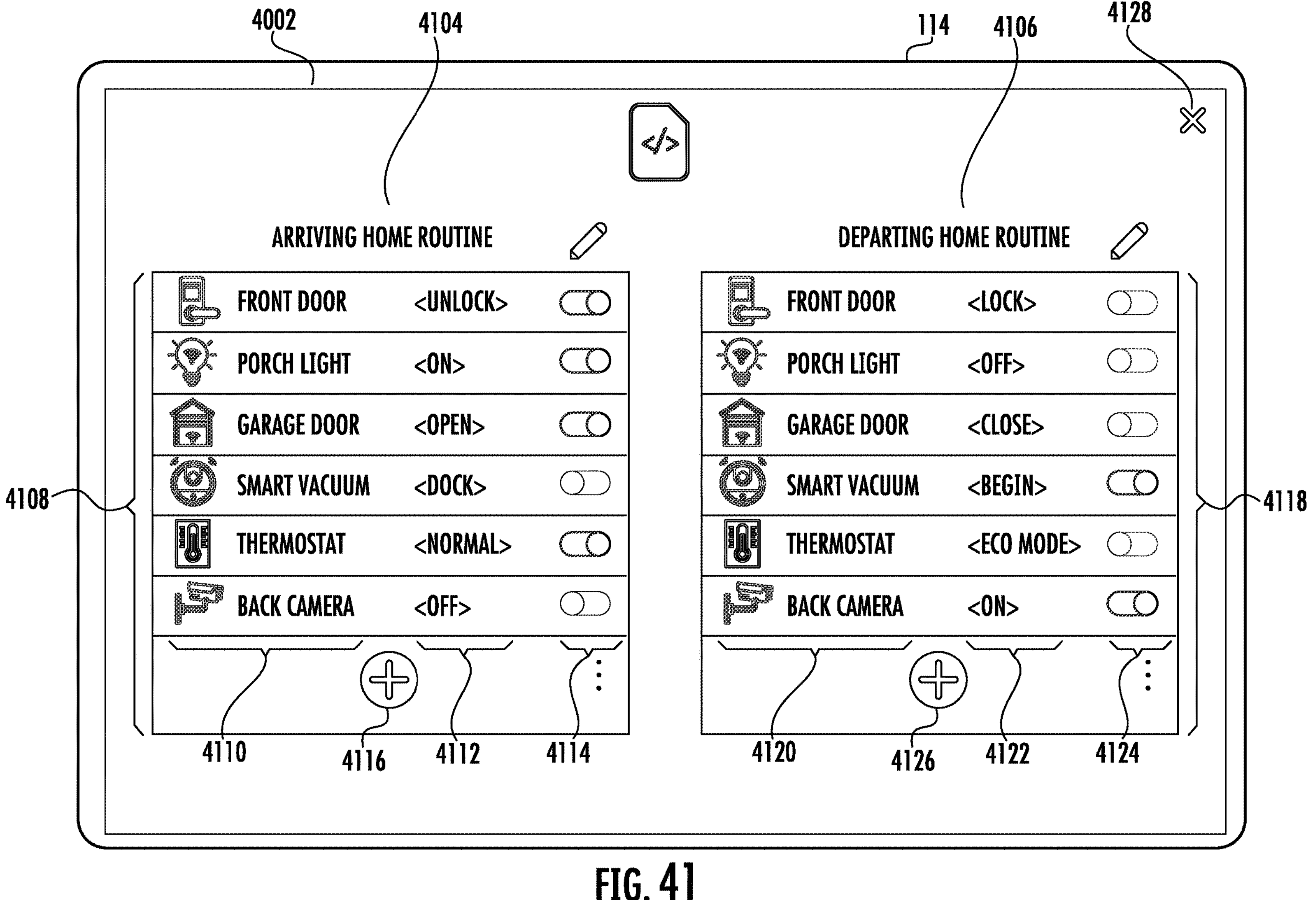
FIG. 41 illustrates an example configuration screen of the configurable display.

FIG. 41 illustrates an example mode configuration screen 4102 of the configurable display 114. In an example, the mode configuration screen 4102 may be displayed responsive to selection of the mode configuration control 4008 from the main screen 4002.

The mode configuration screen 4102 may allow the user to specify the functions to be performed for both arriving and departing the home. As shown, the mode configuration screen 4102 includes an arriving home routine 4104 label indicating a set of controls for configuring the set of arriving actions and a departing home routine 4106 indicating a set of controls for configuring the set of departing actions.

To configure the set of arriving actions, the mode configuration screen 4102 includes an arriving actions list 4108. The list includes a set of items that correspond to the different actions to be automatically performed when transitioning to the home mode. Each action may be shown in in the arriving actions list 4108. For instance, for each action a smart device description 4110 may be shown. Here the smart device description 4110 includes a name and icon indicative of the smart home device 3804 to be configured are shown, but different examples are possible, such as a name only, icon only, a user customizable name, etc.

Additionally, a function selector 4112 including a list of the functions supported by the smart home device 3804 may be shown. For instance, the user may select the function selector 4112, which may open a dropdown of the available functions to be controlled. The available functions may be based on the device discovery or may be predefined based on the type of smart home device 3804. The user may select the function to be performed by the smart home devices 3804 from dropdown list. The arriving actions list 4108 may also include a toggle 4114 for each list item. This toggle 4114 allows the user to select how to set the chosen function when the user arrives at the home. For instance, the toggle 4114 allows the user to either turn on or off the chosen function upon arrival.

In some cases, the user may wish to add an additional device to the arriving actions list 4108. To do so, the user may select the add devices control 4116. Once selected, the vehicle 102 may initiate a device discovery function. In an example, the vehicle 102 may use the telematics control module 130 to wirelessly communicate with the smart home device 3804 local to the vehicle 102. For instance, the telematics control module 130 may use any of various discovery protocols to broadcast and/or receive messages indicative of the presence and/or available features of the smart home devices 3804. The vehicle 102 may perform the discovery using one or more protocols, such as Wi-Fi, BLUETOOTH, BLUETOOTH Low Energy (BLE), ZigBee, Z-Wave, Thread, Matter, etc. In a specific example, the smart home devices 3804 may be discoverable by the vehicle 102 when the vehicle 102 is networked to the home, and the vehicle 102 may query for smart home devices 3804 that are connected to the user's home Wi-Fi. A list of available devices may be shown to the user, and the user may select from those devices to add them to the arriving actions lists 4108.

Similar to the arriving actions list 4108, to configure the set of departing actions, the mode configuration screen 4102 includes a departing actions list 4118. The list includes a set of items that correspond to the different actions to be automatically performed when transitioning to the away mode. Each departing action may be shown in in the departing actions list 4118. For instance, for each action a smart device description 4120 may be shown, consistent with the display of the smart device description 4110. The departing actions list 4118 may also include a function selector 4122 configured to operate as the function selector 4112 for departing actions, toggles 4124 that allows the user to select how to set the chosen function when the user departs from the home, and an add devices control 4126 for adding additional devices to the departing actions list 4118. The function selector 4122, toggles 4124, and add devices control 4126 may operate as discussed above with respect to the function selector 4112, toggles 4114, and add devices control 4116, respectively.

Once the user has completed configuring the arriving actions list 4108 and departing actions list 4118, the user may select the close button 4128 to return to the main screen 4002. In some examples, the mode configuration screen 4102 may confirm with the user to save changes before applying the changes to the function mappings 3812. If the user confirms to update the actions, the HMI display system 104 may use the telematics control module 130 to send the updated function mapping 3812 to the cloud server 3808.

Figures 42, 43:
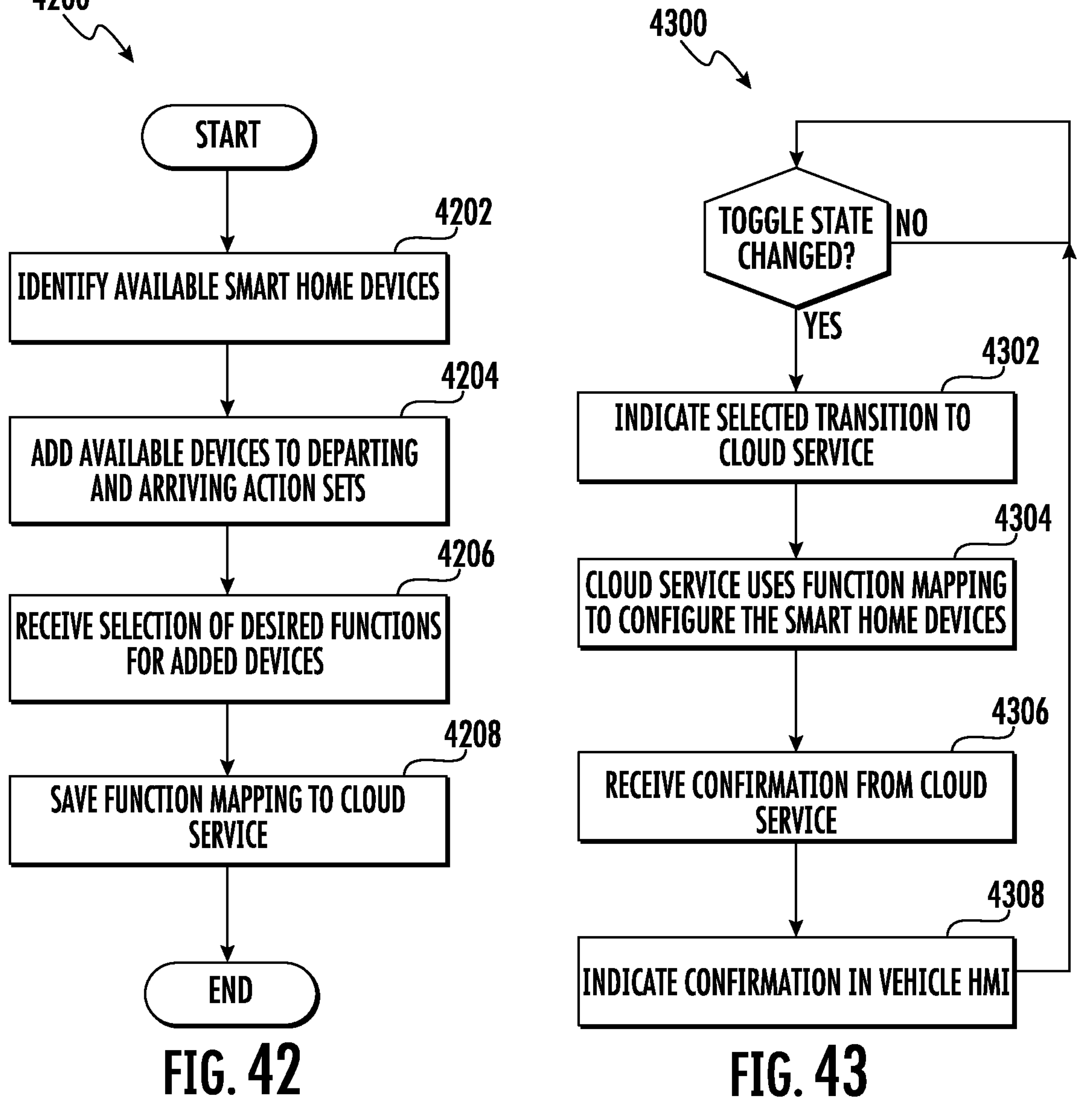
FIG. 42 illustrates an example process for the configuration of the physical toggle button.
FIG. 43 illustrates an example process for the execution of a mode change triggered by the physical toggle button.

FIG. 42 illustrates an example process 4200 for the configuration of the physical toggle button 3802. In an example, the process 4200 may be performed by may be performed by the components of the vehicle 102 and cloud server 3808, as discussed in detail herein.

At operation 4202, the HMI display system 104 identifies available smart home devices 3804. In an example, the user may select the add devices control 4116 or the add devices control 4126 from the mode configuration screen 4102. Responsive to the selection, the HMI display system 104 may use the telematics control module 130 to wirelessly discover the smart home device 3804 local to the vehicle 102. In some examples, the communication may further include discovering the available functions of the discovered smart home devices 3804.

At operation 4204, the HMI display system 104 adds available devices to the arriving actions list 4108 and/or the departing actions list 4118. In an example, a list of available devices identified at operation 4202 may be shown to the user, and the user may select from those devices to add them to the arriving actions lists 4108 and/or the departing actions list 4118, as selected by the user.

At operation 4206, the HMI display system 104 receives selection of desired functions for the added devices. In an example, the user may utilize the function selector 4112 to configure the desired functions for the smart home devices 3804 added to the arriving actions list 4108 and may use the function selector 4122 to configure the desired functions for the smart home devices 3804 added to the departing actions list 4118.

At operation 4208, the HMI display system 104 saves the function mappings 3812. In an example, the user may use the close button 4128 to close the mode configuration screen 4102. The user may also in some cases confirm that the changes to the function mapping 3812 should be applied to the cloud server 3808. If confirmed, the HMI display system 104 may use the telematics control module 130 to send the updated function mapping 3812 to the cloud server 3808. After operation 4208, the process 4200 ends.

FIG. 43 illustrates an example process 4300 for the execution of a mode change triggered by the physical toggle button 3802. In an example, the process 4200 may be performed by the components of the vehicle 102 and cloud server 3808, as discussed in detail herein.

At operation 4302, the HMI display system 104 detects whether the state of the physical toggle button 3802 has changed. In an example, the HMI display system 104 may be in communication with the physical toggle button 3802 internal to the vehicle 102 and may receive a signal indicative of the current state of the physical toggle button 3802. If that state changes, control passes to operation 4304. Otherwise, control remains at operation 4302.

At operation 4304, the HMI display system 104 indicates the state transition to the cloud server 3808. In an example, the HMI display system 104 may direct the telematics control module 130 to send a state change request 3806 to a cloud server 3808 over a communications network 3810. The state change request 3806 may indicate whether to change to the home mode or to the away mode.

At operation 4306, the cloud server 3808 uses the function mapping 3812 to configure the smart home devices 3804. In an example, the cloud server 3808 uses the function mapping 3812 configured using the process 4200 to identify the actions to be performed. The cloud server 3808 may then communicate with the smart home devices 3804 to implement the identified actions. By sending the state change request 3806 to the cloud server 3808 and having the cloud server 3808 forward the commands to the smart home devices 3804, the vehicle 102 may be able to configure the mode of the smart home devices 3804 without having to be in Wi-Fi or other communications with the home itself.

At operation 4308, the HMI display system 104 receives confirmation from the cloud server 3808. In an example, the cloud server 3808 may further provide the state change result 3814 to the telematics control module 130 as a confirmation to the vehicle 102 indicating the result of the configuration of the smart home devices 3804. For instance, the state change result 3814 may indicate whether or not the state change is completed. In another example, the state change result 3814 may indicate which functions from the function mapping 3812 could or could not be completed.

At operation 4310, the HMI display system 104 indicates the confirmation in the HMI display system 104. In some examples, the HMI display system 104 may provide a chime and/or an on screen icon to confirm the change in status. In another example, the physical toggle button 3802 may include a light, and the light may be activated responsive to the physical toggle button 3802 being confirmed by the state change result 3814 as being in sync with the home. After operation 4310, the process 4300 returns to operation 4302.

Figure 44:
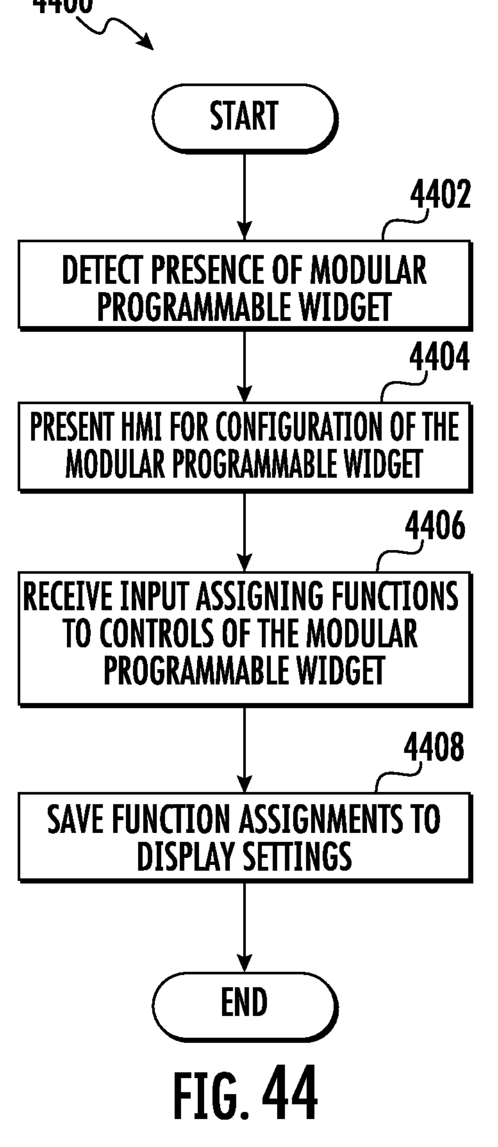
FIG. 44 illustrates an example process for the configuration of a modular programmable widget.

FIG. 44 illustrates an example process 4400 for the configuration of a modular programmable widget 116. In an example, the process 4400 may be performed by the components of the vehicle 102, as discussed in detail herein, when operating in a configuration mode.

At operation 4402, the HMI display system 104 detects the presence of a modular programmable widget 116. In an example, responsive to connection of the modular programmable widget 116 to the configurable display 114, the widget controller 112 of the HMI display system 104 may receive signals indicative of the connection. In a first example, the connection may include the contact pads 306 of the modular programmable widget 116 being electrically connected to the dock connectors 514 of the dock 202. The modular programmable widgets 116 and docks 202 may be of any of the designs discussed in detail herein.

Regardless of example, the modular programmable widget 116 may provide information to the configurable display 114 via the electrical connection of the contact pads 306 to the dock connectors 514. This information may be indicative of the type of the modular programmable widget 116. This information may indicate, for example, that the modular programmable widget 116 is an HMI device. The information may further include information such as model of the modular programmable widget 116, color of the modular programmable widget 116, quantity of programmable dials, quantity of programmable toggles, quantity of programmable switches, quantity of hidden buttons or other controls, etc., which may be used to allow the configurable display 114 to display an image consistent with the modular programmable widget 116 that is attached. In some cases, the modular programmable widgets 116 may be preconfigured to have a specific function. In such an example, the information may indicate the preconfigured function.

At operation 4404, the HMI display system 104 presents an HMI for the configuration of the modular programmable widget 116. In an example, the configurable display 114 may provide a screen for the configuration of the modular programmable widget 116.

At operation 4406, the HMI display system 104 receives input assigning functions to controls of the modular programmable widget 116 In an example, the HMI display system 104 may present an HMI to receive selection of a function to assign to the control (or controls) of the modular programmable widget 116. The functions available for assignment may include, as some examples, hot keys (e.g., quick selection of menu operations within the menu structure of the vehicle), utility controls (e.g., towing functions), climate control functions (e.g., temperature settings, fan settings, etc.), gig work function (e.g., rideshare commands), media control functions (e.g., volume, station presets, media input selection), smart home settings (e.g., garage door operation, home climate control settings), vehicle settings (e.g., interior lighting settings, gauge cluster display modes), etc.

At operation 4408 the HMI display system 104 saves the function assignment to the display settings 134 in the memory 108. For instance, the modular programmable widget 116 may have a unique identifier, and the display settings 134 may store the unique identifier the modular programmable widget 116, an identifier of the control and a corresponding identifier of the assigned function corresponding to the unique identifier of the modular programmable widget 116 and the identifier of the control. In another example, each control of the modular programmable widget 116 may have a unique identifier, and the display settings 134 may store the unique identifier the control and a corresponding identifier of the assigned function corresponding to the unique identifier of the control. After operation 4408, the process 4400 ends.

Figure 45:
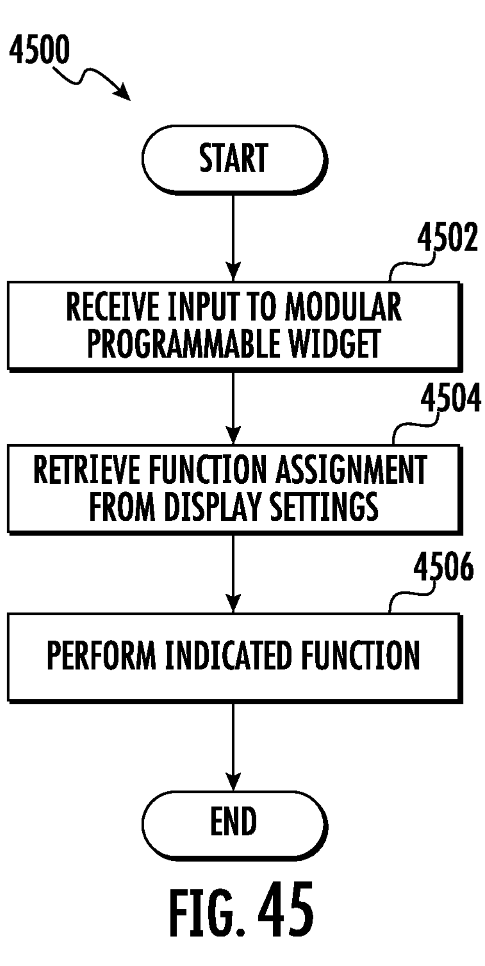
FIG. 45 illustrates an example process for the use of a configured modular programmable widget.

FIG. 45 illustrates an example process 4500 for the use of a configured modular programmable widget 116. In an example, as with the process 4400, the process 4500 may be performed by the components of the vehicle 102, as discussed in detail herein, when operating in a runtime mode.

At operation 4502, the HMI display system 104 receives input from a control of a modular programmable widget 116. In an example, a user may press, turn, or otherwise interact with configurable button 308, display 310, configurable dial 312, additive power/data port 314, configurable touch screen 316, toggle button 318, camera 320, biometric sensor 322, controls of the modular programmable widgets 116 installed to the HMI display system 104. Responsive to receipt of the input, the modular programmable widget 116 may send a message to the configurable display 114 via the electrical connection to the configurable display 114. This message may indicate, for example, an identifier of the modular programmable widget 116 and/or an identifier of the control of the modular programmable widget 116.

At operation 4504, the HMI display system 104 retrieves a function assignment corresponding to the selected control. In an example, the HMI display system 104 may access the memory 108 to identify, from the display settings 134, an identifier of the selected feature corresponding to the identifier of the control and/or the identifier of the modular programmable widget 116. At operation 4506, the HMI display system 104 executes the function identified at operation 4504. After operation 4506, the process 4500 ends.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as read-only memory (ROM) devices and information alterably stored on writeable storage media such as floppy disks, magnetic tapes, compact discs (CDs), random access memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to strength, durability, life cycle, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary. The term "substantially," "generally," or "about" may be used herein and may modify a value or relative characteristic disclosed or claimed. In such instances, "substantially," "generally," or "about" may signify that the value or relative characteristic it modifies is within ±0%, 0.1%, 0.5%, 1%, 2%, 3%, 4%, 5% or 10% of the value or relative characteristic (e.g., with respect to degrees of offset from an angle when referring to substantially perpendicular or parallel).

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A dock for receiving modular programmable widgets, comprising:

a body defining a securing channel for receiving the modular programmable widgets, the securing channel being sized to conform with a profile of an attachment body of the rear of the modular programmable widgets, wherein the body of the dock defines a protrusion extending along an upper end of the securing channel;

a plurality of dock connectors arranged in a linear array, each of the plurality of dock connectors configured to receive contact pads of the modular programmable widgets; and locators arranged on either side of each of the plurality of dock connectors, the locators being defined into the securing channel to aid in placement of the modular programmable widgets in positions where the contact pads of the modular programmable widgets are aligned with one of the dock connectors, such that pivoting the modular programmable widget around the protrusion causes the attachment body of the modular programmable widget to move into the securing channel.

2. The dock of claim 1, wherein the protrusion is configured to be received into a locating groove defined by the modular programmable widgets for insertion into the dock.

3. The dock of claim 2, wherein the protrusion defines a rounded shape, with generally the same diameter as a concavity of the locating groove, to serve as a boss to guide rotation of the modular programmable widgets into position to be snapped into place.

4. The dock of claim 3, wherein the locators define a triangular shape that widens into the depth of the securing channel, conforming to a tapering of an attachment body of the modular programmable widgets, serving to guide the modular programmable widgets into position when inserted.

5. The dock of claim 1, further comprising a ferrous metal strip extending along the length of the dock, placed to be attracted by internal magnets of the modular programmable widgets to align and secure the modular programmable widgets in place.

6. The dock of claim 1, further comprising one or more internal magnets within the dock placed to be attracted by internal magnets of the modular programmable widgets to align and secure the modular programmable widgets in place.

7. The dock of claim 1, wherein the dock connectors are exposed through contact apertures defined into the channel of the dock.

8. The dock of claim 1, wherein the locators extend downwards into the securing channel on either side of each of the dock connectors.

9. The dock of claim 1, wherein the dock is integrated into a vehicle interior.

10. The dock of claim 9, wherein the dock is integrated into a center stack configurable display of a vehicle.

11. The dock of claim 9, wherein the dock is integrated into one of a second row console bin or a rear cargo area.

12. The dock of claim 1, wherein the dock further comprising a wireless controller configured to communicate, to a vehicle, user input received to the modular programmable widgets.

13. The dock of claim 12, wherein the dock is a mobile dock sized for handheld operation.

14. The dock of claim 12, wherein the dock is a home dock configured to receive the user input from the modular programmable widgets via the dock connectors and send commands to the vehicle to control vehicle functions from outside the vehicle.

15. The dock of claim 1, wherein the dock connectors are magnetic jacks configured to attract the modular programmable widgets in addition to providing the electrical connection.

16. A modular programmable widget system, comprising:

a dock comprising a plurality of dock connectors each of identical shape and arranged in a linear array; and a plurality of modular programmable widgets, each modular programmable widget having a front housing and a back housing defining an enclosure, one or more physical controls provided on a front face of the enclosure, a contact pad exposed by the enclosure for electrical connection to any one of the dock connectors, and one or more features for mechanical connection and securing of the modular programmable widget to the dock, wherein the dock defines a protrusion to align the modular programmable widget for insertion into the dock, wherein the back housing defines an attachment body extending rearward from a vertical surface of a rear wall of the back housing, and the dock includes a securing channel sized to conform with a profile of the attachment body, such that pivoting the modular programmable widget around the protrusion causes the attachment body of the modular programmable widget to move into the securing channel.

17. The modular programmable widget system of claim 16, wherein a top face of the enclosure defines a locating groove providing a concave surface along the length of the top face of the enclosure, and the protrusion is configured to be received into the locating groove to align the modular programmable widget for insertion into the dock.

18. The modular programmable widget system of claim 16, wherein the attachment body defines a contact window at the top of the attachment body to expose the contact pad through the top of the back housing for electrical connection to the dock.

19. The modular programmable widget system of claim 16, wherein the modular programmable widgets include internal magnets, and the dock includes internal magnets or ferrous metal strips to be attracted by the internal magnets of the modular programmable widget to align the modular programmable widget to the dock connectors.

20. The modular programmable widget system of claim 16, wherein the plurality of dock connectors are equally spaced.

* * * * *